(12) United States Patent
Fujii

(10) Patent No.: US 7,642,038 B2
(45) Date of Patent: Jan. 5, 2010

(54) METHOD FOR FORMING PATTERN, THIN FILM TRANSISTOR, DISPLAY DEVICE, METHOD FOR MANUFACTURING THEREOF, AND TELEVISION APPARATUS

(75) Inventor: Gen Fujii, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 798 days.

(21) Appl. No.: 11/085,274

(22) Filed: Mar. 22, 2005

(65) Prior Publication Data

US 2005/0221203 A1 Oct. 6, 2005

(30) Foreign Application Priority Data

Mar. 24, 2004 (JP) ............................. 2004-088068

(51) Int. Cl.
*H01L 21/00* (2006.01)
*G03F 9/00* (2006.01)
(52) U.S. Cl. ........................... 430/311; 430/5; 430/319; 430/320
(58) Field of Classification Search .................. 430/5, 430/311, 319, 320, 329, 631; 349/111, 138
See application file for complete search history.

(56) References Cited

U.S. PATENT DOCUMENTS

| 5,696,011 | A | 12/1997 | Yamazaki et al. |
| 5,852,488 | A | 12/1998 | Takemura |
| 6,132,800 | A | 10/2000 | Shimada et al. |
| 6,294,313 | B1 | 9/2001 | Kobayashi et al. |
| 6,337,731 | B1 | 1/2002 | Takemura |
| 6,399,257 | B1 | 6/2002 | Shirota et al. |
| 7,176,069 | B2 | 2/2007 | Yamazaki et al. |
| 7,208,401 | B2 | 4/2007 | Nelson et al. |
| 7,273,773 | B2 | 9/2007 | Yamazaki et al. |

(Continued)

FOREIGN PATENT DOCUMENTS

CN 1426606 6/2003

(Continued)

OTHER PUBLICATIONS

Chinese Office Action (Application No. 2005/10083724.8; CN7786) dated Dec. 5, 2008 (with English Translation).

(Continued)

*Primary Examiner*—Thorl Chea
(74) *Attorney, Agent, or Firm*—Nixon Peabody, LLP; Jeffrey L. Costellia

(57) ABSTRACT

To provide a display device which can be manufactured with higher efficiency in the use of material through a simplified manufacturing process, and a method for manufacturing the display device. Another object is to provide a technique by which patterns of a wiring the like which constitutes the display device can be formed to a desired shape with good control. In a method for forming a pattern according to the present invention, a mask is formed over a light-transmitting substrate; a first region including a photocatalyst is formed over the substrate and the mask; the photocatalyst is irradiated with light through the substrate to modify a part of the first region; a second region is formed; and a composition containing a pattern forming material is discharged to the second region, thus, a pattern is formed. The mask does not transmit light.

14 Claims, 31 Drawing Sheets

U.S. PATENT DOCUMENTS

| | | |
|---|---|---|
| 7,365,805 B2 | 4/2008 | Maekawa et al. |
| 7,462,514 B2 | 12/2008 | Shiroguchi et al. |
| 2002/0079832 A1 | 6/2002 | Van Tongeren et al. |
| 2002/0109456 A1 | 8/2002 | Morii et al. |
| 2003/0059686 A1 | 3/2003 | Kobayashi et al. |
| 2003/0087073 A1* | 5/2003 | Kobayashi ................. 428/209 |
| 2005/0009327 A1 | 1/2005 | Yoshida et al. |
| 2005/0196710 A1 | 9/2005 | Shiroguchi |
| 2005/0287721 A1 | 12/2005 | Yamamoto et al. |
| 2006/0121745 A1 | 6/2006 | Fujii |
| 2006/0134918 A1 | 6/2006 | Fujii et al. |
| 2006/0158482 A1 | 7/2006 | Nakamura et al. |
| 2007/0093002 A1 | 4/2007 | Maekawa et al. |
| 2007/0196962 A1 | 8/2007 | Morisue et al. |
| 2007/0207274 A1 | 9/2007 | Fujii |
| 2008/0012076 A1 | 1/2008 | Yamazaki et al. |
| 2008/0105875 A1 | 5/2008 | Maekawa et al. |
| 2008/0199992 A1 | 8/2008 | Maekawa et al. |

FOREIGN PATENT DOCUMENTS

| | | |
|---|---|---|
| JP | 11-207959 | 8/1999 |
| JP | 11-251259 | 9/1999 |
| JP | 2001-272526 | 10/2001 |
| JP | 2003-059940 | 2/2003 |
| WO | WO 02/052660 A1 | 7/2002 |
| WO | WO-2005/077549 A1 | 8/2005 |

OTHER PUBLICATIONS

Office Action dated Feb. 1, 2008 in Chinese Patent Application No. 2005/10083724.8, with English Translation.

Office Action dated Aug. 1, 2008 in Chinese Patent Application No. 2005/10083724.8, with English Translation.

* cited by examiner

METHOD FOR FORMING PATTERN, THIN FILM TRANSISTOR, DISPLAY DEVICE, METHOD FOR MANUFACTURING THEREOF, AND TELEVISION APPARATUS

BACKGROUND OF THE INVENTION

1. Field of the Invention

The present invention relates to a method for forming a pattern, a thin film transistor and a manufacturing method thereof, a display device and a manufacturing method thereof, and a television apparatus using the same.

2. Description of the Related Art

A thin film transistor (hereinafter, referred to as a "TFT") and an electronic circuit using the thin film transistor are manufactured by stacking various types of thin films of such as a semiconductor, an insulator, a conductor over a substrate and then, appropriately forming a predetermined pattern by photolithography. The photolithography is a technique of transferring a pattern of a circuit or the like formed with a material which does not transmit light over a transparent flat surface, referred to as a photomask, onto an objective substrate by utilizing light. The technique has been widely used in the manufacturing processes of a semiconductor integrated circuit and the like.

In the manufacturing process employing a conventional photolithography technique, a multi-stage process including light exposure, development, baking, peeling, and the like are required only for treating a mask pattern which is formed of a photosensitive organic resin material referred to as a photoresist. Therefore, as the number of the photolithography steps is increased, the manufacturing cost is inevitably increased. In order to improve such problems as described above, it has been tried to manufacture a TFT by reducing the number of the photolithography steps (for example, Reference 1: Japanese Patent Laid-Open No. H11-251259).

However, in the technique disclosed in Reference 1, only some of the plural photolithography steps in a TFT manufacturing process are replaced by printing method, and no contribution is made to a drastic reduction in the number of steps. Further, a light exposure apparatus to be used for transferring a mask pattern in photolithography transfers a pattern of under several micrometers to one micrometer or less by equivalent projection light exposure or reduction projection light exposure. It is theoretically difficult, from a technical standpoint, to expose a large substrate which is more than one meter on a side to light all at once using the light exposure apparatus.

SUMMARY OF THE INVENTION

It is an object of the present invention to reduce the number of photolithography steps in the manufacturing process of a TFT, an electronic circuit using the TFT, and a display device formed using the TFT, and to simplify the manufacturing process. It is a further object of the present invention to provide a technique by the TFT, the electronic circuit, and the display device can be manufactured even over a large substrate with a side of more than one meter with higher yield at lower cost.

It is another object of the present invention to provide a technique by which wiring patterns and the like constituting a display device can be formed in desired shapes with good control.

According to the present invention, an objective surface is modified by energy due to photoactivation of a substance with photocatalytic function (hereinafter also referred to as a photocatalyst). The object is formed over a light-transmitting material, and the photocatalyst is irradiated with light through the light-transmitting material from the light-transmitting material side. On this occasion, an unirradiated region is provided by forming a mask between the light-transmitting material and the object; thus, a region to be modified can be accurately controlled. Then, a pattern forming material is adhered on the modified surface by a discharge method (including an ejection method or the like), or the like to form a pattern. Efficiency of the treatment utilizing light can be enhanced by light-absorption of the photocatalyst and by energy radiation.

A display device according to the present invention includes a light emitting display device including an a TFT connected to a light emitting element in which an organic material or a medium including a mixture of an organic matter and an inorganic matter producing luminescence referred to as electroluminescence (hereinafter also referred to as "EL") is sandwiched between electrodes; a liquid crystal display device in which a liquid crystal element having a liquid crystal material is used as a display element.

A method for forming a pattern according to the present invention includes the steps of: forming a mask over a light-transmitting substrate; forming a first region including a photocatalyst over the substrate and the mask; irradiating the photocatalyst with light through the substrate to modify a part of the first region which is to be a second region; and discharging a composition containing a pattern forming material to the second region to form a pattern, wherein the mask does not transmit the light.

A method for forming a pattern according to the present invention includes the steps of: forming a mask over a light-transmitting substrate; forming a first region including a photocatalyst over the substrate and the mask; forming a material containing a fluorocarbon chain over the photocatalyst; irradiating the photocatalyst and the material containing the fluorocarbon chain with light through the substrate to modify a part of a surface of the material containing the fluorocarbon chain which is to be a second region; and discharging a composition containing a pattern forming material to the second region to form a pattern, wherein the mask does not transmit the light.

A method for manufacturing a thin film transistor according to the present invention, includes the steps of: forming a first conductive layer over a light-transmitting substrate; forming an insulating layer over the substrate and the first conductive layer; forming a first region including a photocatalyst over the insulating layer; irradiating the photocatalyst with light through the substrate to modify a part of the first region which is to be a second region; and discharging a composition containing a conductive material to the second region to form a second conductive layer, wherein the first conductive layer does not transmit light.

A method for manufacturing a thin film transistor according to the present invention, includes the steps of: forming a first conductive layer over a light-transmitting substrate; forming an insulating layer over the substrate and the first conductive layer; forming a first region including a photocatalyst over the insulating layer; forming a material containing a fluorocarbon chain over the photocatalyst; irradiating the photocatalyst and the material containing the fluorocarbon chain with light through the substrate to modify a part of a surface of the material containing the fluorocarbon chain which is to be a second region; and discharging a composition containing a conductive material to the second region to form a second conductive layer, wherein the first conductive layer does not transmit light.

According to the above structure, a display device can be manufactured using the first conductive layer as a gate electrode layer, and the second conductive layer as a source/drain electrode layer. Further, a surface of the substance can be modified so that the wettability with the composition of the second region is higher than the first region. Still further, according to the above structure, titanium oxide having a photocatalytic properties can be used as the photocatalyst.

A thin film transistor according to the present invention includes: a first conductive layer provided over a light-transmitting substrate; an insulating layer over the substrate and the first conductive layer; a photocatalyst provided over the insulating layer; a material containing a fluorocarbon chain over the photocatalyst; a first region and a second region in a surface of the material containing the fluorocarbon chain; and a second conductive layer over the second region, wherein density of the fluorocarbon chain contained in the first region is higher than density of the fluorocarbon chain contained in the second region.

A thin film transistor according to the present invention includes: a first conductive layer provided over a light-transmitting substrate; an insulating layer over the substrate and the first conductive layer; a photocatalyst provided over the insulating layer; a material containing a fluorocarbon chain over the photocatalyst; a first region and a second region are in a surface of the material containing the fluorocarbon chain; a second conductive layer provided over the second region; and a semiconductor layer formed over the material containing the fluorocarbon chain and the second electrode layer, wherein density of the fluorocarbon chain contained in the first region is higher than density of the fluorocarbon chain contained in the second region.

A display device according to the present invention includes: a gate electrode layer provided over a light-transmitting substrate; an insulating layer over the substrate and the gate electrode layer; a photocatalyst provided over the insulating layer; a material containing a fluorocarbon chain over the photocatalyst; a first region and a second region in a surface of the material containing the fluorocarbon chain; and a source/drain electrode layer over the second region, wherein density of the fluorocarbon chain contained in the first region is higher than density of the fluorocarbon chain contained in the second region.

A display device according to the present invention includes: a gate electrode layer provided over a light-transmitting substrate; an insulating layer over the substrate and the gate electrode layer; a photocatalyst provided over the insulating layer; a material containing a fluorocarbon chain over the photocatalyst; a first region and a second region in a surface of the material containing the fluorocarbon chain; a source/drain electrode layer over the second region; and a semiconductor layer formed over the material containing the fluorocarbon chain and the source/drain electrode layer, wherein density of the fluorocarbon chain contained in the first region is higher than density of the fluorocarbon chain contained in the second region.

A television apparatus according to the present invention includes a display screen constituted by a display device. The display device comprises: a gate electrode layer provided over a light-transmitting substrate; an insulating layer over the substrate and the gate electrode layer; a photocatalyst provided over the insulating layer; a material containing a fluorocarbon chain over the photocatalyst, and a first region and a second region in a surface of the material containing the fluorocarbon chain; and a source/drain electrode layer over the second region, wherein density of the fluorocarbon chain contained in the first region is higher than density of the fluorocarbon chain contained in the second region.

A television apparatus includes a display screen constituted by a display device. The display device includes a gate electrode layer provided over a light-transmitting substrate; an insulating layer over the substrate and the gate electrode layer; a photocatalyst provided over the insulating layer; a material containing a fluorocarbon chain over the photocatalyst, a first region and a second region in a surface of the material containing the fluorocarbon chain, a source/drain electrode layer over the second region; and a semiconductor layer formed over the material containing the fluorocarbon chain and the source/drain electrode layer, wherein density of the fluorocarbon chain contained in the first region is higher than density of the fluorocarbon chain contained in the second region.

According to the present invention, a desirable pattern can be formed with good control. Further, the material loss and costs can be reduced. Hence, a high-performance and highly reliable display device can be manufactured with high yield.

DETAILED DESCRIPTION OF THE INVENTION

Figure 1A:
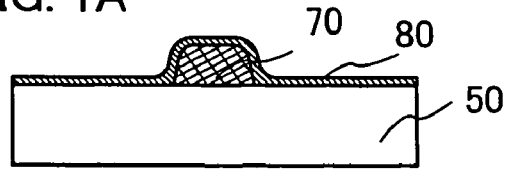
FIGS. 1A to 1D are views describing the present invention.

Embodiment Modes and Embodiment of the present invention will be described in detail with reference to the accompanying drawings. However, the present invention is not limited to the following description and it is easily understood by those skilled in the art that various changes and modifications are possible, unless such changes and modifications depart from the content and the scope of the present invention. Therefore, the present invention is to be interpreted without limitation to the description in embodiment modes and the embodiment shown below. Note that, in the structure of the present invention described hereinafter, the same reference numerals denote the same parts or parts having the same functions in different drawings and the explanation will not be repeated.

EMBODIMENT MODE 1

An embodiment mode according to the present invention is described with reference to FIGS. 1A to 1D, 2A and 2B, and 28.

One feature of the present invention is that at least one or more of patterns required to manufacture a display panel, such as a wiring layer, a conductive layer for forming an electrode, or a mask layer for forming a predetermined pattern is/are formed by a method capable of selectively forming a pattern to manufacture a display device. In the present invention, a pattern denotes a conductive layer such as a gate electrode layer, a source electrode layer, or a drain electrode layer; a semiconductor layer; a mask layer; an insulating layer; or the like, which constitutes a thin film transistor and a display device, and the pattern includes any component formed so as to have a predetermined shape. A droplet discharge (ejection) method (including an ink-jet method, depending on its mode) that can form a conductive layer, an insulating layer, or the like into a predetermined pattern by selectively discharging (ejecting) a droplet of a compound mixed for a particular purpose is employed as the method capable of selectively forming a pattern. In addition, a method capable of transferring or drawing a pattern, for example, various printing methods (a method for forming a pattern, such as screen (mimeograph) printing, offset (lithography) printing, relief printing or gravure (intaglio) printing or the like can also be employed.

In this embodiment mode, a method for forming a pattern by discharging (ejecting) a compound including a fluid pattern forming material as a droplet is used. A pattern is formed by discharging a droplet including a pattern forming material to a pattern forming region, and the composition is fixed by baking, drying, and the like. According to the present invention, pretreatment is performed on the pattern forming region.

Figure 28:
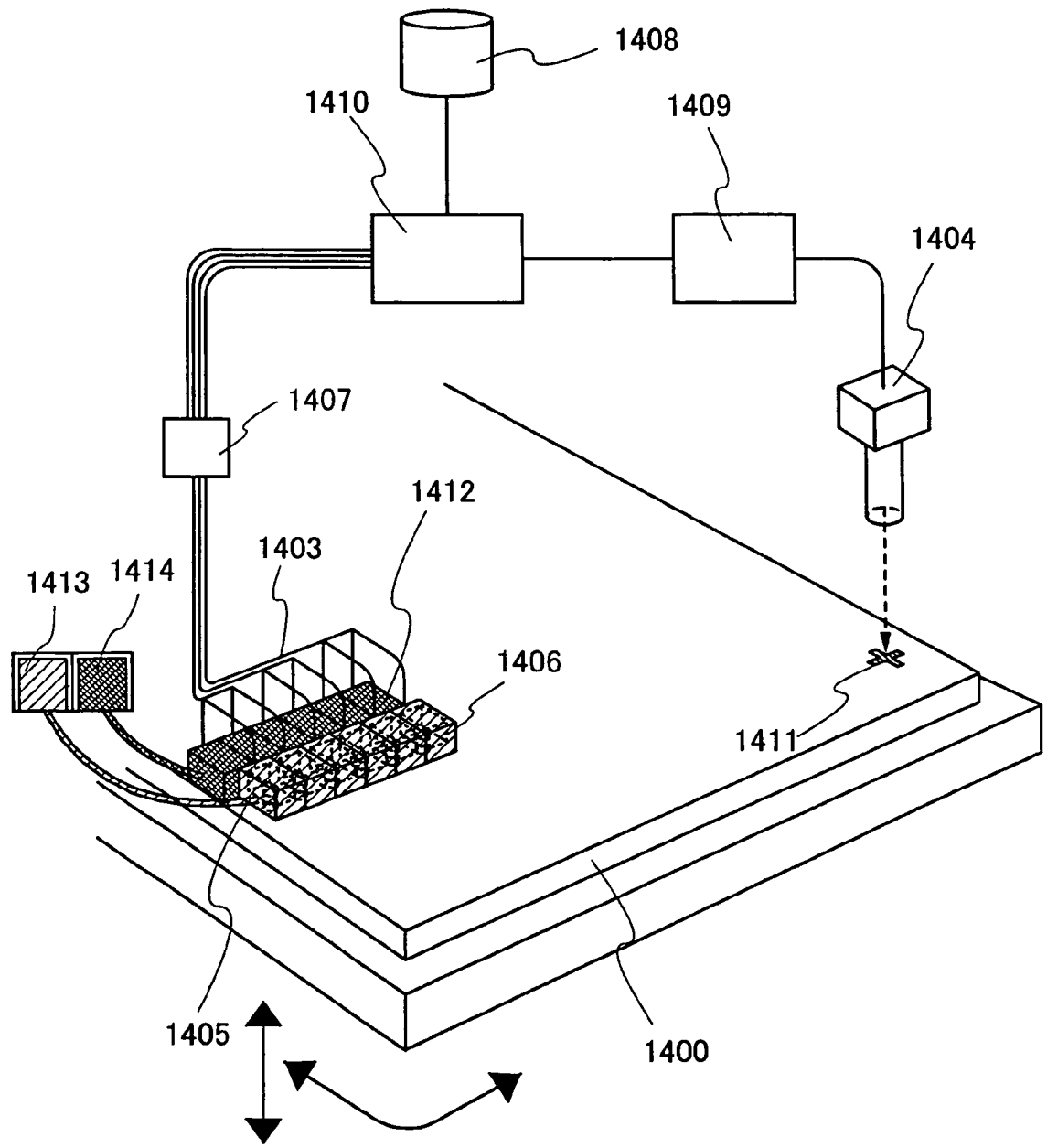
FIG. 28 is a figure describing a structure of a droplet discharge system which is applicable to the present invention.

One mode of a droplet discharge system used for forming a pattern is shown in FIG. 28. Each of heads 1405 and 1412 of a droplet discharge means 1403 is connected to a control means 1407, and is controlled by a computer 1410, so that a preprogrammed pattern can be formed. The formation position may be determined based on a marker 1411 that is formed over a substrate 1400, for example. Alternatively, a reference point can be fixed based on an edge of the substrate 1400. The reference point is detected by an imaging means 1404, and changed into a digital signal by an image processing means 1409. Then, the digital signal is recognized by the computer 1410 to generate a control signal, and the control signal is transmitted to the control means 1407. An image sensor using a charge coupled device (CCD) and a complementary metal oxide semiconductor (CMOS) or the like can be used for the imaging means 1404. Naturally, information about a pattern to be formed over the substrate 1400 is stored in a storage medium 1408, and the control signal is transmitted to the control means 1407 based on the information, so that each head 1405 and 1412 of the droplet discharge means 1403 can be individually controlled. Heads 1405 and 1412 are supplied with a material to be discharged from material supply sources 1413 and 1414 through pipes, respectively.

The head 1405 has an inside structure which has a space filled with a liquid material as shown by a dotted line 1406 and a nozzle which is a discharge opening. Although it is not shown, the head 1412 has a similar inside structure to the head 1405. The sizes of the heads 1405 and 1412 are different each other, and different materials can be simultaneously discharged with different widths. Also, a conductive material, an organic material, an inorganic material, and the like can be discharged from one head. When a droplet is drawn over a wide area such as an interlayer insulating film, one material is simultaneously discharged from a plurality of nozzles to improve a throughput, and thus, drawing can be performed. When a large-sized substrate is used, the heads 1405 and 1412 can freely scan over the substrate in a direction indicated by an arrow in FIG. 28, and a region to be drawn can be freely set. Thus, a plurality of the same patterns can be formed over one substrate.

In a method for forming a pattern such as a conductive layer by a droplet discharge method, a pattern is formed as follows. A pattern forming material which is processed into particles is discharged, and fused or welded and joined by baking to solidify the pattern formation material. Accordingly, a pattern which is formed by sputtering or the like often has a columnar structure while the pattern formed by the method according to the present invention mostly has a polycrystalline structure with a lot of grain boundaries.

In the present invention, the vicinity of an area to be provided with a pattern is irradiated with light to modify the surface selectively as shown in FIGS. 1A to 1D. A composition containing a pattern forming material is adhered to the modified surface to form the pattern. The pattern can be formed by exposure from the back of the substrate in a self-aligned manner. Consequently, according to the present invention, a thin film transistor can be formed in a self-aligned manner.

Light used for the modification includes, but not limited to, infrared light, visible light, or ultraviolet light or a combination thereof. For example, light emitted from an ultraviolet lamp, a black light, a halogen lamp, a metal halide lamp, a xenon arc lamp, a carbon arc lamp, a high pressure sodium lamp, or a high pressure mercury lamp may be used. The lamp light source may be activated for a required time, or may be activated plural times.

Further, a laser beam may be used as the light for modification. A laser capable of emitting ultraviolet light, visible light, or infrared light can be used. For example, an excimer laser of such as KrF, ArF, KrF, XeCl, or Xe, a gas laser of He, He—Cd, Ar, He—Ne, HF, a solid-state laser using a crystal of such as YAG, $GdVO_4$, $YVO_4$, YLF, or $YAlO_3$ doped with Cr, Nd, Er, Ho, Ce, Co, Ti, or Tm, or a semiconductor laser of such as GaN, GaAs, GaAlAs, or InGaAsP can be used. In the case of using a solid-state laser for the light, it is preferable to apply the second harmonic, or the third harmonic of the fundamental wave. An optical system including a shutter, a reflector such as a mirror, or a half mirror, and a cylindrical lens or a convex lens may be used for controlling the shape and the course of the laser beam emitted from a laser oscillator.

The substrate may be moved for selective light irradiation, or light may be moved in x-y direction for irradiation. In this case, a polygon mirror or a galvano mirror is preferably used in the optical system.

In this embodiment mode, light is irradiated from the back of the substrate to modify and change the wettability of the irrradiated area. Thus, areas having different wettabilities for a composition containing a pattern forming material are formed in the vicinity of the pattern forming region. The wettability of the areas with the composition containing the pattern forming material may have relative difference as the difference between the wettability of the pattern forming region and the periphery thereof where a pattern is not formed (non-pattern forming region). The areas having different wettability have different contact angles. An area having a larger contact angle with the pattern forming material is an area having lower wettability (hereinafter, also referred to as a "low-wettability region"), and an area having a smaller contact angle of with the pattern forming material is an area having high wettability (hereinafter, also referred to as a "high-wettability region"). This is because when a contact angle is large, a liquid composition having fluidity does not spread and repelled on the surface of the area; therefore, the surface is not wetted; and when an contact angle is small, a composition having fluidity spreads over the surface, and the surface is wetted. Accordingly, the areas having different wettability have different surface energy. The surface of the low wettability region has low surface energy, and the surface of the high wettability region has high surface energy. In the present invention, the difference of contact angles between the areas having different wettability is 30° or more, preferably, 40° or more.

In this embodiment mode, light irradiation treatment is performed to form regions having different wettability. A material is formed over a pattern forming region and the periphery thereof, and treatment for selectively enhancing wettability and treatment for selectively decreasing wettability are performed with the use of the light. In this embodiment mode, a material having low wettability is formed over the periphery of the pattern forming region, and light capable of decomposing the material having low wettability is radiated to decompose and remove the substance having low wettability in a treatment region. Thus, wettability of the treatment region is enhanced, and a high-wettability region is formed. A material having low wettability may be a substance containing a material having an effect of decreasing the wettability. The material which decreases wettability is decomposed and destroyed by laser irradiation treatment to neutralize the effect of decreasing wettability. It is necessary to use light having a wavelength which is absorbed by the material having low wettability. Consequently, the concentration of the low wettability substance contained in the low wettability region (For example, the concentration or the amount of the fluorocarbon chain which has an effect of reducing wettability) becomes lower than that in the high wettability region. A material having low wettability may be a material containing a material having an effect of reducing wettability. The material which reduces wettability is decomposed and destroyed by laser irradiation treatment to neutralize the effect of reducing wettability.

According to the present invention, an object is irradiated with light through a material (substrate) provided with the object to form the areas having different wettability with good control. In this embodiment mode, a mask is formed in advance over a light-transmitting substrate, and then a low wettability material is formed thereover. The material which reduces wettability in the material having low wettability of the area other than the mask region is decomposed by light irradiation from the light-transmitting substrate side. The material having low wettability which is formed over the mask region is not irradiated with light; thus, the areas having different wettabilities are formed with good control. The light is required to have a wavelength by which the material having low wettability is decomposed and removed. However, light with a wavelength of 200 nm or less which has large energy, such as ultraviolet light, is required depending on the material; therefore, the range of choice is narrowed. Further, in the case of the wavelength which the light-transmitting material in the substrate absorbs, the light is absorbed in the light-transmitting substrate, and the object is not irradiated with light; accordingly, the surface can not be modified. Additionally, it is also required to irradiate plural times to perform sufficient treatment; therefore, the cost or time necessary for the apparatus or the process is increased, so that the production efficiency is reduced.

Accordingly, in the present invention, a photocatalyst is formed in contact with the object, in order to improve the efficiency of light irradiation. The photocatalyst absorbs light and id activated. The activating energy acts on the substance around and consequently modifies the substance by changing the properties thereof. The photocatalyst improves the efficiency of modifying according to the present invention; thus, the range of options for the light wavelength is increased. Consequently, the wavelength that is hardly absorbed by the substance to be provided with the object can be selected, and light irradiation for controllable surface modification treatment can be carried out. Further, the efficiency of light irradiation can be improved, so that the treatment can be done sufficiently even though the light itself has low energy. As a result, the apparatuses and steps are simplified, thus, costs and time are reduced, and the production efficiency can be improved.

In this embodiment mode, an example of forming a wiring pattern with good control will be shown. First, a mask 70 is formed over a light-transmitting substrate 50 (FIG. 1A). Since the mask 70 is made to serve as a mask for blocking light, a material which hardly transmit light is required to be used. In this embodiment mode, an insulating material is used for the mask 70, and a conductive material is used for a pattern 75a and a pattern 75b which are formed over the mask 70. In this case, the mask 70 serves as an insulator which electrically insulates the wirings constituted by the pattern 75a and the pattern 75b. In the case of using a conductive material for the mask 70, the pattern 75a, and the pattern 75b, if an insulating layer is formed between the mask 70, and the pattern 75a and the pattern 75b, and the insulating layer is pretreated according to the present invention, the wiring may be formed to have a layered structure.

Next, a photocatalyst 80 is formed. Titanium oxide ($TiO_x$), strontium titanate ($SrTiO_3$), cadmium selenide (CdSe), potassium tantalate ($KTaO_3$), cadmium sulfide (CdS), zirconia ($ZrO_2$), niobium oxide ($Nb_2O_5$), zinc oxide (ZnO), iron oxide ($Fe_2O_3$), tungsten oxide ($WO_3$), and the like are preferable for the photocatalyst. The photocatalyst can be irradiated with light in the ultraviolet range (wavelength of 400 nm or less, preferably, 380 nm or less) for activating the photocatalytic.

The photocatalyst can be formed by dip coating using sol-gel process, spin coating, a droplet discharge method, ion plating, an ion beam technique, CVD, sputtering, RF magnetron sputtering, plasma spraying, or anodic oxidation. In addition, the substance need not have continuity as a film, depending on its formation method. In the case of a photocatalyst made of an oxide semiconductor containing a plurality of metals, the photocatalyst can be formed by mixing salts containing the constituent elements and melting them. In the case of forming the photocatalyst by a coating method such as dip coating or spin coating, the photocatalyst may be baked or dried to remove the solvent as necessary. Specifically, it may be heated at a predetermined temperature (for example, 300° C. or more), preferably, in an atmosphere containing oxygen.

Through the heat treatment, the photocatalyst can acquire a predetermined crystal structure. For example, it has an anatase structure or a rutile-anatase mixed structure. The anatase structure is preferentially formed in the low temperature phase. Thus, the photocatalyst may also be heated when it does not have a predetermined crystal structure. In addition, in the case of forming the photocatalyst by a coating method, it can be formed plural times to obtain a predetermined film thickness.

Further, a transition metal (such as Pd, Pt, Cr, Ni, V, Mn, Fe, Ce, Mo, or W) can be doped into the photocatalyst, so that the photocatalytic activity is enhanced or the photocatalyst can be activated by light in the visible range (wavelength of 400 nm to 800 nm). This is because a transition metal can form a new level within a forbidden band of an active photocatalyst having a wide band gap and can expand the light absorption range to the visible range. For example, an acceptor such as Cr or Ni, a donor such as V or Mn, an amphoteric impurity such as Fe, or other types such as Ce, Mo, W, or the like can be doped. Thus, the wavelength of light can be determined depending on the photocatalyst. Therefore, light irradiation in the present invention denotes irradiation with light having such a wavelength that activates the photocatalyst.

When the photocatalyst is heated and reduced in vacuum or under hydrogen flow, an oxygen deficiency is caused in the crystal. Even when the transition element is not doped, an oxygen deficiency plays a similar role to an electron donor in this manner. In particular, in the case of forming the photocatalyst by sol-gel process, the photocatalyst need not be reduced since an oxygen deficiency exists from the beginning. In addition, an oxygen deficiency can be caused by doping a gas of $N_2$ or the like.

In this embodiment mode, a titanium oxide layer is formed as a photocatalyst. The titanium oxide layer is formed by spin coating with $TiCl_3$ solution, and baking in an oxygen atmosphere.

In this embodiment mode, a layer 81 comprising a substance having low wettability is formed over the photocatalyst 80. In this embodiment mode, the substance having low wettability is mixed into a solvent or the like; thus, the substance in liquid form is selectively discharged by a droplet discharge method. However, the method for forming the substance having low wettability is not limited to this embodiment mode since the substance may be attached to the pattern formation region and the periphery thereof. For example, the substance having low wettability can be formed by sol-gel dip coating, spin coating, a droplet discharge method, ion plating, an ion beam method, CVD, sputtering, RF magnetron sputtering, or plasma spraying. In the case of using a coating method such as dip coating or spin coating, and when a solvent should be removed, baking or drying may be performed. In the case of using a method of forming a pattern directly over the pattern forming region, such as a droplet discharge method, the cost can be curtailed since the materials can be used efficiently.

Figure 1B:
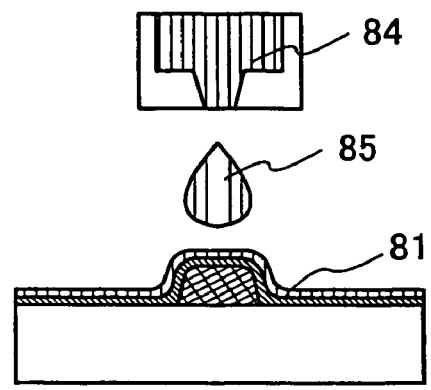

A composition containing a substance having a low wettability is discharged as a droplet 85 from a discharge device 84 to the photocatalyst 80 as shown in FIG. 1B, so that the layer 81 comprising the substance that is less low wettability substance is formed.

Figure 1C:
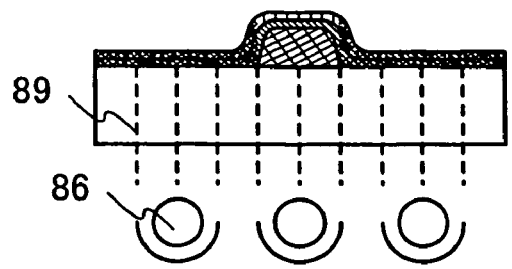
Figure 1D:
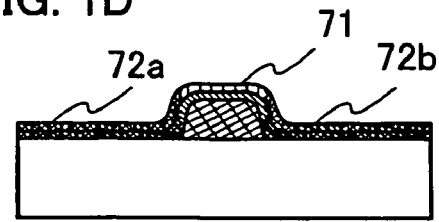
Figure 2A:
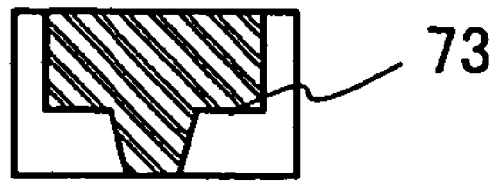
FIGS. 2A and 2B are views describing of the present invention.
Figure 2A:
Figure 2A:
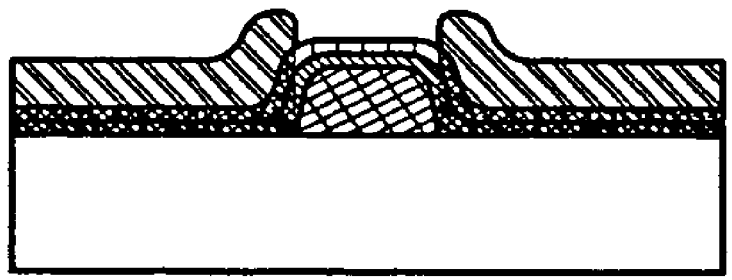
Figure 2B:
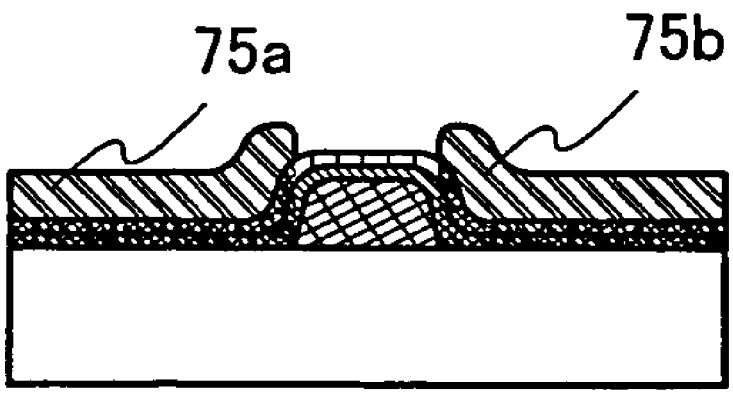

The photocatalyst 80 is irradiated with light 89 from a light source 86 through the substrate 50 (FIG. 1C). Since the substrate has photocatalytic properties, it is activated by the applied light; thus, the substance having low wettability is decomposed and destroyed, so that the wettability of the treatment area is improved. The light 89 is blocked by a mask 70, so that a portion of the substance having low wettability over the mask 70 is not irradiated. Accordingly, a high wettability region 72a and a high wettability region 72b which are highly low wettability substance are formed; thus, an area having different wettability is formed at the periphery of the pattern formation region. Therefore, the non-treated area becomes relatively low wettability substance to be a low wettability region 71 (FIG. 1D)

Afterwards, a droplet 74 containing the pattern forming material is discharged from a nozzle of a droplet discharge system 73 to the high-wettability regions 72a and 72b which are regions on which patterns are to be formed. The discharged droplet 74 adheres to the high-wettability regions 72a and 72b without adhering to the low-wettability region 71 (see FIG. 2A). Even when the pattern forming material can not be discharged precisely depending on the size of the discharge opening of the nozzle from which the droplet is discharged or the moving ability of the discharge opening, the droplet is attached only to the regions to form desired patterns 75a and 75b by performing treatment for enhancing wettability on the regions (see FIG. 2B). This is because the region on which a pattern is to be formed (the pattern formation region) and the periphery thereof have different wettability; therefore, the droplet is repelled only in the low-wettability region and remains on the region having higher wettability. In other words, the droplet is repelled by the low-wettability region next to the high-wettability region; therefore, the boundary between the high-wettability region and the low-wettability region functions as a partition wall (a bank). Accordingly, even the composition containing the pattern forming material having fluidity can remain on the high-wettability region; thus, the pattern can be formed to have a desired shape.

According to the present invention, when a fine pattern of, for example, a conductive layer, or the like is formed, a droplet does not spread over the pattern formation region even when a discharge opening of the droplet is somewhat large, therefore, a conductive layer can be formed only on the pattern formation region, and faults such as short circuit which can be caused by forming the conductive layer in an area other than the pattern formation region. Additionally, film thickness of the wiring can be controlled. As in this embodiment mode, when the surface of the substance is modified by light irradiation from the substrate side, a large area can be treated in addition to forming a pattern; thus, production efficiency is improved. By combining a droplet discharge method, the material loss can be avoided compared with entire surface application formation by spin coating or the like; therefore, the cost can be reduced. According to the present invention, a pattern can be formed with good control even in the case where wirings or the like are designed integrally and intricately due to miniaturization and thinner film formation.

In this embodiment mode, a photocatalyst and a substance having low wettability are formed as pretreatment. They could be extremely thin depending on the formation condition, so that they may not have film form.

Treatment for enhancing wettability is carried out to make the strength of holding a droplet discharged over a region (also referred to as "adhesion forth" or "fixing strength") stronger than that of the periphery thereof, which is equivalent to enhancing the adhesion with the droplet by modifying the region. The wettability needs only on a surface which is in contact with and holds a droplet, and the whole film does not necessarily have the similar properties.

After forming the pattern, the photocatalyst and the substance which changes wettability formed for pretreatment after forming the pattern may be left, or an unnecessary portion may be removed. In the removal, the pattern may be used as a mask, and ashing using oxygen or the like, etching, plasma treatment, or the like may be used.

As an example of the composition of the solution for forming the low-wettability region, a silane coupling agent expressed in a chemical formula of $R_n$—Si—$X_{(4-n)}$ (n=1, 2, 3) is used. Here, R denotes a substance which contains a comparatively inactive group such as an alkyl group. Further, X includes a hydrolysable group which can be bonded by the condensation with a hydroxyl group or absorbed water on a surface such as halogen, a methoxy group, an ethoxy group, or an acetoxy group.

Using a fluorine-based silane coupling agent (fluoroalkyl-silane (hereinafter referred to as FAS)) having a fluoroalkyl group for R that is a representative example of the silane coupling agent, the wettability can be lowered. R of FAS has a structure which is expressed in $(CF_3)(CF_2)_x(CH_2)_y$ (x: an integer from 0 to 10, y: an integer from 0 to 4). In the case where a plurality of R or X are bonded to Si, the R or X may all be the same or different each other. Fluoroalkylsilane such as heptadecafluoro tetrahydrodecyltriethoxysilane, heptadecafluorotetrahydrodecyl trichlorosilane, tridecafluorotetrahydrooctyltrichlorosilane, trifluoropropyltrimethoxy silane are typically used.

As the solvent of a solution for forming the low-wettability region, a solvent which forms a low-wettability region such as a hydrocarbon-based solvent, tetrahydrofuran, dioxane ethanol, dimethyl sulfoxide, or the like, namely, n-pentane, n-hexane, n-heptane, n-octane, n-decane, dicyclopentane, benzene, toluene, xylene, durene, indene, tetrahydronaphthalene, decahydronaphthalene, squalene, or the like can be used.

As an example of the compound of the solvent for forming the low-wettability region, a substance having a fluorocarbon chain (fluorine resin) can be used. As the fluorine resin, polytetrafluoroethylene (PTFE; polytetrafluoroethylene resin), perfluoroalkoxyalkane (PFA; tetrafluoroethylene perfluoroalkylvinylether copolymer resin), perfluoroethylene propylene copolymer (PFEP; tetrafluoroethylene hexafluoropropylene copolymer resin), ethylene-tetrafluoroethylene copolymer (ETFE; tetrafluoroethylene-ethylene copolymer resin), polyvinylidene fluoride (PVDF; polyvinylidene fluoride resin), polychlorotrifluoroethylene (PCTFE; polytrifluorochloroethylene resin), ethylene-chlorotrifluoroethylene copolymer (ECTFE; polytrifluorochloroethylene-ethylene copolymer resin), polytetrafluoroethylene-perfluorodioxol copolymer (TFE/PDD), polyvinylfluoride (PVF; vinyl fluoride resin), or the like can be used.

In addition, an organic material which does not form a low-wettability region (in other words, which forms a high-wettability region) may be used to form a low wettability region by performing treatment with the use of $CF_4$ plasma or the like later. For example, a material in which a soluble resin such as polyvinyl alcohol (PVA) is mixed into a solvent of such as $H_2O$ can be used. In addition, PVA may be mixed with another soluble resin may be used. An organic material (an organic resin material) (polyimide, acrylic), a material in which a skeleton is formed by the bond of silicon (Si) and oxygen (O), and which includes an organic group containing at least hydrogen as a substituent. Alternatively, a fluoro group, an alkyl group, or aromatic hydrocarbon may be used as the substituent. Even when a material having a low-wettability region is used, wettability can be further reduced by performing plasma treatment or the like.

A base film may be formed to improve adhesion between the pattern and the pattern formation region. For example, when a conductive material containing silver is applied to a substrate to form a silver wiring as the mask, a titanium oxide film may be formed over the substrate to improve the adhesion. The titanium oxide film has good adhesion with the conductive material containing silver to be formed later, thereby enhancing reliability.

According to the present invention, a desirable pattern can be formed with good control. Further, the material loss and costs can be reduced. Hence, a high-performance and highly reliable light emitting display device can be manufactured with high yield.

EMBODIMENT MODE 2

An embodiment mode according to the present invention will be described with reference to FIGS. 3A to 3C, 4A to 4C, 5A to 5C, 6A to 6C, 7A to 7C, 8A to 8C, 9A, 9B, 14A to 14C, 15A and 15B. More specifically, a method for manufacturing a display device having a channel etch type thin film transistor according to the present invention will be described. Each of FIGS. 3A, 4A, 5A, 6A, 7A, and 8A shows a top view of a pixel portion in a display device, each of FIGS. 3B, 4B, 5B, 6B, 7B, and 8B shows a cross-sectional view taken along line A-C in FIGS. 3A, 4A, 5A, 6A, 7A, and 8A, and each of FIGS. 3C, 4C, 5C, 6C, 7C, and 8C shows a cross-sectional view taken along line B-D in FIGS. 3A, 4A, 5A, 6A, 7A, and 8A.

Figure 14A:
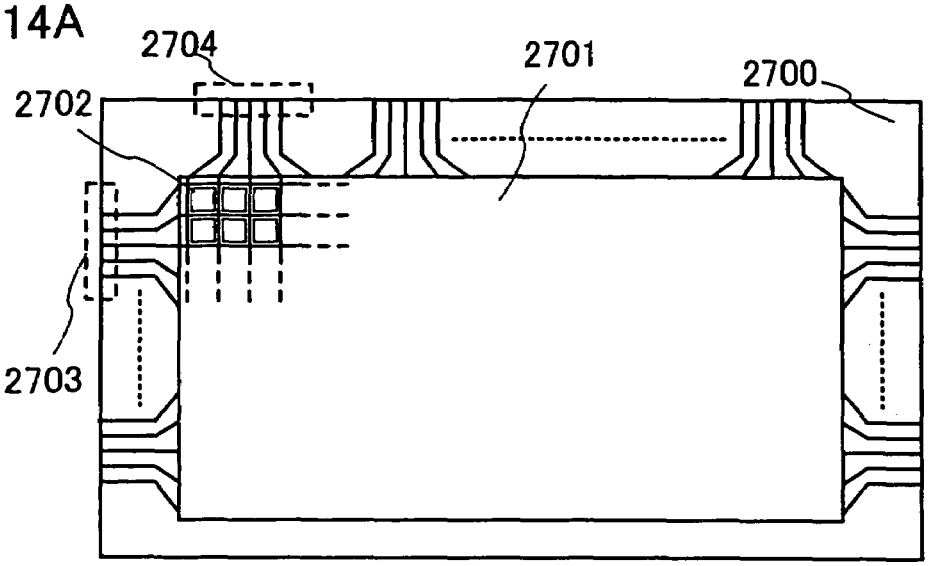
FIGS. 14A to 14C are top views of a display device according to the present invention.

FIG. 14A is a top view showing a structure of a display panel according to the present invention. A pixel portion 2701 in which pixels 2702 are arranged in matrix, a scan line input terminal 2703, and a signal line input terminal 2704 are formed over a substrate 2700 having an insulating surface. The number of the pixels may be determined in accordance with various standards. The number of pixels of XGA may be 1024×768×3 (RGB), that of UXGA may be 1600×1200×3 (RGB), and that of a full-spec high vision may be 1920×1080×3 (RGB).

The pixels 2702 are arranged in matrix by intersecting a scan line extended from the scan line input terminal 2703 and a signal line extended from the signal line input terminal 2704. Each of the pixels 2702 is provided with a switching element and a pixel electrode connected thereto. A typical example of the switching element is a TFT. The gate electrode of the TFT is connected to the scan line, and the source or drain thereof is connected to the signal line, which enables each pixel to be controlled independently by a signal input from outside.

The TFT includes a semiconductor layer, a gate insulating layer, and a gate electrode layer as its main components. A wiring layer connected to a source/drain region formed in the semiconductor layer also accompanies with the TFT. A top gate type TFT in which a semiconductor layer, a gate insulating layer, and a gate electrode layer are arranged from the substrate side, a bottom gate type TFT in which a gate electrode layer, a gate insulating layer, and a semiconductor layer are arranged from the substrate side, and the like are known as typical structures of a TFT. Any one of the structures may be applied to the present invention.

An amorphous semiconductor (hereinafter also refereed to as a "AS") manufactured by a vapor phase growth method or sputtering using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer.

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of from 0.5 nm to 20 nm can be observed in at least a part of a region in the film. When silicon is contained as the main component, a Raman spectrum is shifted to a lower frequency side than 520 cm$^{-1}$. A diffraction peak of (111) or (220) to be caused by a crystal lattice of silicon is observed in X-ray diffraction. Hydrogen or halogen of at least 1 atomic % or more is contained to terminate a dangling bond. The SAS is formed by glow discharge decomposition (plasma CVD) of a silicide gas. $SiH_4$ is used as a typical silicide gas. In addition, $Si_2H_6$, $SiH_2Cl_2$, $SiHCl_3$, $SiCl_4$, $SiF_4$, or the like can also be used as the silicide gas. Further, $F_2$ or $GeF_4$ may be mixed. This silicide gas may be diluted with $H_2$, or $H_2$ and one or more rare gas elements selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature may be 300° C. or less, and the film can also be formed at temperatures of from 100° C. to 200° C. It is desirable that an atmospheric constituent impurity such as oxygen, nitrogen, or carbon is $1×10^{20}$ atoms/cm$^3$ or less as an impurity element in the film; specifically, an oxygen concentration is $5×10^{19}$ atoms/cm$^3$ or less, preferably $1×10^{19}$ atoms/cm$^3$ or less. A preferable SAS can be obtained by further promoting lattice distortion by adding a rare gas element such as helium, argon, krypton or neon to enhance stability. Additionally, a SAS layer formed using a hydrogen-based gas may be stacked over a SAS layer formed using a fluorine-based gas.

Figure 15A:
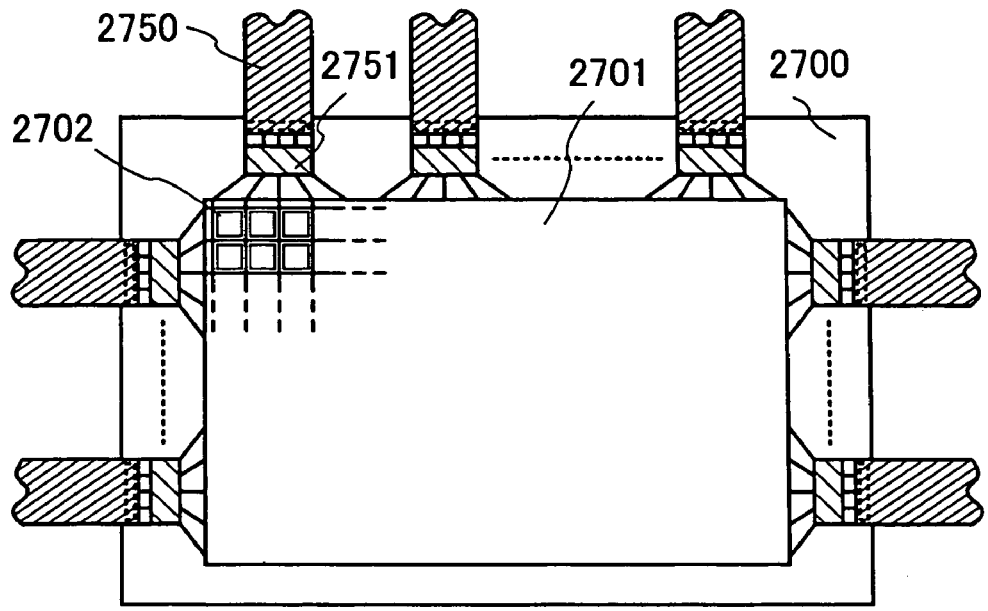
FIGS. 15A and 15B are top views of a display device according to the present invention.
Figure 15B:
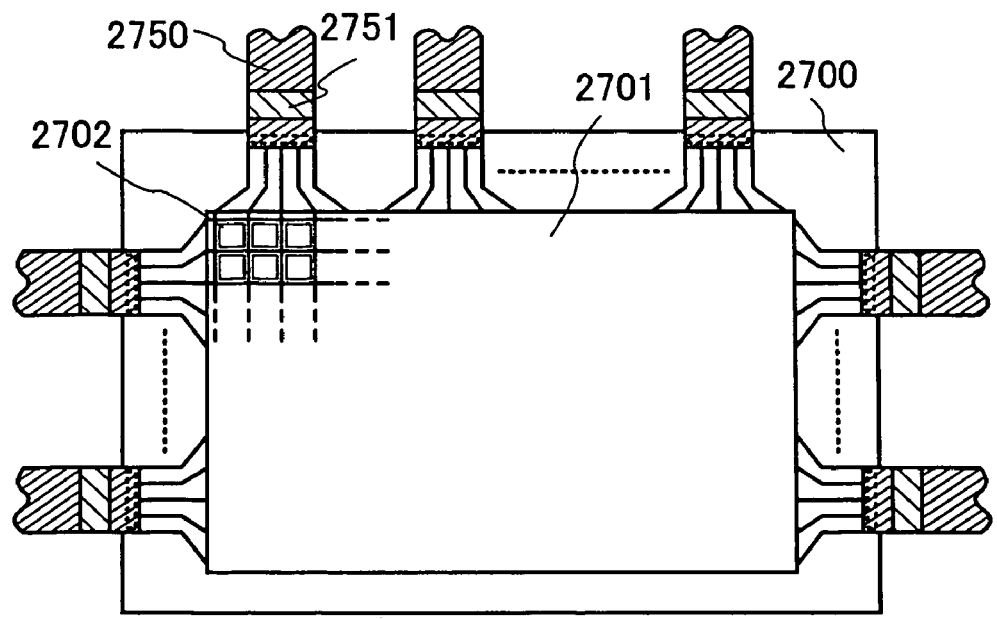

FIG. 14A shows a structure of a display panel in which a signal to be input to a scan line and a signal line is controlled by an external driver circuit. Alternatively, a driver IC 2751 may be mounted on a substrate 2700 by COG (Chip on Glass) method as shown in FIG. 15A. As another mounting mode, TAB (Tape Automated Bonding) may be also used as shown in FIG. 15B. The driver IC may be formed over a single crystal semiconductor substrate or may be formed with a TFT, over a glass substrate. In FIGS. 15A and 15B, a driver IC 2751 is connected to an FPC (Flexible Printed Circuit) 2750.

Figure 14B:
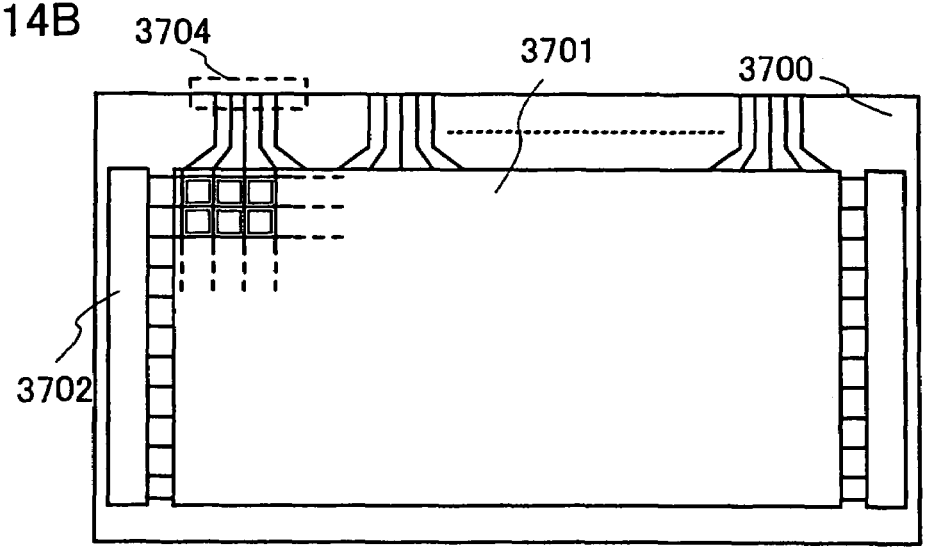
Figure 14C:
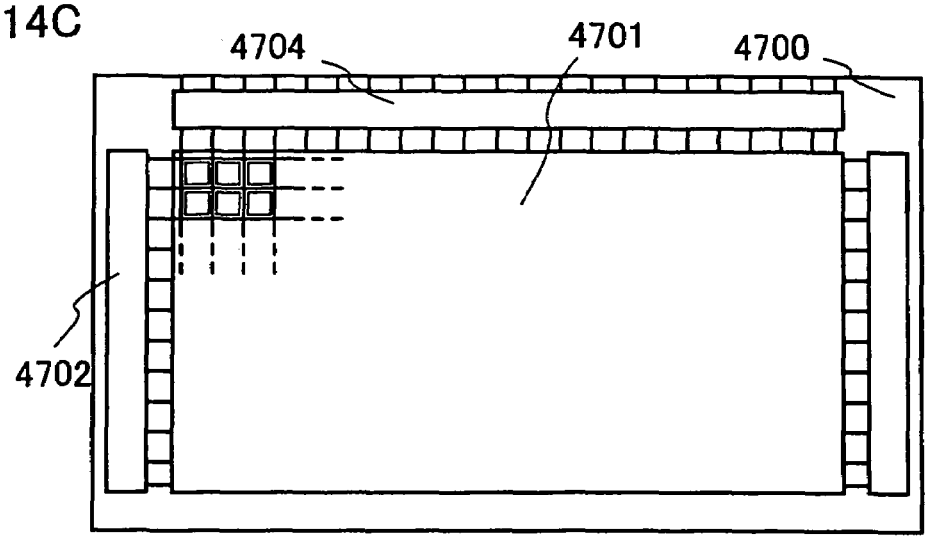

When a TFT provided in a pixel is formed of a SAS, a scan line driver circuit 3702 may be integrally formed over a substrate 3700 as shown in FIG. 14B. In FIG. 14B, a pixel portion 3701 is controlled by an external driver circuit which is connected to a signal line input terminal 3704 in the same manner as in FIG. 14A. When a TFT provided in a pixel is formed of a polycrystalline (microcrystalline) semiconductor, a single crystal semiconductor, or the like having high electron mobility, a pixel portion 4701, a scan line driver circuit 4702 and a signal line driver circuit 4704 can be integrally formed over a substrate 4700 as shown in FIG. 14C.

Figure 3A:
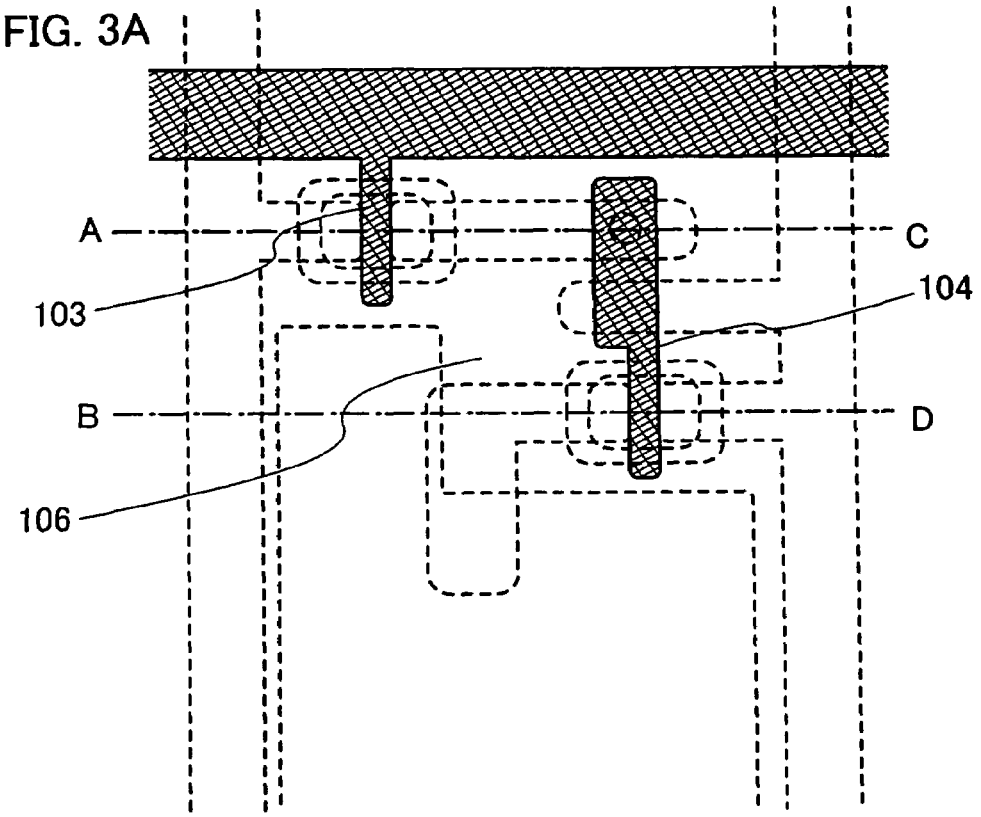
FIGS. 3A to 3C are views describing a method for manufacturing a display device according to the present invention.
Figure 3B:
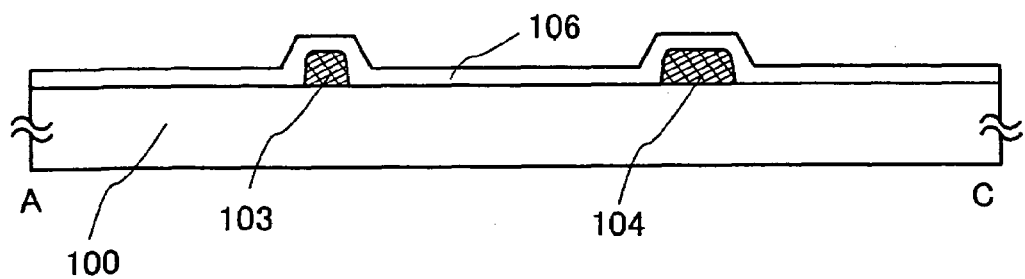
Figure 3C:
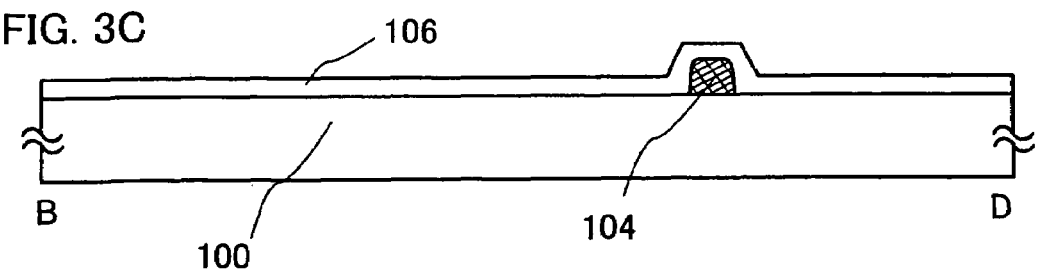
Figure 4A:
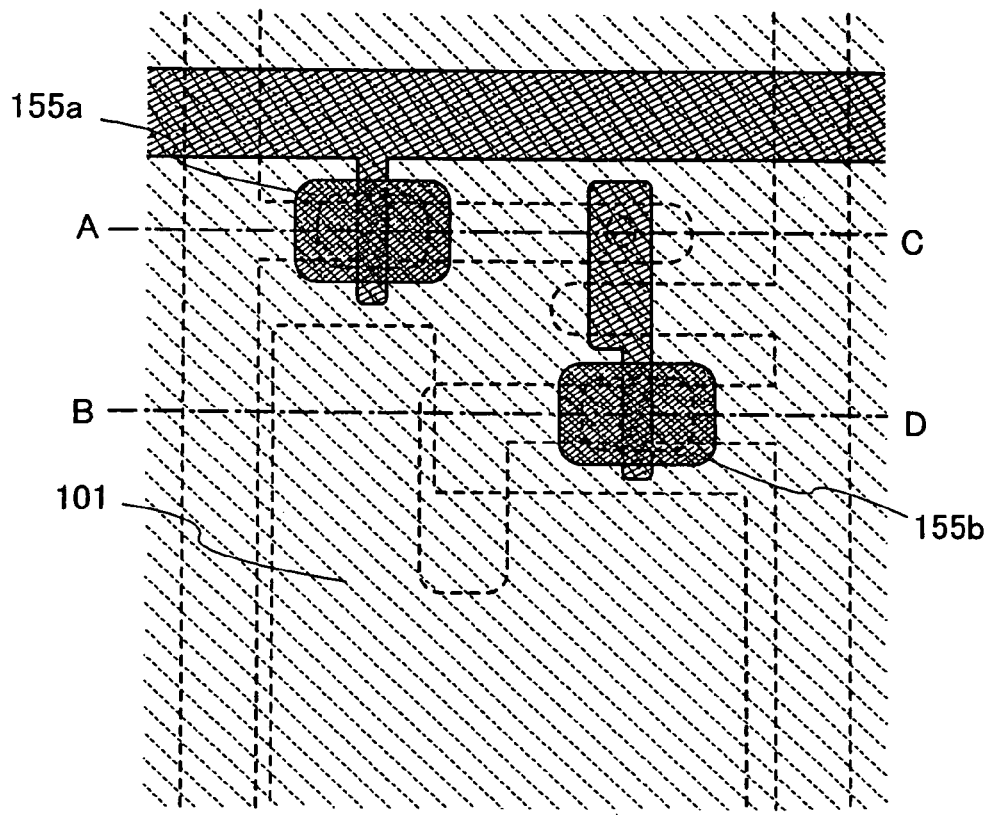
FIGS. 4A to 4C are views describing a method for manufacturing a display device according to the present invention.
Figure 4B:
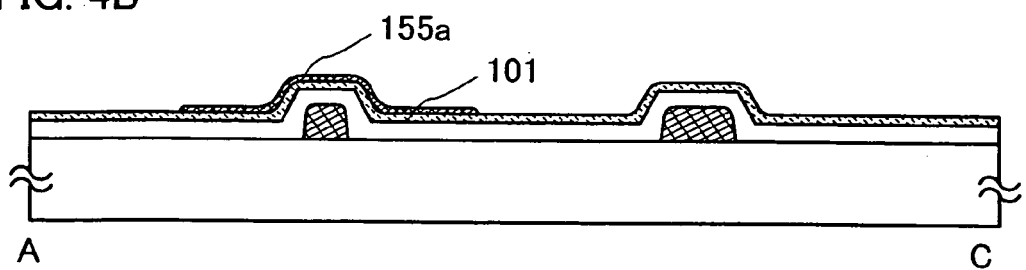
Figure 4C:
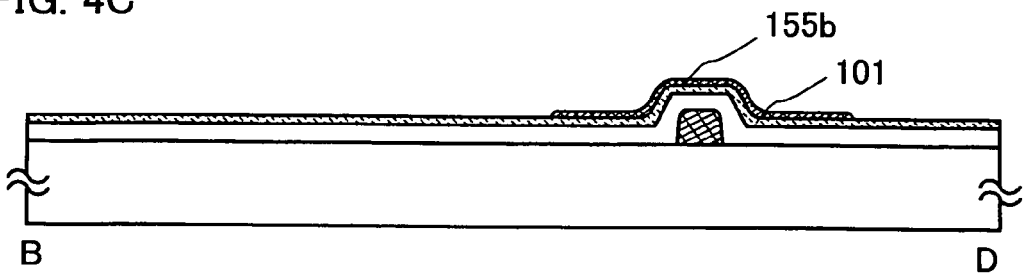

A glass substrate formed of barium borosilicate glass, alumino borosilicate glass, or the like; a quartz substrate; a silicon substrate; a metal substrate; a stainless-steel substrate; or a plastic substrate which can withstand the process temperature of the manufacturing process is used for a light-transmitting substrate 100 (FIGS. 3B and 3C). The surface of the light-transmitting substrate 100 may be polished by CMP or the like to be planarized. In addition, an insulating layer may be formed over the light-transmitting substrate 100. The insulating layer is formed of a single layer or a laminate by a known method such as CVD, plasma CVD, sputtering, or spin coating using an oxide material or nitride material including silicon. The insulating layer is not necessarily formed; however, it has an effect of blocking contaminants from the substrate 100. In the present invention, in modifying the pattern forming region, a surface of the formed substance is modified by being irradiated with light through the light-transmitting substrate 100 by back exposure. Accordingly, the light-transmitting substrate 100 is required to be a substance which transmits enough light to modify the pattern formation region.

Gate electrode layers 103 and 104 are formed over the light-transmitting substrate 100 (FIGS. 3A to 3C). The gate electrode layers 103 and 104 can be formed by CVD, sputtering, a droplet discharge method, or the like. The gate electrode layers 103 and 104 may be formed with an element selected from Ta, W, Ti, Mo, Al, and Cu, an alloy material or a compound material mainly containing the element. Alternatively, a semiconductor film typified by a polycrystalline silicon film doped with an impurity element such as phosphorus, or AgPdCu alloy may be used. Either single layer structure or layered structure may be used. For example, a two-layer structure of a tungsten nitride (TiN) film and a molybdenum (Mo) film, or a three-layer structure in which a 50 nm thick tungsten film, a 500 nm thick alloy (Al—Si) film of aluminum and silicon, and a 30 nm titanium nitride film are stacked in order. Further, in the case of the three-layer structure, tungsten nitride may be used instead of the tungsten of the first conductive film, an alloy (Al—Ti) film of aluminum and titanium may be used instead of the alloy (Al—Si) film of silicon and aluminum of the second conductive film, and a titanium film may be used instead of the titanium nitride film of the third conductive film.

In the case where the gate electrode layers 103 and 104 are required to be patterned to a shape, patterning may be carried out by dry etching or wet etching after forming a mask. The electrode layers can be etched to a desired tapered shape by ICP (Inductively Coupled Plasma) etching appropriately controlling the etching condition (the amount of electric power applied to a coiled electrode, the amount of electric power applied to an electrode of a substrate side, the temperature of the electrode of the substrate side, or the like). Note that a chlorine-based gas typified $Cl_2$, $BCl_3$, $SiCl_4$, and $CCl_4$; a fluorine-based gas typified by $CF_4$, $SF_6$, and $NF_3$; or $O_2$ can be appropriately used for the etching gas.

The mask for patterning can be formed by selectively discharging the composition. The patterning steps can be simplified by thus forming a mask selectively. A resin material such as epoxy resin, acrylic resin, phenol resin, novolac resin, melamine resin, or urethane resin is used for the mask. In addition, the mask may be formed by a droplet discharge method using an organic material such as benzocyclobutene, parylene, flare, or light-transmitting polyimide; a compound material made by the polymerization of such as a siloxane-based polymer; a composition material containing a water-soluble homopolymer and a water-soluble copolymer; or the like. Alternatively, a commercial resist material containing a photosensitizer may be used. For example, a typical positive type resist such as a novolac resin and a naphthoquinone diazide compound that is a photosensitizer, or a negative type resist such as a base resin and diphenylsilanediol and an acid generator may be used. In using any material, the surface tension and the viscosity are appropriately controlled by diluting the concentration of a solvent or adding a surfactant or the like.

In this embodiment mode, the gate electrode layer 103 and the gate electrode layer 104 are formed by a droplet discharge means. The droplet discharge means is a general term for one having a means of discharging a droplet such as a nozzle having a discharge opening of a composition or a head equipped with one or plural nozzles. The diameter of the nozzle included in the droplet discharge means is set in the range of from 0.02 µm to 100 µm (preferably, 30 µm or less), and the amount of the composition to be discharged from the nozzle is set in the range of from 0.001 pl to 100 pl (preferably, 0.1 pl to 40 pl, more preferably, 10 pl or less). The amount of the composition to be discharged increases in proportion to the size of the diameter of the nozzle. Further, it is preferable that the distance between an object to be processed and the discharge opening of the nozzle is as short as possible in order to drop the droplet on a desired position. Favorably, the distance is set approximately in about the range from 0.1 mm to 3 mm (more preferably, 1 mm or less).

As for the composition to be discharged from the discharge opening, a conductive material dissolved or dispersed in a solvent is used. The conductive material is fine particles or dispersed nanoparticles of metal such as Ag, Au, Cu, Ni, Pt, Pd, Ir, Rh, W, or Al, sulfide of metal such as Cd or Zn, oxide of Fe, Ti, Si, Ge, Zr, Ba, or the like, or silver halide. The conductive material may be indium tin oxide (ITO), ITSO formed of indium tin oxide and silicon oxide, organic indium or organotin, zinc oxide, titanium nitride, or the like, which is used as a transparent conductive film. However, as for compositions to be discharged from the discharge opening, it is preferable to use any one of the materials of gold, silver, and copper, which is dissolved or dispersed in a solvent, taking a specific resistance value into consideration. It is more preferable to use silver or copper having a low resistance value. When silver or copper is used, a barrier film may be additionally provided as a countermeasure against impurities. A silicon nitride film or nickel boron (NiB) can be used for the barrier film.

In addition, a particle in which a conductive material is coated with another conductive material to form a plurality of layers may be used. For example, a three-layer structure particle in which copper is coated with nickel boron (NiB), which is further coated with silver may be used. As for the solvent, esters such as butyl acetate and ethyl acetate; alcohols such as isopropyl alcohol and ethyl alcohol; organic solvents such as methyl ethyl ketone and acetone; or the like may be used. The viscosity of the composition is preferably 20 mPa·s or less. This prevents the composition from drying, or the composition is smoothly discharged from the discharge opening. The surface tension of the composition is preferably 40 mN/m or less. However, the viscosity of the composition and the like may be appropriately controlled in accordance with a solvent to be used and use application. For example, the viscosity of a composition in which ITO, organic indium, or organotin is dissolved or dispersed in the solvent may be set from 5 mPa·s to 20 mPa·s, the viscosity of a composition in which silver is dissolved or dispersed in the solvent may be set from 5 mPa·s to 20 mPa·s, and the viscosity of a composition in which gold is dissolved or dispersed in a solvent may be set from 5 mPa·s to 20 mPa·s.

The conductive layer may be formed by stacking a plurality of conductive materials. In addition, the conductive layer may be formed by a droplet discharge method using silver as a conductive material; thereafter, it may be plated with copper or the like. Plating may be performed by electroplating or a chemical (electroless) plating method. Plating may be performed by soaking a substrate surface into a container filled with a solution containing a plating material. The solution containing a plating material may be applied so that the solution flows over the substrate surface with the substrate placed obliquely (or vertically). When the plating is performed by applying a solution with the substrate placed vertically, there is an advantage that a process apparatus can be smaller.

The diameter of a particle of the conductor is preferably as small as possible for the purpose of preventing nozzles from being clogged and manufacturing a fine pattern, although it depends on the diameter of each nozzle, a desired shape of a pattern, and the like. Preferably, the diameter of the particle of the conductive material is 0.1 µm or less. The composition is formed by a known method such as an electrolyzing method, an atomizing method, a wet reducing method, or the like, and the particle size thereof is typically about from 0.01 µm to 10 µm. However, when a gas evaporation method is employed, nanoparticles protected with a dispersant are minute, about 7 nm. When the surface of each particle is covered with a coating, the nanoparticles do not aggregate in the solvent and are uniformly dispersed in the solvent at room temperature, and behaves similarly to liquid. Accordingly, it is preferable to use a coating.

In the present invention, it is necessary that the composition has fluidity even when it touches the object to be processed since it is processed to have a desired pattern shape by utilizing the difference in wettability with respect to the fluid composition between a pattern forming region and the periphery thereof. However, the process of discharging a composition may be performed under reduced pressure if fluidity is not lost. In addition, when the process is performed under reduced pressure, an oxide film or the like is not formed over the surface of the conductive material, which is preferable. After discharging the composition, either or both steps of drying and baking is/are performed. Each step of drying and baking is carried out by heat treatment. For example, drying is performed for three minutes at 100° C. and baking is performed for 15 minutes to 60 minutes at a temperature of from 200° C. to 350° C., each of which has a different purpose, temperature, and period. The steps of drying and baking are performed at normal pressure or under reduced pressure by laser light irradiation, rapid thermal annealing, heating using a heating furnace, or the like. Note that the timing of the heat treatment is not particularly limited. The substrate may be heated to favorably perform the steps of drying and baking. The temperature of the substrate at the time depends on the material of the substrate or the like, but it is typically 100° C. to 800° C. (preferably, from 200° C. to 350° C.). With the steps, nanoparticles are made in contact with each other and fusion and welding are accelerated by hardening and shrinking a peripheral resin as well as evaporating the solvent in the composition or chemically removing the dispersant.

A continuous wave or pulsed gas laser or a solid-state laser may be used for laser light irradiation. An excimer laser, a YAG laser, and the like can be used as the former gas laser. A laser using a crystal of YAG, YVO$_4$, GdVO$_4$, or the like which is doped with Cr, Nd, or the like can be used as the latter solid-state laser. Note that it is preferable to use a continuous wave laser in relation to the absorptance of laser light. Moreover, a so-called hybrid laser irradiation method which combines pulse and continuous wave may be used. However, it is preferable that the heat treatment by laser light irradiation is instantaneously performed within several microseconds to several tens of seconds so as not to damage the substrate 100, depending on heat resistance of the substrate 100. Rapid thermal annealing (RTA) is carried out by raising the temperature rapidly and heating for several microseconds to several minutes using an infrared lamp or a halogen lamp emitting light of from ultraviolet to infrared in an inert gas atmosphere. Since the treatment is performed instantaneously, only a thin film on a top surface can be substantially heated and a lower layer film is not affected. Accordingly, even a substrate having low heat resistance such as a plastic substrate is not affected.

After forming the gate wiring layers 103 and 104 by discharging a composition by a droplet discharge method, the surface thereof may be planarized by pressing it with pressure to enhance its planarity. As a pressing method, unevenness may be smoothed by making a roller-shaped object moved over the surface, or the surface may be vertically pressed with a flat plate-shaped object. A heat process may be performed at the time of pressing. Alternatively, unevenness on the surface may be eliminated with an air knife by softening or melting the surface with a solvent or the like. A CMP method may be also used for polishing the surface. This step may be applied for planarizing a surface when unevenness is caused by a droplet discharge method.

Subsequently, a gate insulating layer 106 is formed over the gate electrode layers 103 and 104 (see FIGS. 3A to 3C). The gate insulating layer 106 is required to transmit light so that a photocatalyst formed thereover is activated by light irradiation. The gate insulating layer 106 may be formed of a known material such as an oxide or nitride of silicon, and may be a laminate or a single layer. In this embodiment mode, a laminated layer of three layers of a silicon nitride film, a silicon oxide film, and a silicon nitride film is used. Alternatively, a single layer of them or of a silicon oxynitride film, or a laminated layer of two layers may be used. A silicon nitride film having fine film quality may be preferably used. In the case of using silver, copper, or the like for the conductive layer formed by a droplet discharge method, in forming a silicon nitride film or a NiB film thereover as a barrier film, the silicon nitride film or the NiB film is effective in preventing impurities from diffusing and in planarizing the surface. Note that a rare gas element such as argon is preferably included in a reactive gas and is preferably mixed into the insulating film to be formed in order to form a fine insulating film with little gate leak current at a low film-formation temperature.

As pretreatment for forming a source/drain electrode layer with good control, the periphery of a pattern forming region is modified to have different wettability from the region therearound. In this embodiment mode, a photocatalyst is formed and a substance having low wettability is formed thereon. The wettability is selectively changed by irradiation treatment to form a high-wettability region and a low-wettability region. The difference in wettability can be confirmed by the contact angle that is 30° or more, preferably, 40° or more. In the present invention, a photocatalyst which is activated according to the wavelength of the applied light is formed in contact with the object in order to enhance the efficiency of the light irradiation treatment.

A photocatalyst 101 is formed over the gate electrode layer 106, and low wettability substances 155a and 155b are formed over the photocatalyst 101 (FIG. 4).

In this embodiment mode, a TiCl$_3$ solution is applied and baked to form a 50 nm thick titanium oxide layer. Alternatively, a titanium nitride (TiO$_X$ (typified by TiO$_2$)) crystal including a predetermined crystalline structure may be formed by sputtering. In this case, sputtering is carried out with argon gas and oxygen using a titanium tube as the target. He gas may be used additionally. A titanium oxide layer having high photocatalytic activity is formed under an atmosphere containing much oxygen and higher formation pressure. Further, it is preferable to form the titanium oxide layer heating the film formation chamber or the substrate provided with the object. The thus formed titanium oxide layer has photocatalytic properties even though it is thin.

As an example of the composition of the solution for forming the low-wettability region, a silane coupling agent expressed in a chemical formula of R$_n$—Si—X$_{(4-n)}$ (n=1, 2, 3) is used. Here, R denotes a substance which contains a comparatively inactive group such as an alkyl group. Further, X includes a hydrolysable group which can be bonded by the condensation with a hydroxyl group or absorbed water on a surface such as halogen, a methoxy group, an ethoxy group, or an acetoxy group.

Using a fluorine-based silane coupling agent (fluoroalkylsilane (hereinafter referred to as FAS)) having a fluoroalkyl group for R that is a representative example of the silane coupling agent, the wettability can be lowered. R of FAS has a structure which is expressed in (CF$_3$)(CF$_2$)$_x$(CH$_2$)$_y$ (x: an integer from 0 to 10, y: an integer from 0 to 4). In the case where a plurality of R or X are bonded to Si, the R or X may all be the same or different. Fluoroalkylsilane (FAS) such as heptadecafluoro tetrahydrodecyltriethoxysilane, heptadecafluorotetrahydrodecyltrichlorosilane, tridecafluorotetrahydrooctyltrichlorosilane, trifluoropropyltrimethoxysilane are typically used.

As the solvent of a solution for forming the low-wettability region, a solvent which forms a low-wettability region scuh as a hydrocarbon-based solvent, tetrahydrofuran, or the like, namely, n-pentane, n-hexane, n-heptane, n-octane, n-decane, dicyclopentane, benzene, toluene, xylene, durene, indene, tetrahydronaphthalene, decahydronaphthalene, squalene, or the like is used.

As an example of the compound of the solvent for forming the low-wettability region, a material having a fluorocarbon chain (fluorine resin) can be used. As the fluorine resin, polytetrafluoroethylene (PTFE; polytetrafluoroethylene resin), perfluoroalkoxyalkane (PFA; tetrafluoroethylene perfluoroalkylvinylether copolymer resin), perfluoroethylene propylene copolymer (PFEP; tetrafluoroethylene hexafluoropropylene copolymer resin), ethylene-tetrafluoroethylene copolymer (ETFE; tetrafluoroethylene-ethylene copolymer resin), polyvinylidene fluoride (PVDF; polyvinylidene fluoride resin), polychlorotrifluoroethylene (PCTFE; polytrifluorochloroethylene resin), ethylene-chlorotrifluoroethylene copolymer (ECTFE; polytrifluorochloroethylene-ethylene copolymer resin), polytetrafluoroethylene-perfluorodioxol copolymer (TFE/PDD), polyvinylfluoride (PVF; vinyl fluoride resin), or the like can be used.

In addition, an organic material which does not form a low-wettability region (in other words, which forms a high-wettability region) may be used to form a low wettability region by performing treatment with the use of $CF_4$ plasma or the like later. For example, a material in which a soluble resin such as polyvinyl alcohol (PVA) is mixed into a solvent of such as $H_2O$ can be used. In addition, PVA may be mixed with another soluble resin may be used. An organic material (an organic resin material) (polyimide, acrylic), a material in which a skeleton is formed by the bond of silicon (Si) and oxygen (O), and which includes an organic group containing at least hydrogen as a substituent. Alternatively, a fluoro group, an alkyl group, or aromatic hydrocarbon may be used as the substituent. Even when a material having a low-wettability surface is used, wettability can be further reduced by performing plasma treatment or the like.

In this embodiment mode, FAS is used as a low wettability substance. The substance is wettable with the composition containing a conductive material which later constitutes a source/drain electrode layer. FAS used in this embodiment mode is decomposed with light having a wavelength of 200 nm or less; however, a glass substrate absorbs and does not transmit light with a wavelength of 300 nm or less. Therefore, FAS can not be irradiated with light if a glass substrate is used as the substrate. In this embodiment mode, the titanium oxide layer exerting a photocatalytic effect when exposed to light of 380 nm or less is formed. A metal halide lamp which is an ultraviolet lamp which emits light with a wavelength of 200 nm to 450 nm is used as a light source. The photocatalyst can be appropriately selected depending on the wavelength of the light to be used. In this embodiment mode, a low wettability substance is selectively formed by a droplet discharge method in the vicinity of the pattern formation region; however, the low wettability substance may be applied to a wide area (to the entire surface, for example) by spin coating or the like, and patterning may be carried out thereafter. When a droplet discharge method is used as in this embodiment mode, the waste of material can be reduced, and the efficiency in the use of the material is improved.

Figure 5A:
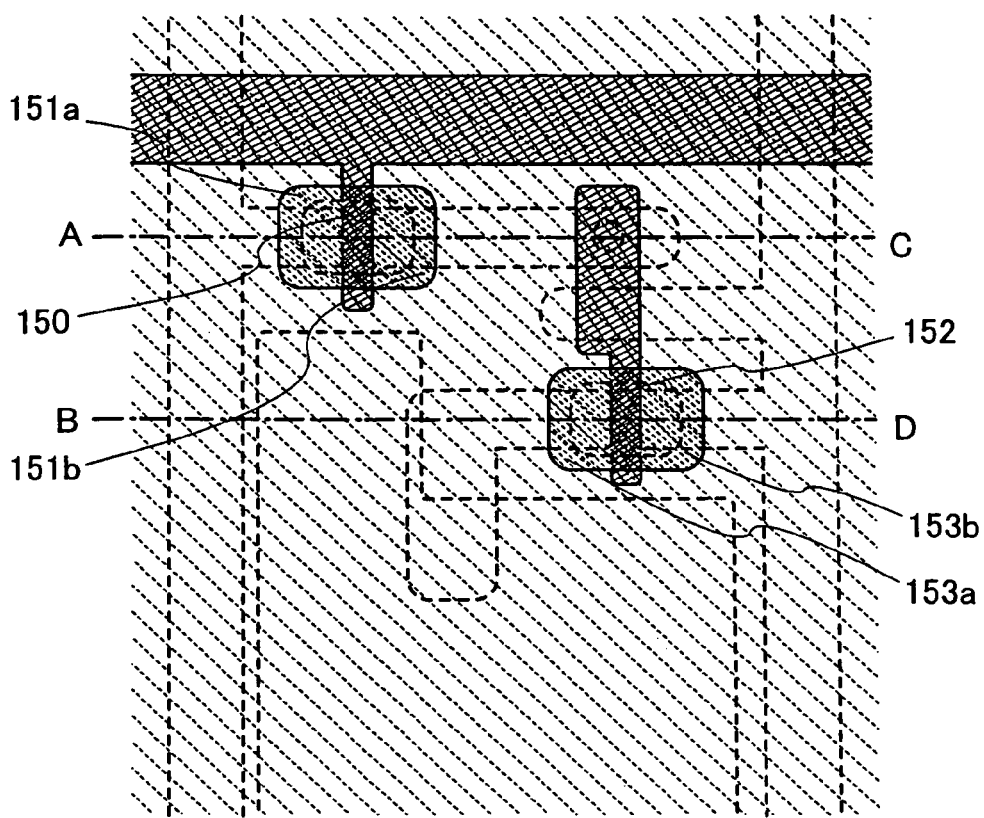
FIGS. 5A to 5C are views describing a method for manufacturing a display device according to the present invention.
Figure 5B:
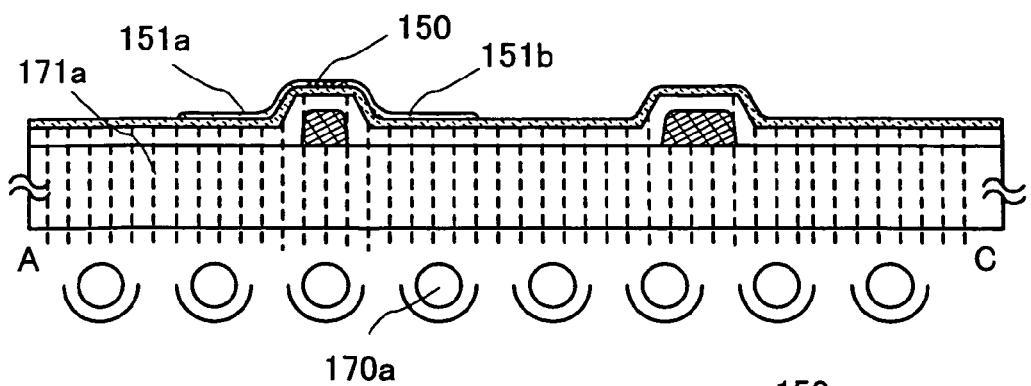
Figure 5C:
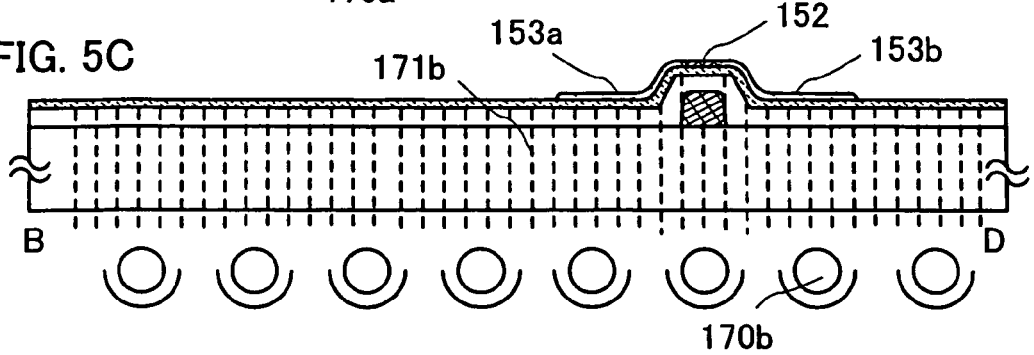

Next, the photocatalyst 101 is irradiated with light 171a and light 171b through the light transmitting substrate 100 as shown FIGS. 5B and 5C. The low wettability substance 155a and the low wettability substance 155b are decomposed by the energy generated when the photocatalyst 101 is activated by the light 171a and 171b; thus, the wettability is improved. The treatment efficiency can be enhanced since the photocatalytic effect of the photocatalyst is used. The gate electrode layers 103 and 104 are used as masks; therefore, the surfaces of the low wettability substance over the regions which are overlapped with the gate electrode layers 103 and t 104 are not modified. High wettability regions 151a and 151b, which are relatively more wettable, and a low wettability region 150 that is relatively less wettable are formed on the surface of the low wettability substance 155a by light irradiation (FIG. 5B). In the similar manner, a relatively high wettability region 153a, a high wettability region 153b, and low wettability region 152 that is relatively less wettable are formed on the surface of the low wettability substance 155b by irradiation with the light 171a (FIG. 5C). The range of options for light is increased since a photocatalyst can be selected in accordance with the light. Consequently, the wavelength that is hardly absorbed by the substance to be provided with the object can be selected, and light irradiation for controllable surface modification treatment (so-called back exposure) can be carried out. Further, the efficiency of light irradiation can be improved, so that the treatment can be completed even though the light itself has low energy. As a result, the apparatuses and steps are simplified, thus, costs and time are reduced, and the production efficiency can be improved.

In this embodiment mode, when the mask is formed by a droplet discharge method, treatment for forming a pattern forming region and the periphery thereof to have different wettability may be performed for pretreatment. In the present invention, when a pattern is formed by discharging a droplet by a droplet discharge method, the pattern shape can be controlled by forming a low-wettability region and a high-wettability region in a pattern forming region. Performing the treatment on the pattern formation region causes difference in wettability therein, so that a droplet remains only on the high-wettability region. Accordingly, the pattern can be formed with good control. This step is applicable to pretreatment for forming any pattern in the case of using a liquid material.

A mask comprising an insulator such as a resist or polyimide is formed by using a droplet discharge method. An opening 145 is formed in a part of the gate insulating layer 106 by etching using the mask, and a part of the gate electrode layer 104 disposed in the lower layer is exposed. Either plasma etching (dry etching) or wet etching may be adopted for the etching. However, plasma etching is suitable to treat a large substrate. A fluorine-based such as $CF_4$, $NF_3$, or chlorine-based gas such as $Cl_2$, or $BCl_3$ is used as the etching gas, and an inert gas such as He or Ar may be appropriately added. In addition, a local discharge process can be performed when an atmospheric pressure discharge etching process is applied, and a mask layer need not be entirely formed over the substrate.

Figure 6A:
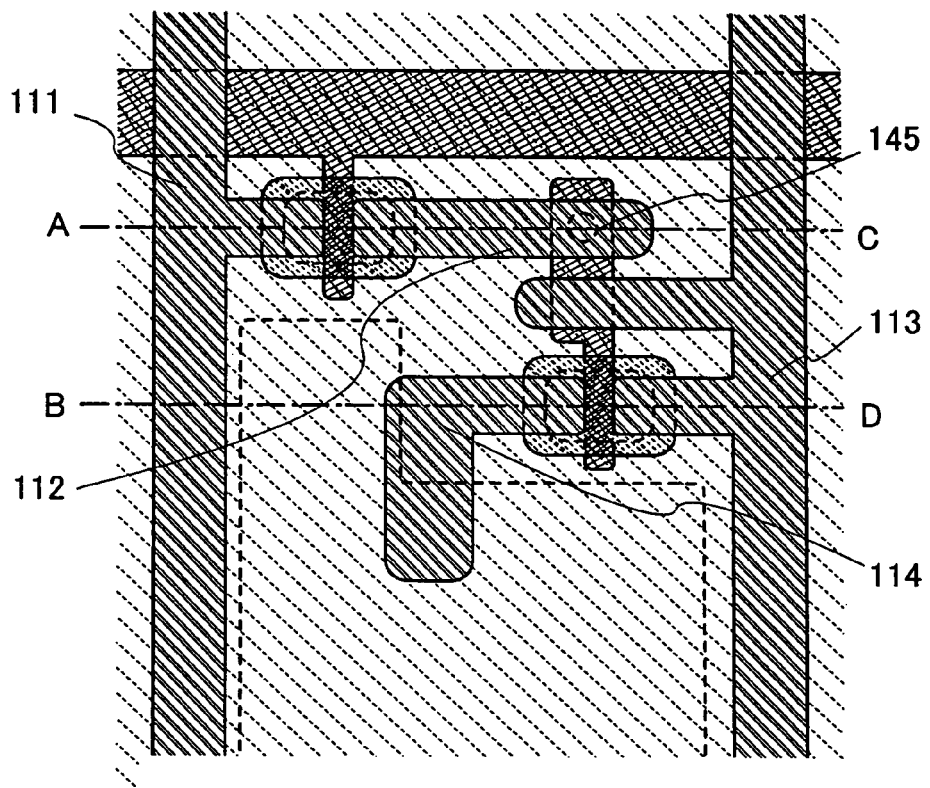
FIGS. 6A to 6C are views describing a method for manufacturing a display device according to the present invention.
Figure 6B:
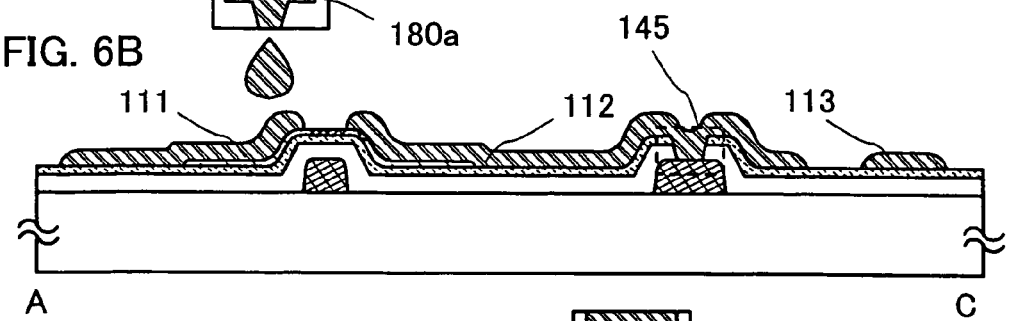
Figure 6C:
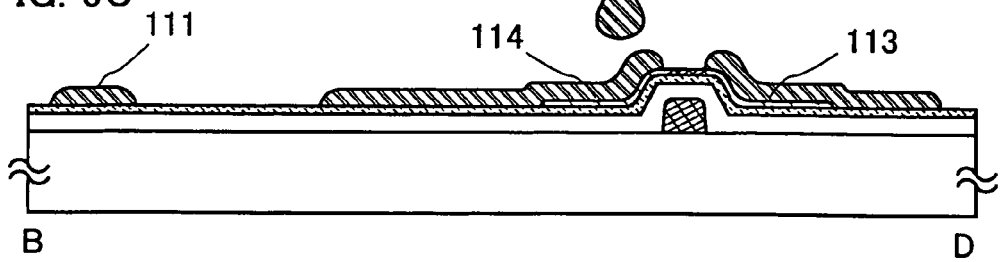

A composition containing a conductive material is discharged from droplet discharge systems 180a and 180b to high-wettability regions 151a, 151b, 153a, and 153b. Thus, source/drain electrode layers 111, 112, 113, and 114 are formed (FIGS. 6A to 6C). Even when the pattern forming material can not be discharged precisely depending on the size of the discharge opening of the nozzle from which the droplet is discharged or the moving ability of the discharge opening, the droplet is attached only to the region to form a desired pattern by performing treatment for enhancing wettability on the pattern formation region. This is because the pattern formation region and the periphery thereof have different wettability; therefore, the droplet is repelled only in the low-wettability region and remains on the pattern formation region having higher wettability. In other words, a droplet is repelled by the low-wettability region surrounding a periphery of the high-wettability region; therefore, the boundary between the high-wettability region and the low-wettability region functions as a partition wall (a bank). Accordingly, even the composition containing a conductive material having fluidity can remain on the high-wettability region; thus, each source/drain electrodelayer can be formed to have a desired shape.

The source/drain electrode layer 111 also serves as a source wiring layer, and the source/drain electrode layer 113 also serves as a power supply line.

The source/drain electrode layers 111 to 114 can be formed in a similar manner as the above described gate electrode layers 103 and 104.

As a conductive material for forming the source/drain electrode layers 111, 112 113, and 114, a compound which mainly contains metal particles of Ag (silver), Au (gold), Cu (copper), W (tungsten), Al (aluminum), or the like can be used. Alternatively, indium tin oxide (IFO), ITSO including indium tin oxide and silicon oxide, organic indium, organotin, zinc oxide, titanium nitride, or the like having light-transmitting properties may be combined.

The source/drain electrode layer 112 and the gate electrode layer 104 are electrically connected to each other through the opening 145 formed in the gate insulating layer 106. A part of the source/drain electrode layer forms a capacitor element (FIG. 6B)

According to the present invention, in forming a fine pattern, for example an electrode layer, the pattern can be formed on the pattern formation region without a droplet extended over the region even though a droplet discharge opening is somewhat large. Therefore, defects such as short that is caused when the droplet is applied to the area other than the pattern formation region can be prevented. Further, the thickness of the wiring can also be controlled. When the surface modification is carried out by the light irradiation from the substrate side as in this embodiment mode, a large area can be treated in addition to that the pattern can be formed with good control; thus, the production efficiency is improved. By combining a droplet discharge method, the material loss can be avoided compared with entire surface application formation by spin coating or the like; therefore, the cost can be reduced. According to the present invention, a pattern can be formed with good control even in the case where a wiring or the like is provided integrally and intricately due to miniaturization and thinner film formation.

As pretreatment, an organic material which functions as an adhesive agent may be formed to enhance adhesion with a pattern formed by a droplet discharge method. In this case, regions having different wettability may be formed over the material. An organic material (an organic resin material) (polyimide, acrylic), a material in which a skeleton is formed by the bond of silicon (Si) and oxygen (O), and which includes an organic group containing at least hydrogen as a substituent. Alternatively, a fluoro group, an alkyl group, or aromatic hydrocarbon may be used as the substituent.

Next, a semiconductor layer is formed. A semiconductor layer having one conductivity may be formed if necessary. Also, an NMOS structure of an n-channel TFT in which an n-type semiconductor layer is formed, a PMOS structure of a p-channel TFT in which a p-type semiconductor layer is formed, and a CMOS structure of an n-channel TFT and a p-channel TFT can be manufactured. In addition, the n-channel TFT and the p-channel TFT can be formed by adding an element which provides conductivity with doping to provide conductivity to form an impurity region in the semiconductor layer.

The semiconductor layer can be formed by a known technique (sputtering, LPCVD, plasma CVD, or the like). The material for a semiconductor layer is not limited, and a silicon germanium (SiGe) alloy or the like may be used.

The semiconductor layer is formed using an amorphous semiconductor (typically, hydrogenated amorphous silicon), a crystalline semiconductor (typically, polysilicon), or a semiamorphous semiconductor. Polysilicon (polycrystalline silicon) includes a so-called high temperature polysilicon using polysilicon which is formed at a temperature of 800° C. or more as a main material, a so-called low temperature polysilicon using polysilicon which is formed at a temperatures of 600° C. or less as a main material, polysilicon crystallized by being added with an element or the like which promotes crystallization, or the like.

As another material, a semiamorphous semiconductor or a semiconductor which contains a crystal phase in a part of the semiconductor layer can also be used.

When a crystalline semiconductor layer is used as the semiconductor layer, a known method (laser crystallization, heat crystallization, a heat crystallization method using an element promoting crystallization such as nickel, or the like) may be employed as a method for manufacturing the crystalline semiconductor layer. A microcrystal which is a SAS can be crystallized by being irradiated with laser light to enhance the crystallinity. In the case where an element promoting crystallization is not used, the hydrogen is released until hydrogen concentration contained in an amorphous silicon film becomes $1\times10^{20}$ atoms/cm$^3$ or less by heating the amorphous silicon film for one hour at a temperature of 500° C. in a nitrogen atmosphere before irradiating the amorphous silicon film with laser light. This is because a film is damaged when the amorphous silicon film containing much hydrogen is irradiated with laser light.

Any method can be used for introducing a metal element into the amorphous semiconductor layer without limitation as long as the method is capable of making the metal element exist on the surface or inside the amorphous semiconductor layer. For example, a sputtering method, CVD, plasma treatment (including plasma CVD), an adsorption method, or a method for applying a metal salt solution can be employed. Among them, the method using a solution is simple and easy and is advantageous in terms of easy concentration adjustment of the metal element. It is preferable to form an oxide film by UV light irradiation in oxygen atmosphere, a thermal oxidation method, treatment with ozone water or hydrogen peroxide including a hydroxyl radical, or the like in order to improve wettability of the surface of the amorphous semiconductor layer and to spread the aqueous solution over the entire surface of the amorphous semiconductor layer.

In addition, heat treatment and laser light irradiation may be combined to crystallize the amorphous semiconductor layer. Alternatively, the heat treatment and/or the laser light irradiation may be independently performed plural times.

A crystalline semiconductor layer may be directly formed over the substrate by a linear plasma method. Alternatively, a crystalline semiconductor layer may be selectively formed over the substrate by using a linear plasma method.

A semiconductor region can be formed from an organic semiconductor material by a printing method, a spray method, spin coating, a droplet discharge method, or the like. In this case, since the above etching step is not required, the number of steps can be reduced. A low molecular weight material, a high molecular weight material, or the like is used for the organic semiconductor, and in addition, a material such as an organic pigment, a conductive high molecular weight material can be used. A π-electron conjugated high molecular weight material having a skeleton constituted by a conjugated double bonds is preferably used as an organic semiconductor material used in the present invention. Typically, a soluble high molecular weight material such as polythiophene, polyfluoren, poly(3-alkylthiophene), a polythiophene derivative or pentacene can be used.

A material with which a first semiconductor region can be formed by performing treatment after depositing a soluble precursor is given as an example of an organic semiconductor material which can be used according to the present invention. Note that polythienylenevinylene, poly(2,5-thienylenevinylene), polyacetyrene, polyacetyrene derivative, polyallylenevinylene or the like is given as an example of such an organic semiconductor material formed by using the precursor.

In converting the precursor to an organic semiconductor, a reaction catalyst such as a hydrogen chloride gas is added additionally to a heat treatment. The following can be applied as a typical solvent which dissolves the organic semiconductor material having solubility: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran) or the like.

Figure 7A:
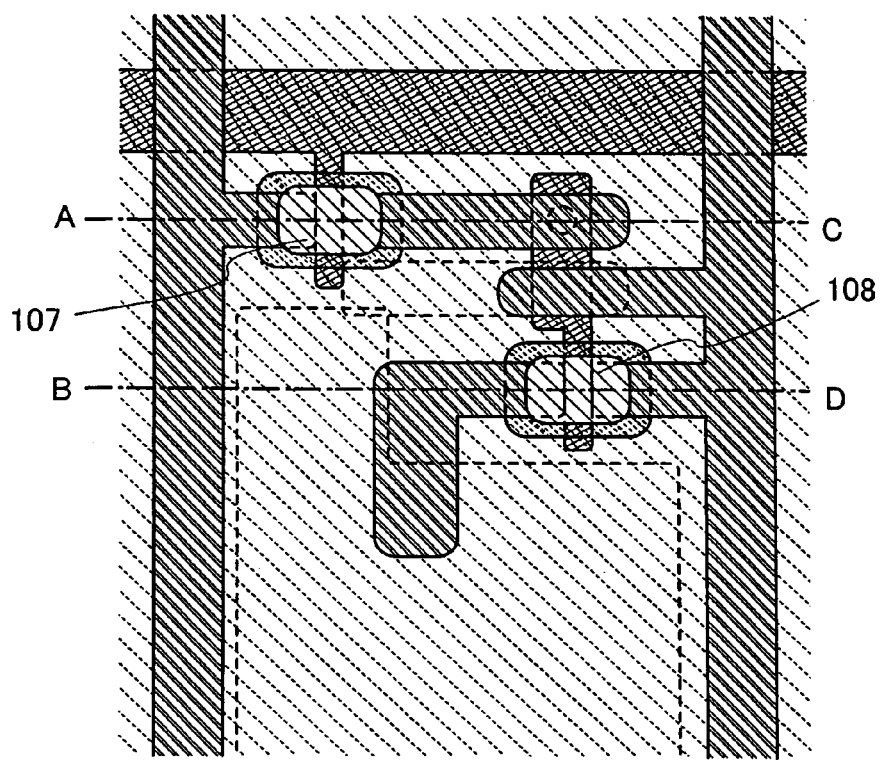
FIGS. 7A to 7C are views describing a method for manufacturing a display device according to the present invention.
Figure 7B:
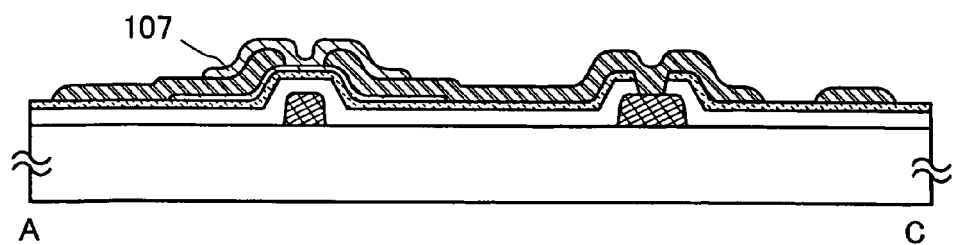
Figure 7C:
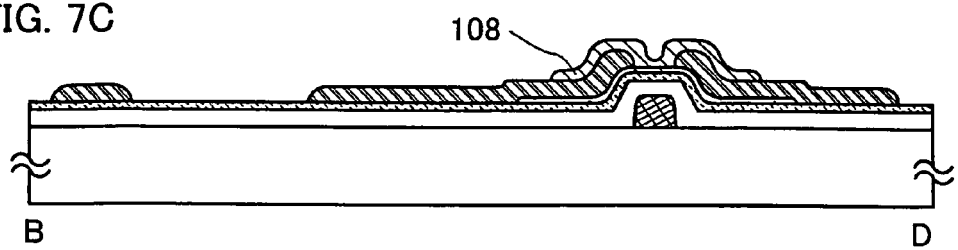

In this embodiment mode, a treatment for improving the wettability of the low wettability regions 150 and 152 by light irradiation is carried out. Subsequently, the semiconductor layers 107 and 108 are formed by a droplet discharge method using pentacene (FIGS. 7A to 7C).

Figure 8A:
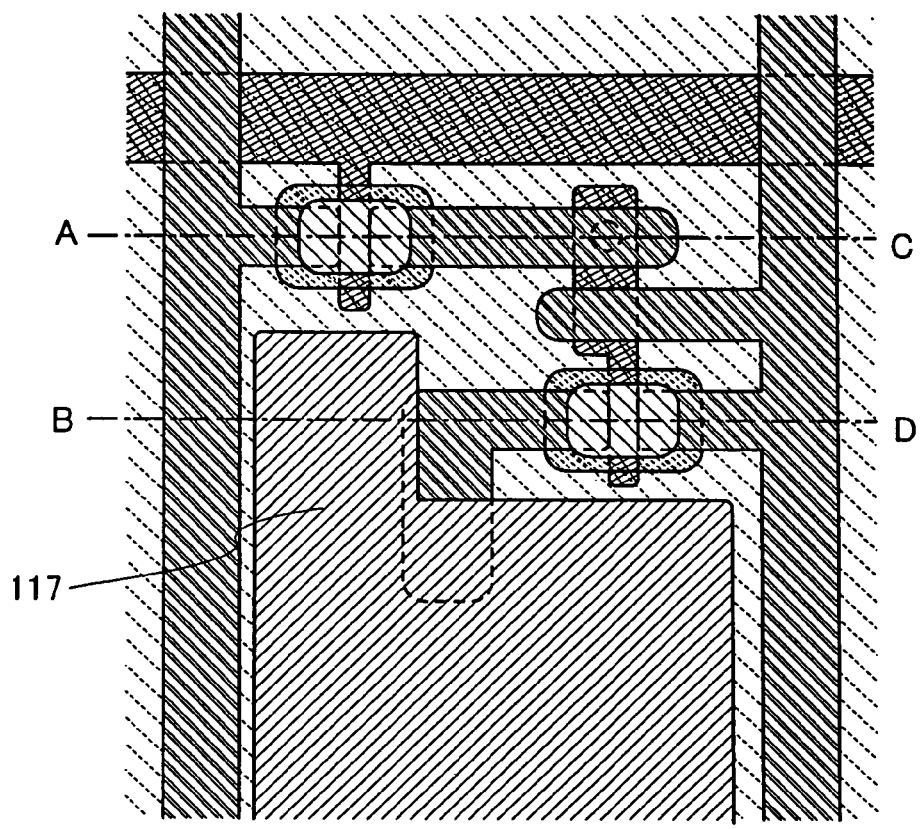
FIGS. 8A to 8C are views describing a method for manufacturing a display device according to the present invention.
Figure 8B:
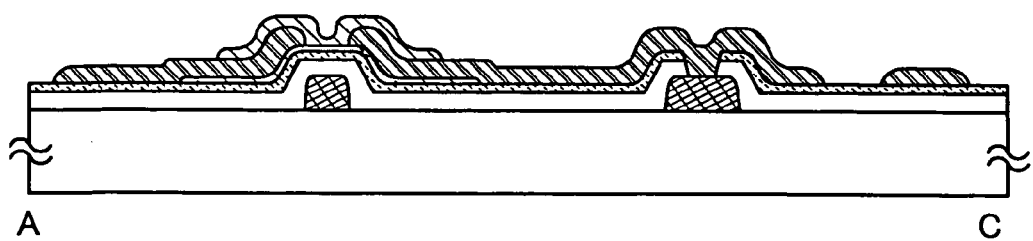
Figure 8C:
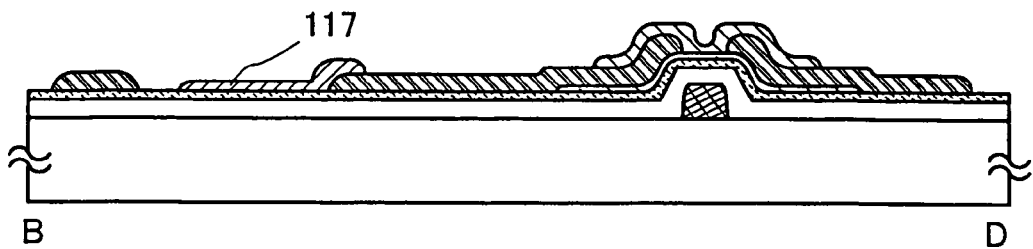

Then, a first electrode layer 117 is formed by selectively discharging a composition containing a conductive material over the gate insulating layer 106 (FIGS. 8A to 8C). When the first electrode layer 117 is formed, naturally, pretreatment for forming a low-wettability region and a high-wettability region may be performed. The first electrode layer 117 can be formed with better control and more selectively by discharging a composition containing a conductive material over the high-wettability region. When light is emitted from the light-transmitting substrate 100 side, or when a transmissive display panel is manufactured, the first electrode layer 117 may be formed by forming a predetermined pattern using a material including indium tin oxide (ITO), indium tin oxide containing silicon oxide (ITSO), indium zinc oxide (IZO) containing zinc oxide (ZnO), zinc oxide (ZnO), a material in which gallium (Ga) is doped in ZnO, or tin oxide ($SnO_2$) or the like, and by baking the pattern.

Preferably, the first electrode layer 117 may be formed of indium tin oxide (ITO), indium tin oxide containing silicon oxide (ITSO), zinc oxide (ZnO), or the like by sputtering. It is more preferable to use indium tin oxide containing silicon oxide formed by sputtering using a target of ITO containing silicon oxide of from 2% to 10% by weight. In addition, a conductive material in which ZnO is doped with gallium (Ga), or an oxide conductive material which contains silicon oxide and in which indium oxide is mixed with zinc oxide (ZnO) of from 2% to 20% by weight may be used. After the first electrode layer 117 is formed by sputtering, a mask layer may be formed by a droplet discharge method, and a desired pattern may be formed by etching. In this embodiment mode, the first electrode layer 117 is formed of a light-transmitting conductive material by a droplet discharge method. Specifically, it is formed using indium tin oxide or ITSO made of ITO and silicon oxide.

In this embodiment mode, above described is an example of the gate insulating layer comprising three layers of a silicon nitride film, a silicon oxynitride film (silicon oxide film), a silicon nitride film. As a preferable structure, the first electrode layer 117 comprising indium tin oxide containing silicon oxide is preferably formed close in contact with the insulating layer comprising silicon nitride included in the gate insulating layer 106. Accordingly, an effect of increasing a rate at which light generated in an electroluminescent layer is emitted outside can be exerted. The gate insulating layer may be interposed between the gate wiring layer or the source/drain electrode layer and the first electrode layer and may function as a capacitor element.

The first electrode layer 117 can be selectively formed over the gate insulating layer 106 before forming the source/drain electrode layer 114. In this case, this embodiment mode has a connection structure in which the source/drain electrode layer 114 is laminated over the first electrode layer 117. When the first electrode layer 117 is formed before forming the source/drain electrode layer 114, it can be formed over a flat region. Therefore, the first electrode layer 117 can be formed to have preferable planarity since preferable coverage and deposition properties can be obtained and polishing treatment such as CMP can be carried out sufficiently.

A structure in which an interlayer insulating layer is formed over the source/drain electrode layer 114 to be electrically connected to the first electrode layer 117 through a wiring layer may be also employed. In this case, instead of forming an opening (contact hole) by removing the insulating layer, a substance having low wettability with respect to the insulating layer is formed over the source/drain electrode layer 114. The insulating layer is formed on a region except for a region where the substance having low wettability is formed when a composition containing an insulator is applied by a coating method or the like.

After forming the insulating layer by solidifying it by heating, drying, or the like, the substance having low wettability is removed to form the opening. The wiring layer is formed so as to fill the opening, and the first electrode layer 117 is formed so as to be in contact with the wiring layer. With this method, etching is not necessarily performed to form the opening; therefore, the process can be simplified.

When an EL display panel is manufactured or in the case of a structure in which generated light is emitted to the side opposite to the light-transmitting substrate 100 side, a compound which mainly contains metal particles of Ag (silver), Au (gold), Cu (copper), W (tungsten), or Al (aluminum), or the like can be used. Alternatively, the first electrode layer 117 may be formed by forming a transparent conductive film or a conductive film having light reflectivity by sputtering, forming a mask pattern by a droplet discharge method, and then combining etching.

The first conductive layer 117 may be polished by CMP or by cleaning with polyvinyl alcohol-based porous body so that the surface of the first conductive layer 117 is made flat. In addition, after polishing by CMP, ultraviolet irradiation or oxygen plasma treatment or the like may be performed on the surface of the first electrode layer 117.

According to the above-mentioned steps, the TFT substrate for a display panel in which a TFT of a bottom gate type and a pixel electrode are connected to the light-transmitting substrate 100 is completed. The TFT in this embodiment mode is a co-planar type. The TFT shown in this embodiment mode can be manufactured in a self-aligned manner according to the present invention.

Figure 9A:
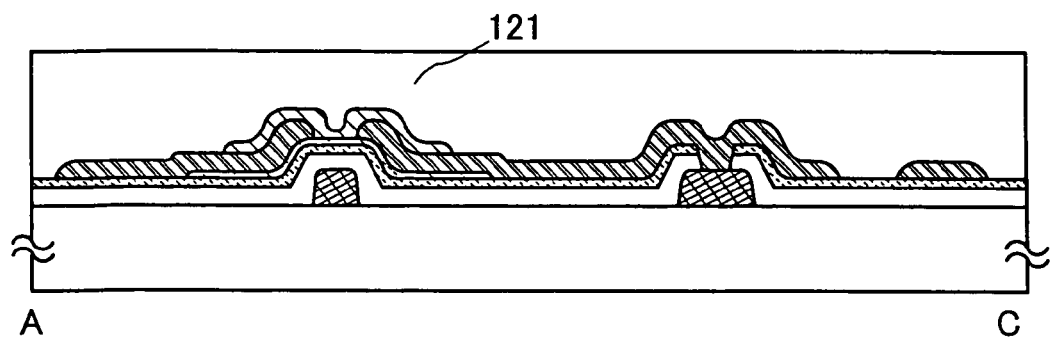
FIGS. 9A and 9B are views describing a method for manufacturing a display device according to the present invention.

Subsequently, an insulating layer (also referred to as a partition wall or a bank) 121 is selectively formed (FIG. 9A). The insulating layer 121 is formed to have an opening over the first insulating layer 117. In this embodiment mode, the insulating layer 121 is formed over the entire surface, and etched and patterned by using a mask of a resist or the like. When the insulating layer 121 is formed by a droplet discharge method or a printing method which can form the insulating layer 121 directly and selectively, patterning by etching is not necessarily required. The insulating layer 121 can also be formed to have a desired shape by pretreatment according to the present invention.

The insulating layer 121 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant polymer such as polyimide, polybenzimidazole; or an organic siloxane-based insulating material in which an organic group such as methyl or phenyl is substituted for hydrogen bound with silicon or an inorganic siloxane-based material, each of which contains the Si—O—Si bond among a compound including silicon, oxygen and hydrogen, which is formed by using a siloxane material as a start material. The insulating layer 121 may be also formed by using a photosensitive material such as acrylic or polyimide, or a non-photosensitive material. The insulating layer 121 preferably has a shape in which a radius curvature changes continuously. Accordingly, the coverage of an electroluminescent layer 122 and a second electrode layer 123 which are formed over the insulating layer 121 is enhanced.

After forming the insulating layer 121 by discharging a compound by a droplet discharge method, the surface of the insulating layer may be pressed with pressure to planarize in order to enhance its planarity. As a pressing method, unevenness may be smoothed by making a roller-shaped object moved over the surface, or the surface may be vertically pressed with a flat plate-shaped object. A heat process may be performed at the time of pressing. Alternatively, unevenness on the surface may be eliminated with an air knife by softening or melting the surface with a solvent or the like. A CMP method may be also used for polishing the surface. This step may be applied for planarizing a surface when unevenness is caused by a droplet discharge method. When the planarity is enhanced through the step, display variations or the like of the display panel can be prevented; therefore, a high-definition image can be displayed.

Figure 9B:
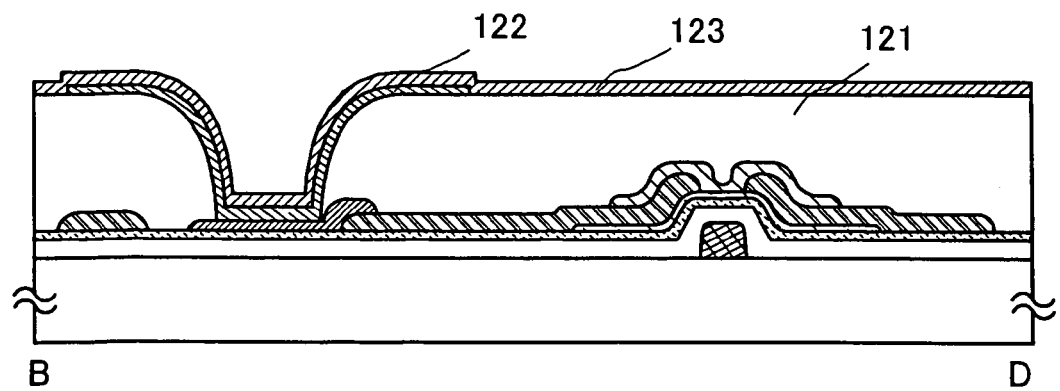

A light emitting element is formed over the substrate 100 having a TFT for a display panel (FIG. 9B).

Before forming the electroluminescent layer 122, moisture in the first electrode layer 117 and the insulating layer 121 or adsorbed each surface is removed by performing heat treatment at a temperature of 200° C. under atmospheric pressure. It is preferable to perform heat treatment at temperatures of from 200° C. to 400° C., preferably from 250° C. to 350° C. under low pressure, and to form the electroluminescent layer 122 without being exposed to atmospheric air by a vacuum evaporation method or a droplet discharge method which is performed under low pressure.

As the electroluminescent layer 122, materials each produces the luminescence of red (R), green (G), and blue (B) is selectively formed by an evaporation method using an evaporation mask or the like for each. The materials (low molecular weight materials, high molecular weight materials, or the like) each produces luminescence of red (R), green (G) and blue (B) can be formed by a droplet discharge method in the same manner as a color filter. This case is preferable since separate coloring of RGB can be carried out even without using a mask. Then, the second electrode layer 123 is formed over the electroluminescent layer 122 to complete a display device having a display function using a light emitting element.

Although it is not shown, it is effective to provide a passivation film so as to cover the second electrode layer 123. A protective film which is provided at the time of forming a display device may have a single layer structure or a layer structure. As the passivation film, a single layer of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) which has more nitrogen content than oxygen content, aluminum oxide, diamond like carbon (DLC) or a nitrogen-containing carbon film ($CN_x$), or a laminated layer in which the insulating films are combined can be used. For example, a laminated layer such as a nitrogen-containing carbon film ($CN_x$) and silicon nitride (SiN) or an organic material can be used, or a laminate of a polymer such as a styrene polymer may be used. Alternatively, a material which has a skeleton formed by the bond of silicon (Si) and oxygen (O), and which includes at least hydrogen as a substituent, or at least one of fluorine, an alkyl group, and aromatic hydrocarbon as a substituent may be also used.

At this time, it is preferable to use a film having good coverage as the passivation film, and a carbon film. Particularly, a DLC film is effective. A DLC film can be formed within the temperatures ranging from room temperature to 100° C. or lower; therefore, a DLC film can be easily formed over an electroluminescent layer having low heat resistance. A DLC film can be formed by a plasma CVD method (typically, RF plasma CVD, microwave CVD, electron cyclotron resonance (ECR) CVD, thermal filament CVD, or the like), a combustion flame method, sputtering, ion beam deposition, laser deposition, or the like. A hydrogen gas and a hydrocarbon-based gas (for example $CH_4$, $C_2H_2$, $C_6H_6$, or the like) are used as a reactive gas which is used for forming the film. The reaction gas is ionized by glow discharge. The ions are accelerated to collide with a cathode applied with negative self bias. A CN film may be formed by using a $C_2H_2$ gas and an $N_2$ gas as the reactive gas. The DLC film has a high blocking effect on oxygen and can suppress the oxidation of the electroluminescent layer. Accordingly, the electroluminescent layer can be prevented from oxidizing during the subsequent sealing step.

Subsequently, a sealant is formed and sealing is performed with a sealing substrate. Then, a flexible wiring substrate may be connected to a gate wiring layer which is formed being electrically connected to the gate electrode layer 103 to electrically connect to the exterior. This is the same for a source wiring layer which is formed being electrically connected to the source/drain electrode layer 111.

Figure 18A:
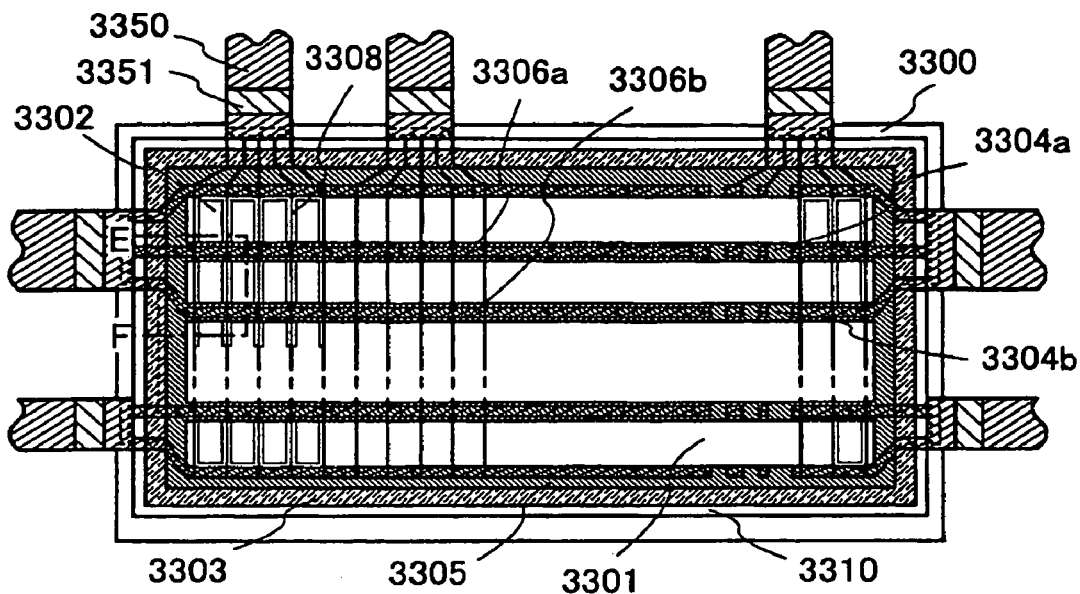
FIGS. 18A and 18B are views describing a display panel according to the present invention.
Figure 18B:
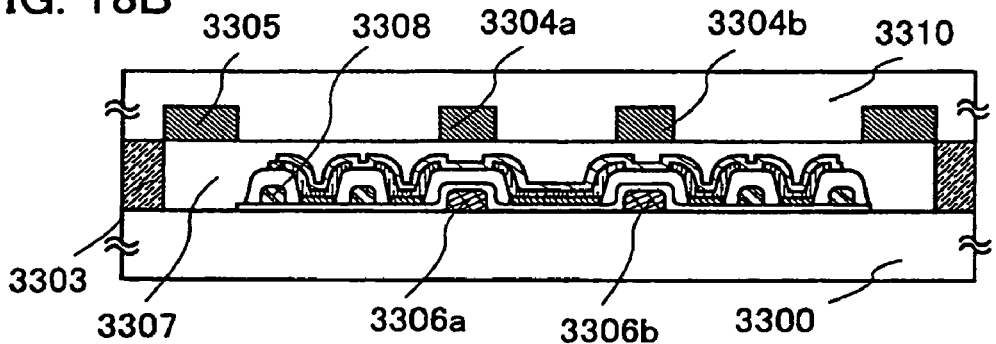

A completion drawing of an EL display panel manufactured according to the present invention is shown in FIGS. 18A and 18B. FIG. 18A shows a top view of the EL display panel and FIG. 18B shows a cross-sectional view taken along line E-F in FIG. 18A. In FIGS. 18A and 18B, a pixel portion 3301 formed over an element substrate 3300 includes a pixel 3302, gate wiring layers 3306a and 3306b, and a source wiring layer 3308, and the element substrate 3300 is fixed with a sealing substrate 3310 by being bonded with a sealant 3303. In this embodiment mode, a driver IC 3351 is provided over an FPC 3350 and mounted by TAB.

As shown in FIGS. 18A and 18B, desiccants 3305, 3304a, and 3304b are provided in a display panel in order to prevent deterioration due to moisture of the element. The desiccant 3305 is formed so as to encircle the circumference of the pixel portion, and the desiccants 3304a and 3304b are formed in a region corresponding to the gate wiring layers 3306a and 3306b. In this embodiment mode, the desiccants are provided in a depression formed in the sealing substrate, which does not prevent an EL display panel from being thinned. A large water absorption area can be obtained since a desiccant is formed also in a region corresponding to a gate wiring layer, thereby enhancing absorption efficiency. Additionally, since the desiccants are formed over the gate wiring layer which does not emit light directly, a light extraction efficiency is not deteriorated. In this embodiment mode, a filler 3307 is filled in the display panel. When a hygroscopic substance such as a desiccant is used as the filler, further absorption effect can be obtained and the element can be prevented from being deteriorated.

In this embodiment mode, the case where a light emitting element is sealed with a glass substrate is shown. Sealing treatment is treatment to protect a light emitting element from moisture. Therefore, any of a method in which a light emitting element is mechanically sealed with a cover material, a method in which a light emitting element is sealed with a thermosetting resin or an ultraviolet curable resin, and a method in which a light emitting element is sealed with a thin film of such as metal oxide, nitride or the like having high barrier capabilities, can be used. As for the cover material, glass, ceramics, plastic, or metal can be used. However, when light is emitted to the cover material side, the cover material needs to have light-transmitting properties. Enclosed space is formed by attaching the cover material to the substrate over which the above-mentioned light emitting element is formed with a sealant such as a thermosetting resin or an ultraviolet curable resin and then by curing the resin with heat treatment or ultraviolet irradiation treatment. It is also effective to provide a hydroscopic absorbent material typified by barium oxide in the enclosed space. The absorbent material may be provided over the sealant or over a partition wall or a peripheral part so as not to block light emitted from a light emitting element. Further, it is also possible to fill the space between the cover material and the substrate over which the light emitting element is formed with a thermosetting resin or an ultraviolet-light-curable resin. In this case, it is effective to add a hydroscopic material typified by barium oxide in the thermosetting resin or the ultraviolet-light-curable resin.

In this embodiment mode, although a single gate structure of a switching TFT is shown, a multi-gate structure such as a double gate structure may be also employed. When a semiconductor is manufactured by using a SAS or a crystalline semiconductor, an impurity region can be formed by adding an impurity which imparts one conductivity type. In this case, a semiconductor layer may have an impurity region having different concentration. For example, the semiconductor layer may have a low concentration impurity region in the periphery of a channel formation region and a region which is laminated with a gate electrode layer, and a high concentration impurity region which is outside thereof.

As described above, in this embodiment mode, photolithography using a photomask is not employed, and thus steps can be omitted. In addition, a display panel can be easily manufactured by directly forming various patterns over the substrate with the use of a droplet discharge method even when a glass substrate which is in and after the fifth generation having 1000 mm or more on a side is used.

According to the present invention, a desired pattern can be formed with good control, and the material loss and the cost can be reduced. Hence, a high-performance and highly reliable display device can be manufactured with high yield.

EMBODIMENT MODE 3

An embodiment mode of the present invention will be described with reference to FIGS. 10A to 10C and FIGS. 11A and 11B. In this embodiment mode, a display device is manufactured by using a top gate type (an inverted staggered type) thin film transistor as a thin film transistor. An example of a liquid crystal display device using a liquid crystal material as a display element is shown. Accordingly, the same part or a part having similar function will not be repeatedly explained. Note that FIGS. 10A to 10C and FIGS. 11A and 11B show cross-sectional views of the display device.

Also in this embodiment mode, light irradiation is carried out through a substrate to modify the irradiated area to change the wettability thereof by utilizing the photo activity of a photocatalyst.

A source/drain electrode layer 330 and a source/drain electrode layer 308 are formed over a light-transmitting substrate 300. The electrode layers are formed by a droplet discharge method in this embodiment mode.

An n-type semiconductor layer is formed over the source/drain electrode layers 330 and 308 and is etched with a mask formed of a resist or the like. The resist may be formed by using a droplet discharge method. A semiconductor layer is formed over the n-type semiconductor layer and patterned by using a mask or the like again. Accordingly, n-type semiconductor layers 307 and 306 are formed. The semiconductor layer 306 is made of silicon which is an inorganic material; however, it can also be formed with an organic semiconductor such as the above pentacene. When an organic semiconductor is selectively formed by a droplet discharge method or the like, the patterning process can be simplified.

Figure 10A:
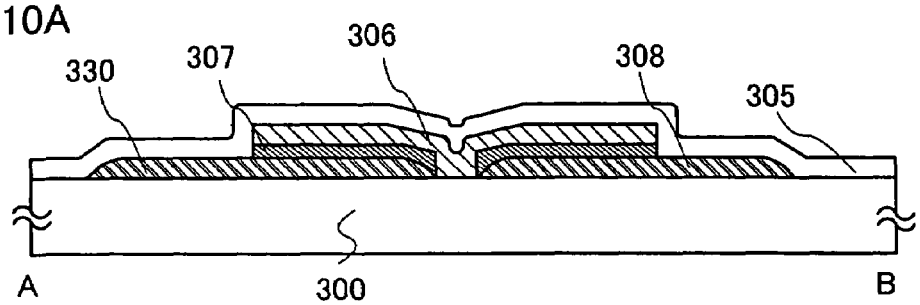
FIGS. 10A to 10C are views describing a method for manufacturing a display device according to the present invention.

Then, a gate insulating layer 305 is formed to be a single layer or a laminate by plasma CVD or sputtering (FIG. 10A). The gate insulating layer 305 may use either an inorganic material or an organic material. As a preferable mode, in particular, a laminate of three layers of an insulating layer 305a including silicon nitride, an insulating layer 305b including silicon oxide, and an insulating layer 305c including silicon nitride is equivalent to the gate insulating layer.

Figure 10B:
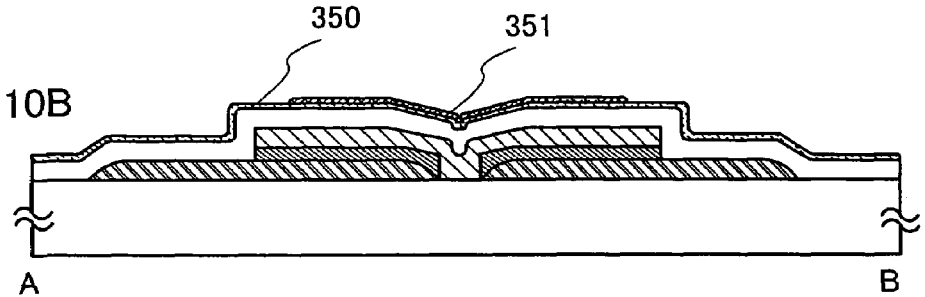

A photocatalyst 350 is formed over a gate insulating layer 305. A low wettability substance 351 is formed in the vicinity of the area of the photocatalyst 350 where the gate electrode layer is to be formed (FIG. 10B).

Next, a mask constituted by a resist or the like is formed over the photocatalyst 350, and the photocatalyst 350 and the gate electrode layer 305 are etched to form an opening 345. In this embodiment, the mask is selectively formed by a droplet discharge method.

Figure 10C:
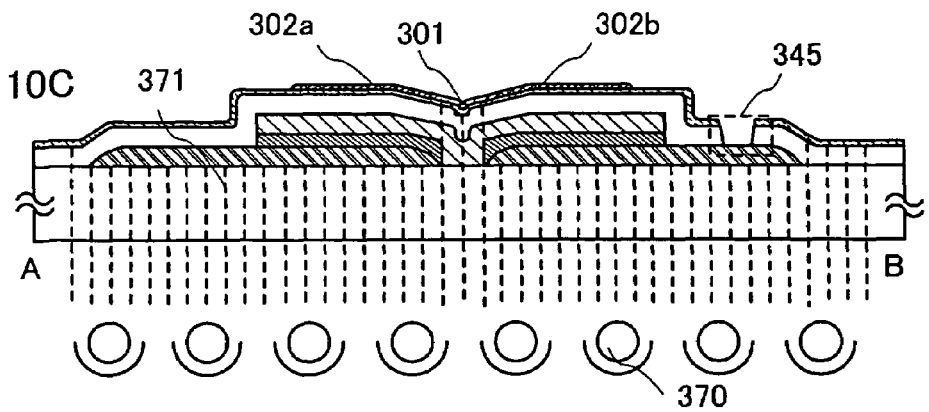

The photocatalyst 350 is irradiated with light 371 from a light source 370 through the light-transmitting substrate 300. The light 371 penetrates the substrate 300, the semiconductor layer 306, and the gate insulating layer 305, and activates the photocatalyst 350, so that the surface of the low wettability substance 351 is modified by the energy thereof. The source/drain electrode layers 330 and 308 are used as masks; thus, a relatively higher wettability region 301, lower wettability regions 302a and 302b are formed on the surface of the low wettability substance 351 (FIG. 10C). The treatment efficiency and the treatment capacity are enhanced with the use of the photocatalyst. If a film is modified by light irradiation using a source/drain electrode layer as a mask as in this embodiment mode, fine patterns having different wettability can even be formed with good control. Further, in combination with a droplet discharge method, material loss can be avoided and the cost can be reduced compared with the case of entire surface coating such as spin coating or the like.

In this embodiment mode, a photocatalyst is formed over the light-transmitting substrate 300, the semiconductor layer 306, and the gate insulating layer 305 and is irradiated with light therethrough, thereby modifying the surface of the substance formed in contact with the photocatalyst. Accordingly, it is important that the light absorption in the light-transmitting substrate 300, the semiconductor layer 306, and the gate insulating layer 305 is suppressed, in order to acquire energy due to photo activity of the photocatalyst, that is required for modifying the surface of the formation region of the gate electrode layer. The energy used for modifying the substance surface varies in accordance with the energy absorbed in the substance transmitting light. Thus, the film thickness and the light intensity may be set appropriately.

Figure 11A:
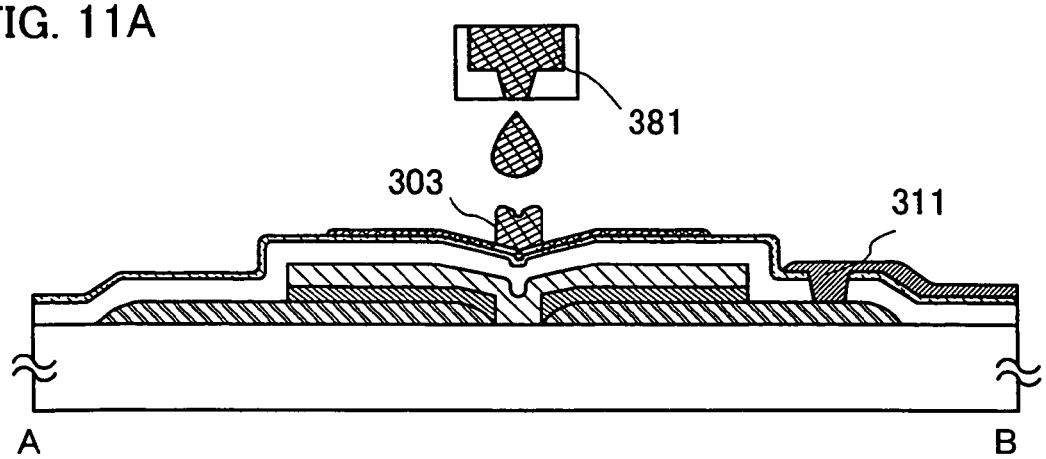
FIGS. 11A and 11B are views describing a method for manufacturing a display device according to the present invention.

A composition containing a conductive material is discharged in the mobile form of droplets from a droplet discharge system 381 as to the high wettability region 301 to form a gate electrode layer 303 (FIG. 11A). The discharged mobile composition containing a conductive material is repelled by the low wettability regions 302a and 302b due to the difference of the wettability of the gate formation region without being fixed thereto. Therefore, the composition is formed in the high wettability region 301, which is more stable, with good control and stability.

The photocatalyst which has been formed for pretreatment after the formation of the electrode layer and the substance which changes the wettability may be left, or an unnecessary portion may be removed after the formation of the pattern. The removal may be carried out by ashing with oxygen, etching, plasma treatment, or the like using the pattern as a mask.

A pixel electrode layer 311 is formed by a droplet discharge method. The pixel electrode layer 311 and the source/drain electrode layer 308 are electrically connected to each other through the opening 345 formed in advance. The same material used for the above-mentioned first electrode layer 117 can be used for the pixel electrode layer 311. When a transmissive liquid crystal display panel is manufactured, a predetermined pattern is formed with a composition including indium tin oxide (ITO), indium tin oxide containing silicon oxide (ITSO), zinc oxide (ZnO), tin oxide ($SnO_2$) or the like, and the pattern is baked to form the pixel electrode layer 311.

An insulating layer 312 called an alignment film is formed by a printing method or spin coating so as to cover the pixel electrode layer 311. The insulating layer 312 can be selectively formed with the use of a screen printing method or an offset printing method. Then, rubbing is performed. A sealant is formed in at the peripherally of the region where a pixel is formed by a droplet discharge method (not shown).

Figure 11B:
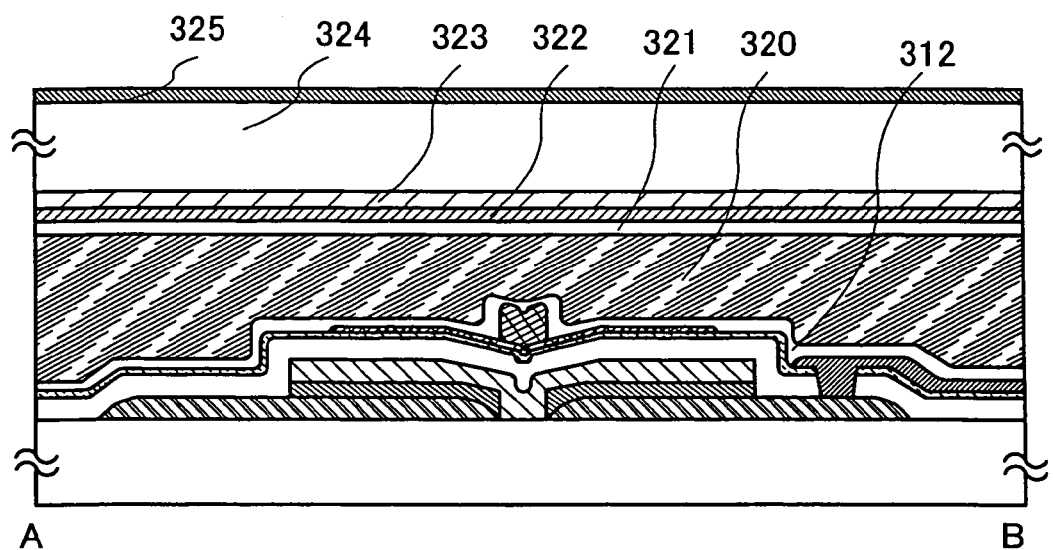

Subsequently, a liquid crystal display panel can be manufactured by attaching a counter substrate 324 provided with an insulating layer 321 functioning as an alignment film, a coloring layer 322 functions as a color filter, a conductive layer 323 functioning as a counter electrode, and the counter substrate 324 provided with a polarizing plate 325 to the TFT substrate 300 with a spacer therebetween, and by providing the space with a liquid crystal layer 320 (see FIG. 11B). A sealant may be mixed with a filler, and further, the counter substrate 324 may be provided with a shielding film (a black matrix), or the like. Note that a dispenser type (a dropping type) or a dip type (a pumping type) by which a liquid crystal is injected utilizing capillary phenomenon after attaching the counter substrate 324 can be used as a method for forming the liquid crystal layer.

Figure 29:
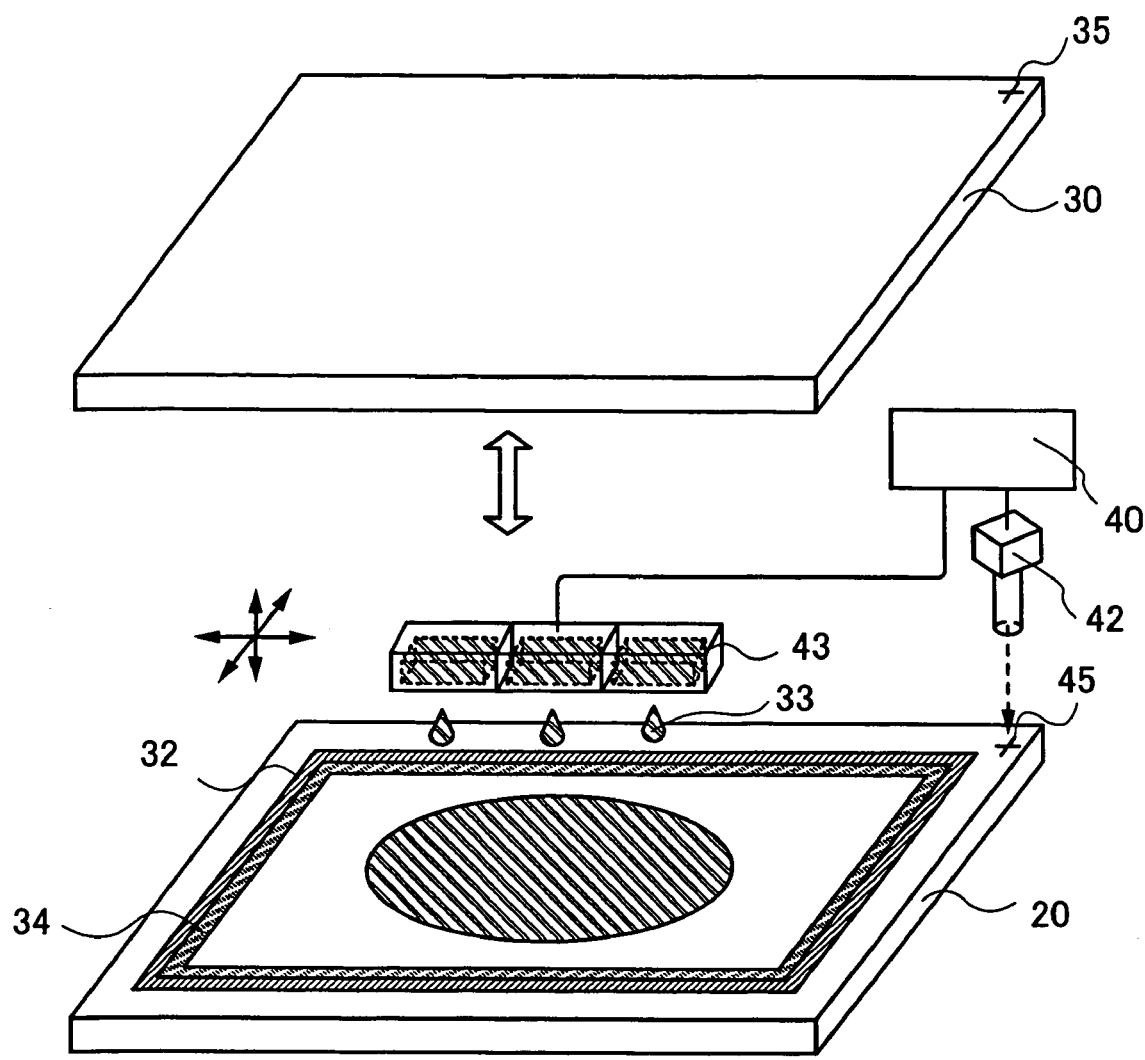
FIG. 29 is a figure describing a droplet discharge injection method which is applicable to the present invention.

A liquid crystal drop injection method employing a dispenser type will be described with reference to FIG. 29. A liquid crystal drop injection method shown in FIG. 29 includes a control device 40, an imaging means 42, a head 43, a liquid crystal 33, markers 35 and 45, a barrier layer 34, a sealant 32, a TFT substrate 30, and a counter substrate 20. A closed loop is formed with the sealant 32, and the liquid crystal 33 is dropped once or plural times therein from the head 43. When the liquid crystal material is highly adhesive, the liquid crystal material is continuously discharged and attached to a liquid crystal formation region with being interconnected. On the other hand, when the liquid crystal material is low adhesive, the liquid crystal material is intermittently discharged and a droplet is dropped as in FIG. 29. At this time, the barrier layer 34 is provided to prevent the sealant 32 and the liquid crystal 33 from reacting with each other.

Subsequently, the substrates are attached in vacuum, and then, ultraviolet curing is performed to make the space filled with the liquid crystal.

A connection portion is formed to connect the pixel portion formed through the above steps and an external wiring substrate. The insulating layer in the connection portion is removed by ashing treatment using an oxygen gas under the atmospheric pressure or pressure in proximity of the atmospheric pressure. This treatment is performed by using an oxygen gas and one or more gases of hydrogen, $CF_4$, $NF_3$, $H_2O$, and $CHF_3$. In this step, ashing treatment is performed after sealing by using the counter substrate to prevent damage or destruction due to static, however, ashing treatment may be performed at any timing when there are few effects of static.

A connection wiring substrate is provided so as to electrically connect a wiring layer with an anisotropic conductive layer interposed therebetween. The wiring substrate has a function of transmitting a signal or electric potential from the external. Through the above-mentioned steps, a liquid crystal display panel including a display function can be manufactured.

In this embodiment mode, a switching TFT having a single gate structure is described, however, a multi gate structure such as a double gate structure may be employed. When a semiconductor layer is manufactured with the use of a SAS or crystalline semiconductor, an impurity region can be formed by adding an impurity which provides one conductivity type. In this case, the semiconductor layer may have impurity regions having different concentrations. For example, the periphery of a channel region of a semiconductor layer, which forms a laminate with a gate electrode layer and may be a low concentration impurity region, and the outer region thereof may be a high concentration impurity region.

As described above, the steps can be reduced in this embodiment mode by not applying a light exposure step using a photomask. In addition, a display panel can be easily manufactured by directly forming various patterns over a substrate with a droplet discharge method even when a glass substrate in and after the fifth generation having 1000 mm or more on a side is used.

According to the present invention, a desired pattern can be formed with good control, and the material loss and the cost can be reduced. Hence, a high-performance and highly reliable display device can be manufactured with high yield.

EMBODIMENT MODE 4

A thin film transistor can be formed by applying the present invention, and a display device can be formed with the use of the thin film transistor. In addition, when a light emitting element is used and an n-type transistor is used as a transistor which drives the light emitting element, light emitted from the light emitting element performs any of bottom emission, top emission, and dual emission. Here, a laminated structure of a light emitting element of each emission will be described with reference to FIGS. 12A to 12C.

Further, in this embodiment mode, channel protective thin film transistors 471 (FIG. 12C) and 481 (FIG. 12A), and a channel etch thin film transistor 461 (FIG. 12B) according to the present invention are used. The thin film transistor 481 is provided over a light-transmitting substrate 480 and constituted by a gate electrode layer 493, a gate insulating layer 497, a semiconductor layer 494, an n-type semiconductor layer 495, a source/drain electrode layer 487, and a channel protective layer 496. In this embodiment mode, a silicon film having an amorphous structure is used as the semiconductor layer, and an n-type semiconductor layer is used as a semiconductor layer of one conductivity type. Instead of forming an n-type semiconductor layer, a semiconductor may be given conductivity by plasma treatment using a $PH_3$ gas. The semiconductor layer is not limited to the mode of this embodiment mode, and a crystalline semiconductor layer may be used as in Embodiment Mode 2. In the case of using a crystalline semiconductor layer of polysilicon or the like, an impurity region having one conductivity type may be formed by doping (adding) impurities into the crystalline semiconductor layer without forming the one conductivity type semiconductor layer. Further, an organic semiconductor of such as pentacene can be formed. For example, when an organic semiconductor is selectively formed by a droplet discharge method, the patterning process can be simplified.

A photocatalyst 499 and a low wettability substance 490 are formed over the channel protective layer 496 and the n-type semiconductor layer 495. In this embodiment mode, the photocatalyst 499 is irradiated with light from the light-transmitting substrate side without being blocked by the gate electrode layer 493, thereby activating the photocatalyst 499 and modifying a surface of the low wettability substance 490. Light with a wavelength by which the photocatalyst is activated is applied as the light. The modification capacity by light irradiation is enhanced by the energy due to the activation of the photocatalyst. The range of options for the wavelength of light to be applied is increased by selecting an appropriate photocatalyst; thus, light with wavelength that is not absorbed by the light-transmitting substrate can be applied.

In this embodiment mode, a surface of the low wettability substance 490 that is less wettable with a composition containing a conductive material, except where the gate electrode layer 493 is overlapped with the channel protective film 496 to be a mask, is modified to be more wettable by means of light irradiation. Consequently, high wettability regions 492a and 492b that are relatively more wettable, and a low wettability region 491 that is relatively less wettable is formed over a surface of the low wettability substance 490. The composition containing a conductive material does not fix to the low wettability region 491 on the surface of the channel protective layer since it is less wettable than the high wettability regions 492a and n 492b on the surface of the n-type semiconductor on the periphery of the low wettability region 491. Consequently, the source/drain electrode layer 487 is formed over the high wettability regions 492a and 492b, which are more wettable, with good control. Since the low wettability substance used in this embodiment mode is FAS that is thin as a molecular level, the n-type semiconductor layer and the electrode layers are not insulated. The low wettability substance can be made conductive or insulative by selecting the material and/or the thickness in according with the structure to be used.

Figure 12A:
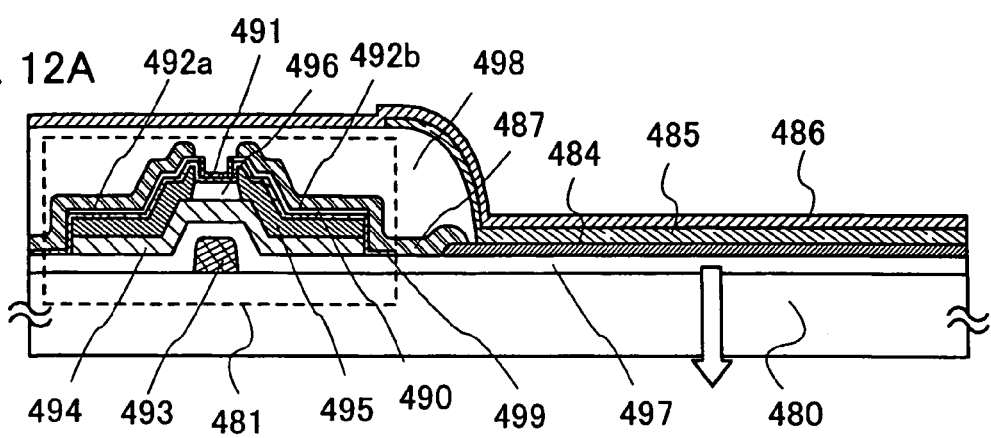
FIGS. 12A to 12C are cross-sectional views of a display device according to the present invention.

As to the thin film transistor 481, a substance that is less wettable with the composition containing a conductive material is formed over the channel protective layer. When the substance has low wettability also with an insulating layer 498 formed to cover the thin film transistor 481, formation defects such as that the adhesion of the insulating layer 498 is reduced would be caused. Therefore, it is preferable to remove the low wettability substance or to modify the substance to improve the wettability by light irradiation. Such treatment is not necessarily carried out in the case where the insulating layer is formed by vapor deposition, CVD, sputtering, or the like. The insulating layer covering the thin film transistor 481 shown in FIG. 12A is formed by vapor deposition, which is an example where the low wettability substance over the channel protective layer is not modified. FIG. 12C shows an example in which the low wettability region 491 is irradiated with light to improve the wettability before forming the insulating layer 478 since the insulating layer 478 covering the thin film transistor 471 is formed by the droplet discharge method.

A channel protective layer 496 may be formed by a droplet discharge method using polyimide, polyvinyl alcohol or the like. As a result, a photolithography step can be omitted. The channel protective layer may be formed from one or more of an inorganic material (silicon oxide, silicon nitride, silicon oxynitride, silicon nitride oxide or the like), a photosensitive or non-photosensitive organic material (an organic resin material) (polyimide, acrylic, polyamide, polyimide amide, a resist, benzocyclobutene or the like), a Low k material which has a low dielectric constant, and the like; a laminate of such films; or the like. Additionally, a material which has a skeleton formed by the bond of silicon (Si) and oxygen (O), and which includes at least hydrogen as a substituent, or at least one of fluoride, an alkyl group, and aromatic hydrocarbon as a substituent, may be used. As a manufacturing method, a vapor phase growth method such as plasma CVD or thermal CVD, or sputtering can be used. A droplet discharge method or a printing method (a method for forming a pattern, such as screen printing or offset printing) can also be used. A TOF film or an SOG film obtained by an application method can also be used.

First, the case where light is emitted to a light-transmitting substrate 480 side, in other words, bottom emission is performed, will be described with reference to FIG. 12A. In this case, a first electrode 484, an electroluminescent layer 485, and a second electrode 486 are sequentially stacked in contact with a source/drain electrode layer 487 so as to be electrically connected to the thin film transistor 481. Next, the case where light is emitted to the side opposite to the light-transmitting substrate 460, in other words, top emission is performed, will be described with reference to FIG. 12B. The thin film transistor 461 can be formed in a similar manner to the above described thin film transistor except that it does not have a channel protective layer and parts of the n-type semiconductor layer, the light-transmitting substance, and the semiconductor layer are removed by etching using the source/drain electrode layer as a mask. Thus, with respect to the channel etch type thin film transistor 461, parts of the photocatalyst and the low wettability substance used for controllable pattern formation are removed. As to the channel protective thin film transistor 481, in this embodiment mode, the photocatalyst and the low wettability substance over the channel protective layer are not removed; however, they may be removed even in the case of the channel protective type. In addition, only the low wettability substance may be removed.

A source/drain electrode layer 462 that is electrically connected to the thin film transistor 461, a first electrode layer 463, an electroluminescent layer 464, a second electrode layer 465 are stacked in order. With the above structure, even if the first electrode layer 463 transmits light, the light is reflected by the source/drain electrode layer 462, and the light is emitted to the side opposite to the light-transmitting substrate 460. In this structure, the first electrode layer 463 is not required to use a light-transmitting material. Finally, the case where light is emitted from both the light-transmitting substrate side and the opposite side thereto, that is the case where dual emission is carried out, will be described with reference to FIG. 12C. The thin film transistor 471 is a channel protective thin film transistor the same as the thin film transistor 481. So, it can be formed like the thin film transistor 481. A source/drain electrode layer 477 that is electrically connected to the thin film transistor 471, a first electrode layer 472, an electroluminescent layer 473, a second electrode layer 474 are stacked in order. In this occasion, when both the electrode layer 472 and the second electrode layer 474 are formed from materials that transmit light or formed thin enough to transmit light, dual emission is realized.

Modes of a light emitting element which can be used in this embodiment mode is shown in FIGS. 30A to 30D. The light emitting element has a structure in which an electroluminescent layer 860 is interposed between a first electrode layer 870 and a second electrode layer 850. The materials of the first electrode layer and the second electrode layer are required to be selected considering the work functions. The first electrode layer and the second electrode layer can be either an anode or a cathode depending on the pixel structure. In this embodiment mode, a driving TFT has n-channel conductivity, so that it is preferable that the first electrode layer serves as a cathode and the second electrode layer serves as an anode. In the case where the driving TFT has p-channel conductivity, the first electrode layer may be used as an anode and the second electrode layer may be used as a cathode.

Figure 30A:
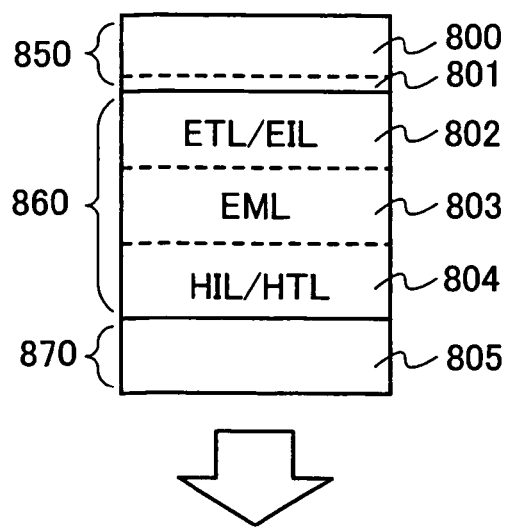
FIGS. 30A to 30D show structures of light emitting elements which can be applied to the present invention.
Figure 30B:
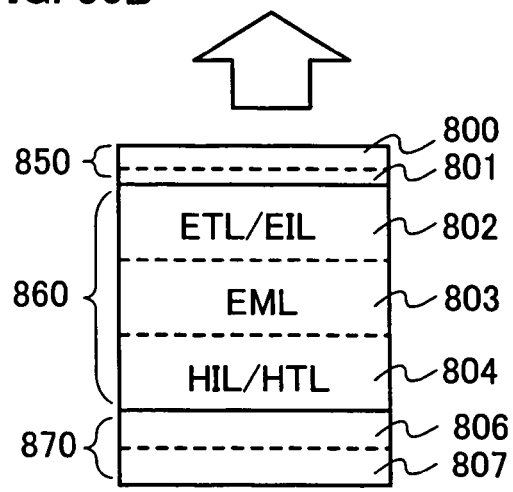

FIGS. 30A and 30B show the case where the first electrode layer 870 is an anode and the second electrode layer 850 is a cathode. The electroluminescent layer 860 preferably has a structure in which an HIL (hole injection layer), HTL (hole transport layer) 804, EML (light emitting layer) 803, ETL (electron transport layer), EIL (electron injection layer) 802, and a second electrode layer 850 are stacked in order from the first electrode layer 870 side. FIG. 30A shows a structure in which light is emitted from the first electrode layer 780 side which is constituted by an electrode layer having a light-transmitting conductive oxide material, and the second electrode layer has a structure in which an electrode layer 801 containing an alkali metal or an alkaline earth metal such as LiF or MgAg and an electrode layer 800 made of a metal material such as aluminum are stacked in order from the light emitting layer 860 side. FIG. 30B shows a structure in which the first electrode layer is constituted by an electrode layer 807 made of a metal such as aluminum or titanium, or a metal material containing such metal and nitrogen of concentration in stoichiometric proportion or less, and the second electrode layer 806 made of a conductive oxide material containing silicon oxide in a concentration of 1 to 15 atomic %. The second electrode layer is constituted by an electrode layer 801 containing an alkali metal or an alkaline earth metal such as LiF or MgAg and an electrode layer 800 made of a metal material such as aluminum from the electroluminescent layer 860 side; each layer is formed to a thickness of 100 nm or less; thus, the light can be emitted from the second electrode layer 850.

Figure 30C:
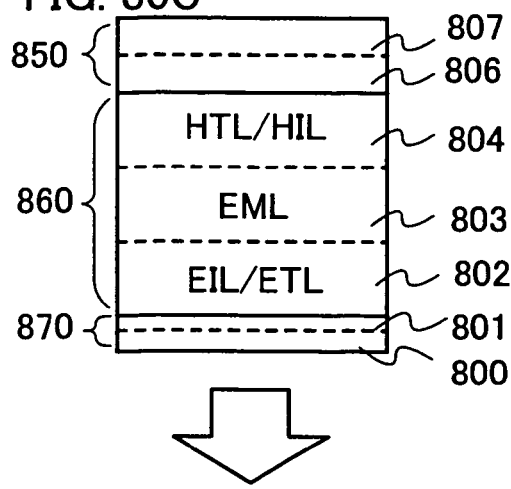
Figure 30D:
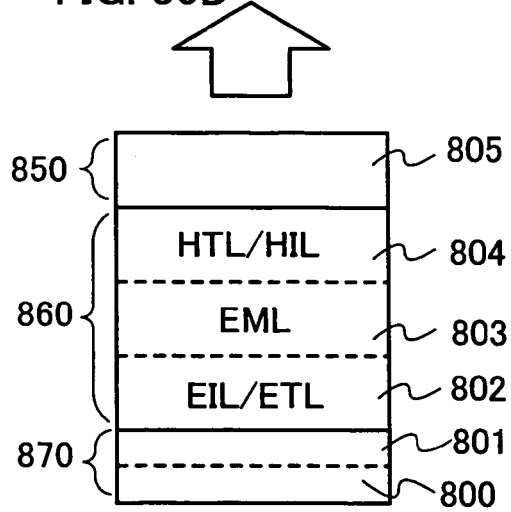

FIGS. 30C and 30D show the case where the first electrode layer 870 is a cathode and the second electrode layer 850 is an anode. The electroluminescent layer 860 preferably has a structure in which an EIL (electron injection layer) and an ETL (electron transport layer) 802, an EML (light emitting layer) 803, an HTL (hole transport layer) and HIL (hole injection layer) 804, and the second electrode layer 850 which is an anode are stacked in order from the cathode side. FIG. 30C shows a structure in which light is emitted from the first electrode layer 870. The first electrode layer 870 is constituted by an electrode layer 801 containing an alkali metal or an alkaline earth metal such as LiF or MgAg and an electrode layer 800 made of a metal material such as aluminum from the electroluminescent layer 860 side; each layer is formed to a thickness of 100 nm or less to transmit light; thus, the light can be emitted through the first electrode layer 870. The second electrode layer is constituted by the second electrode layer 806 made of a conductive oxide material containing silicon oxide in a concentration of 1 to 15 atomic % and an electrode layer 807 made of a metal such as aluminum or titanium, or a metal material containing such metal and nitrogen of concentration in stoichiometric proportion or less, from the electroluminescent layer 860 side. FIG. 30D shows a structure in which light is emitted from the second electrode layer 850. The first electrode layer 870 is constituted by an electrode layer 801 containing an alkali metal or an alkaline earth metal such as LiF or MgAg and an electrode layer 800 made of a metal material such as aluminum from the electroluminescent layer 860 side; the first electrode layer 870 is formed thick enough to reflect the light produced in the electroluminescent layer 860. The second electrode layer 850 is constituted by an electrode layer 805 made of a light-transmitting conductive oxide material. The electroluminescent layer may have a single layer structure or a mixed structure other than a layered structure.

As the electroluminescent layer, materials each displays luminescence of red (R), green (G), and blue (B) are selectively formed by an evaporation method using an evaporation mask or the like for each. The materials (low molecular weight materials or high molecular weight materials or the like) each displays luminescence of red (R), green (G), and blue (B) can be formed by a droplet discharge method in the same manner as a color filter. This case is preferable since RGB can be separately colored without using a mask.

In the case of the above top emission type, when ITSO or ITSO having light-transmitting properties are used for the second electrode layer, BzOS—Li in which Li is added to benzoxazole derivatives (BzOS) or the like can be used. $Alq_3$ doped with a dopant corresponding to respective luminescent colors of R, G, and B (DCM or the like for R, and DMQD or the like for G) may be used for the EML, for example.

Note that the electroluminescent layer is not limited to the above-mentioned material. For example, hole injection properties can be enhanced by co-evaporating an oxide such as molybdenum oxide ($MoO_x$: X=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer. A material forming a light emitting element will be described below in detail.

As a substance having high electron transport properties among charge injection transport materials, for example, a metal complex having a quinoline skeleton or a benzoquinoline skeleton such as tris(8-quinolinolato)aluminum ($Alq_3$), tris(5-methyl-8-quinolinolato)aluminum ($Almq_3$), bis(10-hydroxybenzo[h]-quinolinato)beryllium ($BeBq_2$), bis(2-methyl-8-quinolinolato)-4-phenylphenolato-aluminum (BAlq), and the like can be given. As a substance having high hole transport properties, for example, an aromatic amine compound (in other words, a compound having the bond of benzene ring-nitrogen) such as 4,4'-bis[N-(1-naphthyl)-N-phenyl-amino]-biphenyl (α-NPD), 4,4'-bis[N-(3-methylphenyl)-N-phenyl-amino]-biphenyl (TPD), 4,4',4"-tris(N,N-diphenyl-amino)-triphenylamine (TDATA), or 4,4',4"-tris[N-(3-methylphenyl)-N-phenyl-amino]-triphenylamine (MTDATA) can be used.

As a substance having high electron injection properties among charge injection transport materials, a compound of an alkali metal or an alkaline earth metal such as lithium fluoride (LiF), cesium fluoride (CsF), or calcium fluoride ($CaF_2$) can be given. In addition to this, it may be a compound of a substance having high electron transport properties such as $Alq_3$ and an alkaline earth metal such as magnesium (Mg).

As a substance having high hole injection properties among charge injection transport materials, for example, metal oxide such as molybdenum oxide ($MoO_x$), vanadium oxide ($VO_x$), a ruthenium oxide ($RuO_x$), tungsten oxide ($WO_x$), manganese oxide (MnOx) are given. In addition, a phthalocyanine compound such as phthalocyanine ($H_2Pc$) or copper phthalocyanine (CuPC) can be given.

The light emitting layer may have a structure to perform color display by providing each pixel with light emitting layers having different emission wavelength ranges. Typically, a light emitting layer corresponding to color of R (red), G (green), and B (blue) is formed. On this occasion, color purity can be improved and a pixel portion can be prevented from having a mirror surface (reflection) by providing the light emitting side of the pixel with a filter which transmits light of an emission wavelength range. By providing a filter, a circularly polarizing plate or the like that is conventionally required can be omitted, and further, the loss of light emitted from the light emitting layer can be eliminated. Further, change in hue, which occurs when a pixel portion (display screen) is obliquely seen, can be reduced.

Various materials can be used for a light emitting material. As a low molecular weight organic light emitting material, 4-dicyanomethylene-2-methyl-6-[2-(1,1,7,7-tetramethylju-lolidyl-9-ethenyl]-4H-pyran; (DCJT); 4-dicyanomethylene-2-t-butyl-6-(1,1,7,7-tetramethyljulolidine-9-ethenyl)]-4H-pyran (DPA); periflanthene; 2,5-dicyano-1,4-bis[2-(10-methoxy-1,1,7,7-tetramethyljulolidine-9-yl)ethenyl]benzene; N,N'-dimethylquinacridon (DMQd); coumarin 6; coumarin 545T; tris(8-quinolinolato)aluminum ($Alq_3$); 9,9'-bianthryl; 9,10-diphenylanthracene (DPA); 9,10-bis(2-naph-thyl)anthracene (DNA); and the like can be used. Another substance can also be used.

On the other hand, a high molecular weight organic light emitting material is physically stronger than a low molecular weight material and is superior in durability of the element. In addition, a high molecular weight organic light emitting material can be formed by application, and therefore, the element can be relatively easily manufactured. The structure of a light emitting element using a high molecular weight organic light emitting material has basically the same structure as in the case of using a low molecular weight organic light emitting material, that is, a cathode, an organic light emitting layer, and an anode are stacked in order. However, a two-layer structure is employed in many cases when a light emitting layer using a high molecular weight organic light emitting material is formed. This is because it is difficult to form such a layered structure as in the case of using a low molecular weight organic light emitting material. Specifically, the light emitting element using a high molecular weight organic light emitting material has a structure of a cathode, a light emitting layer, a hole transport layer, and an anode in order.

The emission color is determined depending on a material forming a light emitting layer; therefore, a light emitting element which displays desired luminescence can be formed by selecting an appropriate material for the light emitting layer. As a high molecular weight electroluminescent material which can be used for forming a light emitting layer, a polyparaphenylene-vinylene-based material, a polyparaphe-nylene-based material, a polythiophene-based material, or a polyfluorene-based material can be used.

As the polyparaphenylene vinylene-based material, a derivative of poly(paraphenylenevinylene) [PPV], for example, poly(2,5-dialkoxy-1,4-phenylenevinylene) [RO-PPV]; poly(2-(2'-ethyl-hexoxy)-5-methoxy-1,4-phenyle-nevinylene) [MEH-PPV]; poly(2-(dialkoxyphenyl)-1,4-phe-nylenevinylene) [ROPh-PPV]; and the like can be given. As the polyparaphenylene-based material, a derivative of poly-paraphenylene [PPP], for example, poly(2,5-dialkoxy-1,4-phenylene) [RO-PPP]; poly(2,5-dihexoxy-1,4-phenylene); and the like can be given. As the polythiophene-based msterial, a derivative of a derivative of polythiophene [PT], for example, poly(3-alkylthiophene) [PAT]; poly(3-hexylth-iophen) [PHT]; poly(3-cyclohexylthiophen) [PCHT]; poly (3-cyclohexyl-4-methylthiophene) [PCHMT]; poly(3,4-di-cyclohexylthiophene) [PDCHT]; poly[3-(4-octylphenyl)-thiophene] [POPT]; poly[3-(4-octylphenyl)-2,2 bithiophene] [PTOPT]; and the like can be given. As the polyfluorene-based material, a derivative of polyfluorene [PF], for example, poly(9,9-dialkylfluorene) [PDAF]; poly(9,9-dio-ctylfluorene) [PDOF]; and the like can be given.

When a high molecular weight organic light emitting material having hole transport properties is interposed between an anode and a high molecular weight organic light emitting material having light emitting properties, hole injection properties from the anode can be enhanced. Generally, the high molecular weight organic light emitting material having hole transport properties which is dissolved in water along with an acceptor material is applied by spin coating or the like. In addition, the high molecular weight light emitting material having hole injection properties is insoluble in an organic solvent; therefore, it can be formed over the above-mentioned high molecular weight organic light emitting material having light emitting properties. As the high molecular weight organic light emitting material having hole transportablity, a mixture of PEDOT and camphor-10-sulfonic acid (CSA) that serves as an acceptor material, a mixture of polyaniline [PANI] and polystyrene sulfonic acid [PSS] that serves as an acceptor material, or the like can be used.

The light emitting layer can be made to emit single color or white light. When a white light emitting material is used, color display can be made possible by applying a structure in which a filter (a coloring layer) which transmits light having a specific wavelength on the light emitting side of a pixel is provided.

In order to form a light emitting layer that emits white light, for example, $Alq_3$, $Alq_3$ partly doped with Nile red that is a red light emitting pigment, p-EtTAZ, TPD (aromatic diamine) are laminated sequentially by a vapor deposition method to obtain white light. In the case that the light emitting layer is formed by an application method using spin coating, the layer formed by spin coating is preferably baked by vacuum heating. For example, an aqueous solution of poly(ethylene diox-ythiophene)/poly(styrene sulfonic acid) solution (PEDOT/PSS) may be entirely applied and baked to form a film that functions as a hole injection layer. Then, a polyvinyl carba-zole (PVK) solution doped with a luminescent center pigment (1,1,4,4-tetraphenyl-1,3-butadiene (TPB); 4-dicyanomethyl-ene-2-methyl-6-(p-dimethylamino-styryl)-4H-pyran (DCM1); Nile red; coumarin 6; or the like) may be entirely applied and baked to form a film that functions as a light emitting layer.

The light emitting layer may be formed to be a single layer. For example, a 1,3,4-oxadiazole derivative (PBD) having electron transport properties may be dispersed in polyvinyl carbazole (PVK) having hole transporatbility. Further, white light emission can be obtained by dispersing PBD of 30 wt % as an electron transporting agent and dispersing an appropriate amount of four kinds of pigments (TPB, coumarin 6, DCM1, and Nile red). In addition to the light emitting element from which white light emission can be obtained as shown here, a light emitting element which can provide red light emission, green light emission, or blue light emission can be manufactured by appropriately selecting materials of the light emitting layer.

When a high molecular weight organic light emitting material having hole transport properties is formed by being interposed between an anode and a high molecular weight organic light emitting material having light emitting properties, hole injection properties from the anode can be enhanced. Generally, the high molecular weight light emitting material having hole transport properties which is dissolved in water along with an acceptor material is applied by spin coating or the like. In addition, the a high molecular weight light emitting material having hole transport properties is insoluble in an organic solvent; therefore, it can be laminated over the above-mentioned organic light emitting material having light emitting properties. As the high molecular weight organic light emitting material having hole transport properties, a mixture of PEDOT and camphor-10-sulfonic acid (CSA) that functions as an acceptor material, a mixture of polyaniline [PANI] and polystyrene sulfonic acid [PSS] that functions as an acceptor material, and the like can be given.

Further, a triplet light emitting material containing a metal complex or the like as well as a singlet light emitting material may be used for the light emitting layer. For example, among pixels emitting red, green, and blue light, a pixel emitting red light whose luminance is reduced by half in a relatively short time is formed of a triplet light emitting material and the rest are formed of a singlet let light emitting material. A triplet light emitting material has a feature that the material has a good luminous efficiency and consumes less power to obtain the same luminance. When a triplet light emitting material is used for a red pixel, only small amount of current needs to be supplied to a light emitting element. Thus, reliability can be improved. A pixel emitting red light and a pixel emitting green light may be formed of a triplet light emitting material and a pixel emitting blue light may be formed of a singlet light emitting material to achieve low power consumption. Low power consumption can be further achieved by forming a light emitting element which emits green light that has high visibility with a triplet light emitting material.

A metal complex used as a dopant is an example of a triplet light emitting material, and a metal complex having platinum that is a third transition series element as a central metal, a metal complex having iridium as a central metal, and the like are known. A triplet light emitting material is not limited to the compounds. A compound having the above described structure and an element belonging to any of the Groups 8 to 10 of the periodic table as a central metal can also be used.

The above described materials for forming the light emitting layer are just examples. A light emitting element can be formed by appropriately stacking functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for the purpose or providing a dispersed light emitting material is acceptable as long as it does not deviate from the scope of the present invention.

A light emitting element formed with the above described materials emits light by being forward biased. A pixel of a display device formed with a light emitting element can be driven by a simple matrix mode or an active matrix mode. In any event, each pixel emits light by applying a forward bias thereto at a specific timing; however, the pixel is in a non-light-emitting state for a certain period. Reliability of a light emitting element can be improved by applying a reverse bias at the non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating current driving where bias is applied forward and reversely. Thus, reliability of a light emitting device can be improved. Additionally, both of digital driving and analog driving can be applied.

Figure 12B:
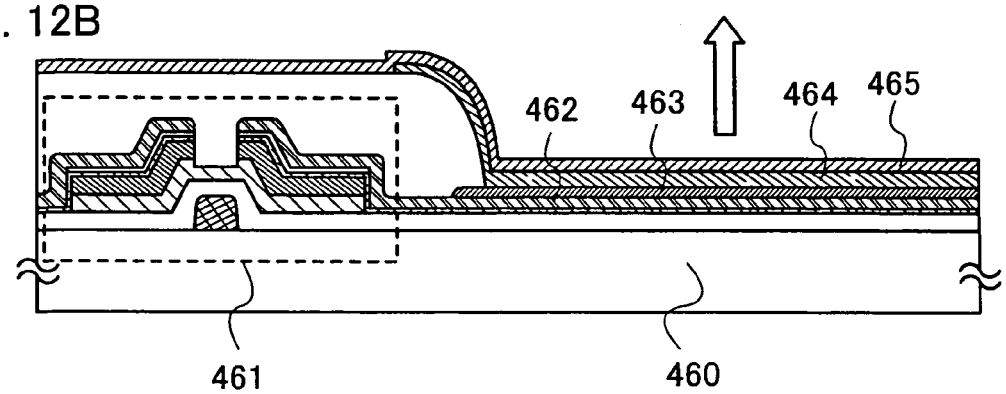
Figure 12C:
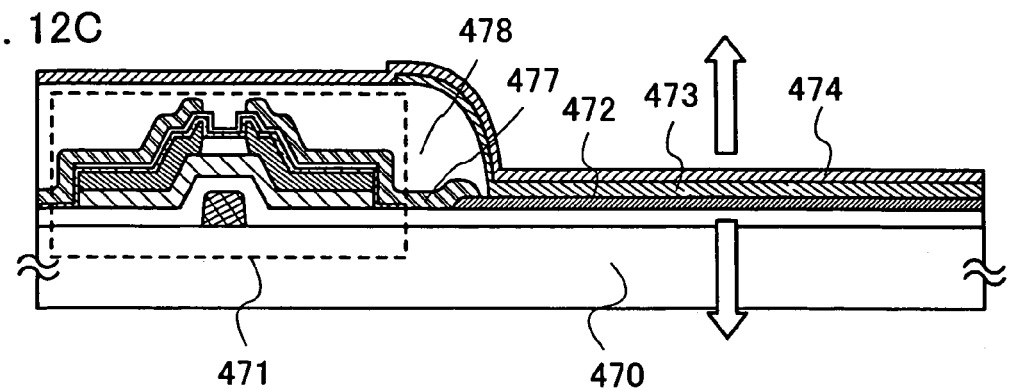

A color filter (coloring layer) may be formed over the light-transmitting substrate 480 and sealing substrates formed over the substrates 460 and 470 although it is not shown in FIGS. 12A to 12C. The color filter (coloring layer) can be formed by a droplet discharge method, and in this case, light irradiation treatment or the like can be applied as the above-mentioned base pretreatment. According to the present invention, a color filter (coloring layer) can be formed to have a desired pattern with good control. With the use of a color filter (coloring layer), high-definition display can also be performed. This is because a broad peak can be modified to be sharp in light emission spectrum of each RGB.

As described above, the case of forming a material displaying luminescence of R, G, and B is shown, however, full color display can be performed by forming a material displaying a single color and combining a color filter and a color conversion layer. The color filter (coloring layer) or the color conversion layer is formed over, for example, a second substrate (a sealing substrate) and may be attached to a substrate. As described above, any of the material indicating a plain color, the color filter (coloring layer), and the color conversion layer can be formed by a droplet discharge method.

Naturally, display may be performed in monochrome. For example, a display device having an area color type may be manufactured by using single color emission. The area color type is suitable for a passive matrix type display area, and a characters and symbols can be mainly displayed.

In the above-mentioned structure, it is possible to use a low work function material as a cathode, for example, Ca, Al, CaF, MgAg, AlLi, or the like is desirable. Any of a single layer type, a layered type, a mixed type having no interface between layers can be used for the electroluminescent layer. The electroluminescent layer may be formed by a singlet material, a triplet material, or a mixture of the materials; or a charge injection transport material and a light emitting material including an organic compound or an inorganic compound, which includes one layer or plural layers of a low molecular weight organic compound material, a middle molecular weight organic compound (which means an organic compound having no sublimation properties, and the number of molecules is 20 or less or the length of liked molecules is 10 μm or less), and a high molecular weight organic compound, which are defined by the number of molecules, and may be combined with an electron injection transport inorganic compound or a hole injection transport inorganic compound. The first electrode layer 484 (FIG. 12A), the first electrode layer 463 (FIG. 12B), and the first electrode layer 472 (FIG. 12C) are formed by using a transparent conductive film which transmits light, and for example, a transparent conductive film in which zinc oxide (ZnO) of 2% to 20% is mixed in indium oxide is used in addition to ITO or ITSO. Plasma treatment or heat treatment in vacuum atmosphere may be preferably performed before forming the first electrode 484, the first electrode 463, and the first electrode 472. The partition wall (also referred to as a bank) is formed by using a material containing silicon, an organic material or a compound material. Additionally, a porous film may be used. However, when a photosensitive material or a non-photosensitive material such as acrylic or polyimide is used to form, the side face thereof has a shape in which a radius curvature changes continuously, and an upper layer thin film is formed without disconnection due to a step; therefore, it is preferable. This embodiment mode can be freely combined with the above-mentioned embodiment modes.

EMBODIMENT MODE 5

In a display panel manufactured according to Embodiment Modes 2 to 4, as shown in FIG. 14B, a scan line driver circuit can be formed over a substrate 3700 by forming a semiconductor layer with a SAS.

Figure 25:
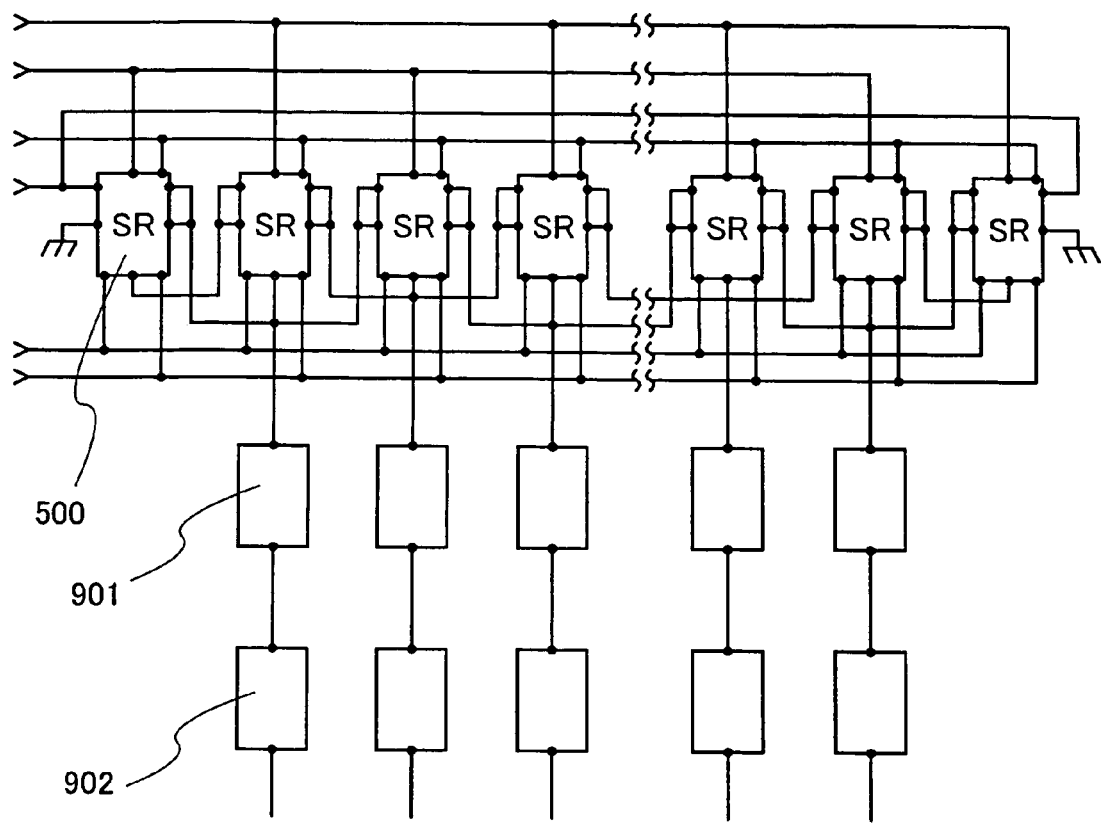
FIG. 25 is a view describing a circuit structure of a scan line driver circuit in an EL display panel according to the present invention.

FIG. 25 shows a block diagram of the scan line driver circuit including n-channel TFTs using a SAS in which electric field effect mobility of from 1 $cm^2$ V·sec to 15 $cm^2$/V·sec is obtained.

In FIG. 25, a block 500 corresponds to a pulse output circuit outputting a sampling pulse for one stage and a shift register includes n pulse outputting circuits. Reference numeral 901 denotes a buffer circuit and connected to a pixel 902.

Figure 26:
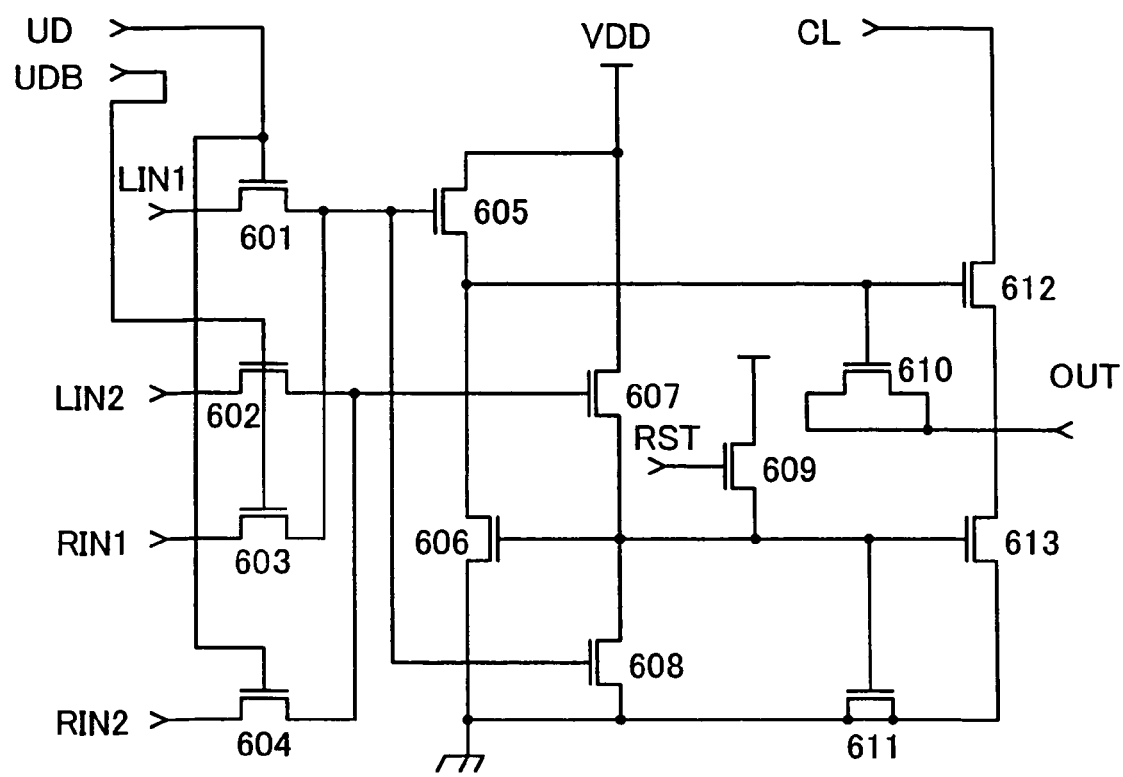
FIG. 26 is a diagram describing a circuit structure in a scan line driver circuit in an EL display panel according to the present invention (a shift resistor circuit)

FIG. 26 shows a specific structure of the block 500 which is a pulse output circuit, and the pulse output circuit includes n-channel TFTs 601 to 613. The size of the TFTs may be decided in consideration of the operation characteristics of the n-channel TFTs using a SAS. For example, when a channel length shall be 8 μm, the channel width can be set from 10 μm to 80 μm.

Figure 27:
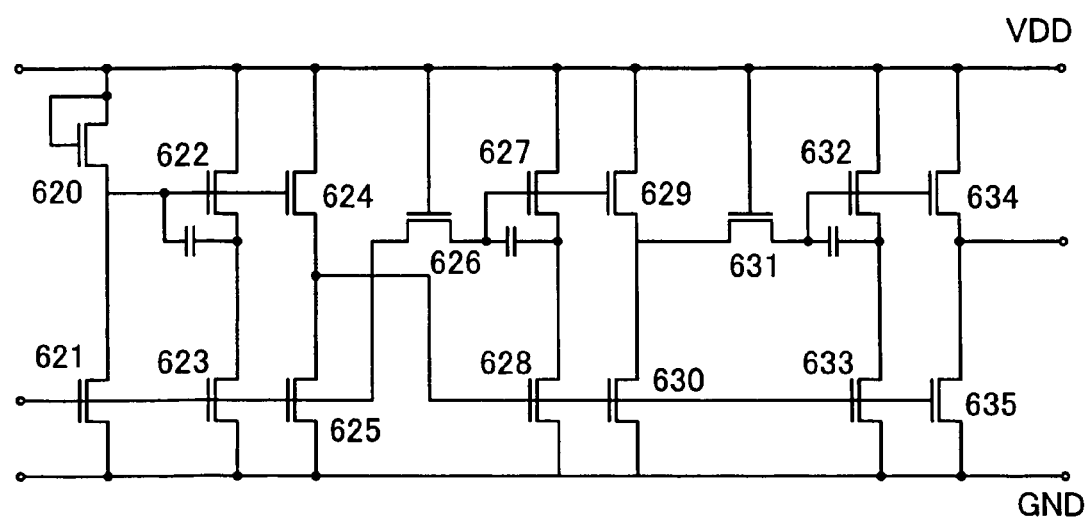
FIG. 27 is a diagram describing a circuit structure when a scan line driver circuit is formed of a TFT in an EL display panel according to the present invention (a buffer circuit)

In addition, FIG. 27 shows a specific structure of the buffer circuit 901. The buffer circuit includes n-channel TFTs 620 to 635 in the same manner. At this time, the size of the TFTs may be decided in consideration of the operation characteristics of the n-channel TFTs using a SAS. For example, when a channel length shall be 10 μm, the channel width can be set from 10 μm to 1800 μm. According to the present invention, a pattern can be formed to have a desired shape with good control; therefore, a fine wiring like this having a channel width of 10 μm can be stably formed without a fault such as a short circuit.

Figure 16:
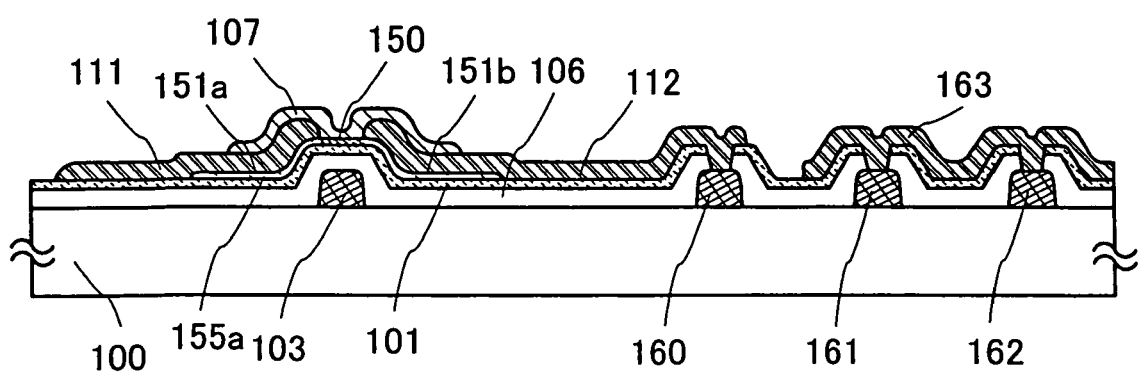
FIG. 16 is a view describing a method for manufacturing a display device according to the present invention.

It is necessary to connect the TFTs with one another with wirings to realize such circuits, and FIG. 16 shows a structural example of wirings of the case. As well as in Embodiment Mode 2, FIG. 16 shows a state in which a gate electrode layer 103, a gate insulating layer 106 (a laminate of three layers including an insulating layer containing silicon nitride, an insulating layer containing silicon oxide, and an insulating layer containing silicon nitride in this embodiment mode), a semiconductor layer 107 formed of an organic semiconductor, and source/drain electrode layers 111 and 112 are formed. In this embodiment mode, a photocatalyst 101 and a layer having low wettability substance are formed over the gate insulating layer 106; formation region of the source/drain electrode layers 111 and 112 are modified by being irradiated with light from the light-transmitting 100 side using the gate electrode layer 103 as a mask. In this embodiment mode, the modification is formed to control wettability. The photocatalyst 101 is activated by light irradiation, and a surface of a low wettability substance 155a is modified by the energy. Accordingly, a low wettability region 150, and high wettability regions 151a and 151b which have relatively different wettability are formed. A composition containing a conductive material is discharged to the high wettability regions 151a and 151b, so that the source/drain electrode layers 111 and 112 can be formed with good control.

In Embodiment Mode 2, since the semiconductor layer 107 is formed by a droplet discharge method, the low wettability substance formed over the low wettability region 150 is also irradiated with light to enhance the wettability. However, in this embodiment mode, the semiconductor layer 107 is formed by vacuum deposition using pentacene which is an organic semiconductor; therefore, the step of controlling the wettability of the low wettability region 150 is not required. Further, the semiconductor layer 107 may be formed by a droplet discharge method or the like using the composition in liquid form if the surface to be provided with a composition is wettable enough with the composition. In this embodiment mode, the low wettability region 150, the high wettability region 151a, and the high wettability region 151b are named for convenience depending on relative wettability difference with the composition containing a conductive material for forming the source/drain electrode layer. Accordingly, even when the formation region of the semiconductor layer displays low wettability with the composition containing a conductive material for the source/drain electrode layer, it is possible that the formation region does not have low wettability with the composition for forming the semiconductor layer 107. In such a case, the step of controlling the wettability of the formation region of the semiconductor layer 107 is not required.

Connection wiring layers 160, 161, and 162 are formed over a substrate 100 through the same steps as the gate electrode layer 104. Parts of a gate insulating layer are etched so that the connection wiring layers 160, 161, and 162 are exposed, and TFTs are appropriately connected with the use of the source/drain electrode layers 111 and 112, and a connection wiring layer 163 formed in the same step; thus, a variety of circuits can be realized.

EMBODIMENT MODE 6

A mode of mounting a driver circuit on a display panel manufactured according to Embodiment Modes 2 to 5 will be described.

First, a display device employing a COG method is described with reference to FIG. 15A. A pixel portion 2701 having pixel 2702 for displaying information on characters, images or the like is provided over a substrate 2700. A substrate provided with a plurality of driver circuits is divided into rectangles, and the divided driver circuits (hereinafter also referred to as a driver IC) 2751 are mounted on the substrate 2700. FIG. 15A shows a mode of mounting a plurality of driver ICs 2751 and FPCs 2750 on the end of the driver ICs 2751. In addition, the divided size may be made almost the same as the length of a side of a pixel portion on a signal line side, and a tape may be mounted on the end of a single driver IC.

A TAB method may be adopted. In that case, a plurality of tapes may be attached and driver ICs may be mounted on the tape as shown in FIG. 15B. Similarly to the case of a COG method, a singular driver IC may be mounted on a singular tape. In that case, a metal piece or the like for fixing the driver IC may be attached together in terms of the matter of intensity.

A plurality of the driver ICs to be mounted on a display panel is preferably formed over a rectangular substrate having a side of from 300 mm to 1000 mm or more in terms of improving production efficiency.

In other words, a plurality of circuit patterns including a driver circuit portion and an input-output terminal as a unit is formed over the substrate, and may be lastly divided to be used. In consideration of a side length of the pixel portion and the pixel pitch, the driver IC may be formed to be a rectangle having a long side (length) of 15 mm to 80 mm and a short side of from 1 mm to 6 mm. Alternatively, the driver IC may be formed to have the long side length of a side length of the pixel portion, or the long side length of adding the pixel portion to a side length of each driver circuit.

An advantage of the external dimension over an IC chip of a driver IC is the length of the long side. When a driver IC having a long side of from 15 mm to 80 mm is used, the number of driver ICs necessary for mounting in accordance with the pixel portion is less than that in the case of using an IC chip. Therefore, a yield in manufacturing can be improved. When a driver IC is formed over a glass substrate, production efficiency is not impaired, without limitation due to the shape of a substrate used as a mother body. This is a great advantage compared with the case of taking IC chips out of a circular silicon wafer.

When a scan line driver circuit 3702 is integrally formed over the substrate as shown in FIG. 14B, the driver IC provided with a signal line driver circuit is mounted on a region outside the pixel portion 3701. The driver IC is a signal line driver circuit. In order to form a pixel portion corresponding to RGB full color, 3072 signal lines are required for an XGA class and 4800 signal lines are required for a UXGA class. The signal lines formed in such a number are divided into several blocks on an end of the pixel portion 3701 to form lead lines. The signal lines are gathered corresponding to the pitches of output terminals of the driver ICs.

The driver IC is preferably made of a crystalline semiconductor formed over a substrate. The crystalline semiconductor is preferably formed by being irradiated with continuous wave laser light. Therefore, a continuous wave solid-state laser or gas laser is used as an oscillator for generating the laser light. There are few crystal defects when a continuous wave laser is used, and as a result, a transistor can be formed by using a polycrystalline semiconductor layer with a large grain size. In addition, high-speed driving is possible since mobility or response speed is favorable, and it is possible to further improve an operating frequency of an element than that of the conventional element. Therefore, high reliability can be obtained since there are few characteristics variations. Note that the channel-length direction of a transistor and a scanning direction of laser light may be directed in the same direction to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous wave laser. The channel length direction coincides with the flowing direction of a current, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to extensively focus the laser light, and the beam spot thereof preferably has the same width as that of a short side of the driver ICs, approximately from 1 mm to 3 mm. In addition, in order to secure an enough and effective energy density for an object to be irradiated, an irradiation region of the laser light preferably has a linear shape. As used herein, the term "linear" refers to not a line in a strict sense but a rectangle or an oblong with a large aspect ratio. For example, the linear shape refers to a rectangle or an oblong with an aspect ratio of 2 or more (preferably from 10 to 10000). Thus, it is possible to provide a method for manufacturing a display device in which productivity is improved by making a beam spot width of the laser light and that of a short side of the driver ICs to have the same length.

As shown in FIGS. 15A and 15B, driver ICs may be mounted as both a scan line driver circuit and a signal line driver circuit. In this case, it is preferable to differentiate specifications of the scan line driver circuit and the signal line driver circuit.

In the pixel portion, the signal line and the scan line intersect to form a matrix and a transistor is arranged in accordance with each intersection. A TFT having an amorphous semiconductor or a semiamorphous semiconductor as a channel portion is used as the transistor arranged in the pixel portion in the present invention. The amorphous semiconductor is formed by a method such as plasma CVD or sputtering. It is possible to form the semiamorphous semiconductor at temperatures of 300° C. or less by plasma CVD. A film thickness necessary to form a transistor is formed in a short time even in the case of a non-alkaline glass substrate of an external size of, for example, 550 mm×650 mm. The feature of such a manufacturing technique is effective in manufacturing a large-area display device. In addition, a semiamorphous TFT can obtain field effect mobility of from 2 $cm^2$/V·sec to 10 $cm^2$V·sec by forming a channel formation region of a SAS. When the present invention is applied, a fine wiring having a short channel width can be stably formed without a fault such as a short circuit since a pattern can be formed to have a desired shape with good control. Accordingly, TFT having electric characteristics required to operate a pixel sufficiently. Therefore, this TFT can be used as a switching element of pixels and as an element constituting the scan line driver circuit. Thus, a display panel in which system-on-panel is realized can be manufactured.

The scan line driver circuit is also integrally formed over the substrate by using a TFT having a semiconductor layer formed of a semiamorphous semiconductor (SAS). In the case of using a TFT having a semiconductor layer formed of an amorphous semiconductor (AS), a driver IC may be mounted as both the scan line driver circuit and the signal line driver circuit.

In that case, it is preferable to differentiate specifications of the driver ICs to be used on the scan line and on the signal line. For example, a transistor constituting the scan line side driver ICs is required to withstand a voltage of approximately 30 V, however, a drive frequency is 100 kHz or less and high-speed operation is not comparatively required. Therefore, it is preferable to set a channel-length (L) of the transistor included in the scan line driver sufficiently long. On the other hand, a transistor of the signal line driver ICs is required to withstand a voltage of only approximately 12 V, however, a drive frequency is around 65 MHz at 3 V and high-speed operation is required. Therefore, it is preferable to set a channel-length or the like of the transistor included in a driver with a micron rule. According to the present invention, a fine pattern can be formed with good control; therefore, the present invention can correspond to such a micron rule sufficiently.

A method for mounting a driver IC is not particular limited, and a known method such as a COG method, a wire bonding method, or a TAB method can be employed.

The heights of the driver IC and the counter substrate can be made almost the same by forming the driver IC to have the same thickness as that of the counter substrate, which contributes to thinning a display device as a whole. When both substrates are formed of the same material, thermal stress is not generated and characteristics of a circuit including a TFT are not harmed even when temperature change is generated in the display device. Furthermore, the number of driver ICs to be mounted on one pixel portion can be reduced by mounting a longer driver IC than an IC chip as a driver circuit as described in this embodiment mode.

As described above, a driver circuit can be incorporated in a display panel.

EMBODIMENT MODE 7

A structure of a pixel of a display panel shown in this embodiment is described with reference to equivalent circuit diagrams shown in FIGS. 17A to 17F.

Figure 17A:
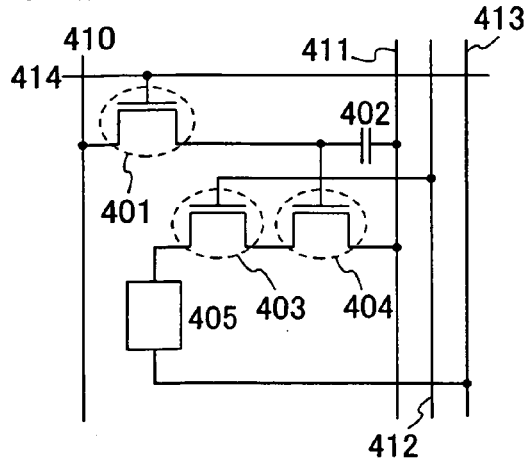
FIGS. 17A to 17F are circuit diagrams describing a structure of a pixel which is applicable to an EL display panel according to the present invention.

In a pixel shown in FIG. 17A, a signal line 410 and power supply lines 411 to 413 are arranged in columns, and a scan line 414 is arranged in a row. The pixel also includes a switching TFT 401, a driving TFT 403, a current controlling TFT 404, a capacitor element 402, and a light-emitting element 405.

Figure 17B:
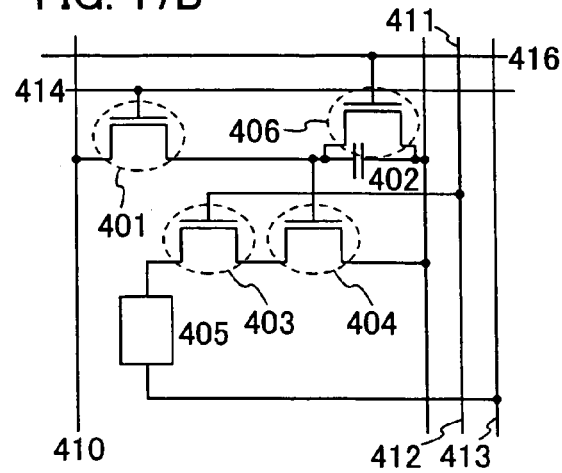
Figure 17C:
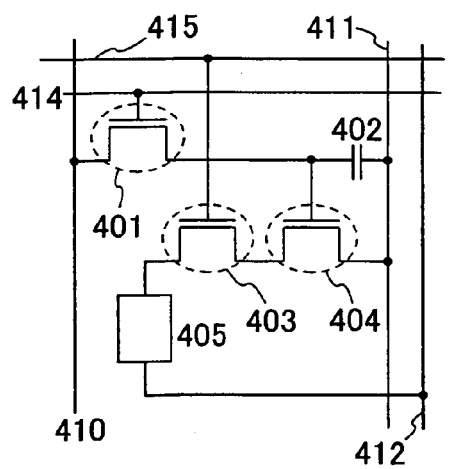
Figure 17D:
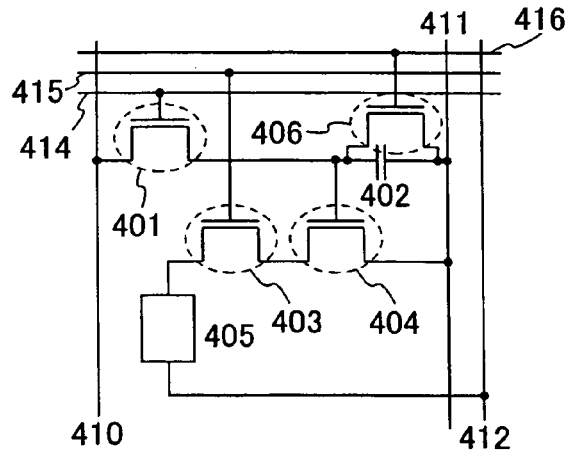

A pixel shown in FIG. 17C has the same structure as the one shown in FIG. 17A, except that a gate electrode of the driving TFT 403 is connected to the power supply line 415 arranged in a row. Both pixels in FIGS. 17A and 17C show the same equivalent circuit diagrams. However, each power supply line is formed of conductive layers in different layers in between the cases where the power supply line 412 is arranged in a column (FIG. 17A) and where the power supply line 415 is arranged in a row (FIG. 17C). The two pixels are each shown in FIGS. 17A and 17C in order to show that layers in which a wiring connected to the gate electrode of the driving TFT 403 is formed are different in between FIGS. 17A and 17C.

In both FIGS. 17A and 17C, the TFTs 403 and 404 are connected in series in the pixel, and the ratio of the channel length $L_3$/the channel width $W_3$ of the TFT 403 to the channel length $L_4$/the channel width $W_4$ of the TFT 404 is set as $L_3/W_3:L_4/W_4=5$ to $6000:1$. For example, when $L_3$, $W_3$, $L_4$, and $W_4$ are 500 μm, 3 μm, 3 μm, and 100 μm, respectively. According to the present invention, such a fine wiring having 3 μm $W_3$ can be stably formed without a fault such as a short circuit since a pattern can be formed to have a desired shape with good control. Hence, a TFT having electric characteristics required for sufficiently operating such pixels shown in FIGS. 17A and 17C can be formed. As a result, a highly reliable display panel superior in display capability can be manufactured.

The TFT 403 is operated in a saturation region and controls the amount of current flowing in the light emitting element 405, whereas the TFT 404 is operated in a linear region and controls a current supplied to the light emitting element 405. The TFTs 403 and 404 preferably have the same conductivity in view of the manufacturing process. For the driving TFT 403, a depletion type TFT may be used instead of an enhancement type TFT. According to the present invention having the above structure, slight variations in $V_{GS}$ of the TFT 404 does not affect the amount of current flowing in the light emitting element 405, since the current controlling TFT 404 is operated in a linear region. That is, the amount of current flowing in the light emitting element 405 is determined by the TFT 403 operated in a saturation region. Accordingly, it is possible to provide a display device in which image quality is improved by improving variations in luminance of the light emitting element due to the variation of the TFT properties.

The TFTs 401 of pixels shown in FIGS. 17A to 17D controls a video signal input to the pixel. When the switching TFT 401 is turned ON and a video signal is input to the pixel, the video signal is held in the capacitor element 402. Although the pixel includes the capacitor element 402 in FIGS. 17A to 17D, the present invention is not limited thereto. When a gate capacitance or the like can serve as a capacitor for holding a video signal, the capacitor element 402 is not necessarily provided.

The light emitting element 405 has a structure in which an electroluminescent layer is sandwiched between a pair of electrodes. A pixel electrode and a counter electrode (an anode and a cathode) have a potential difference therebetween so that a forward bias voltage is applied. The electroluminescent layer is formed of wide range of materials such as an organic material, an inorganic material. The luminescence in the electroluminescent layer includes luminescence that is generated when an excited singlet state returns to a ground state (fluorescence) and luminescence that is generated when an exited triplet state returns to a ground state (phosphorescence).

A pixel shown in FIG. 17B has the same structure as the one shown in FIG. 17A, except that a TFT 406 and a scan line 416 are added. Similarly, a pixel shown in FIG. 17D has the same structure as the one shown in FIG. 17C, except that a TFT 406 and a scan line 416 are added.

The TFT 406 is controlled to be ON/OFF by the added scan line 415. When the TFT 406 is turned ON, charges held in the capacitor element 402 are discharged, thereby turning the TFT 404 OFF. That is, supply of a current to the light emitting element 405 can be forcibly stopped by providing the TFT 406. Therefore, a lighting period can start simultaneously with or shortly after a writing period starts before signals are written into all the pixels by adopting the structures shown in FIGS. 17B and 17D, thus, the duty ratio can be improved.

Figure 17E:
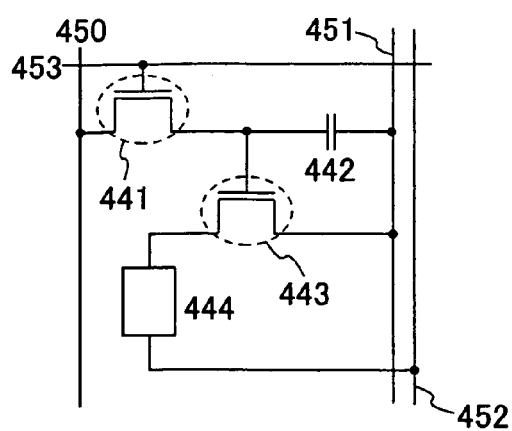
Figure 17F:
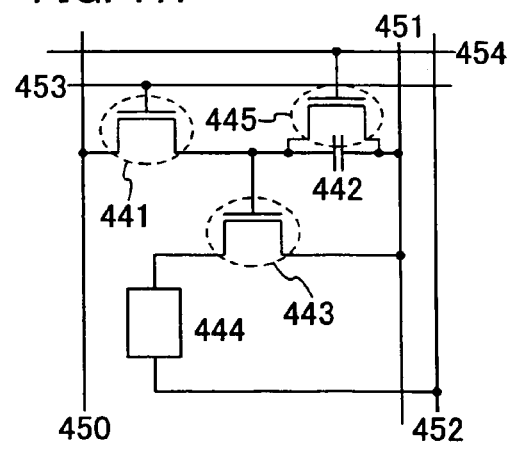

In a pixel shown in FIG. 17E, a signal line 450 and power supply lines 451 and 452 are arranged in columns, and a scan line 453 is arranged in a row. The pixel further includes a switching TFT 441, a driving TFT 443, a capacitor element 442, and a light emitting element 444. A pixel shown in FIG. 17F has the same structure as the one shown in FIG. 17E, except that a TFT 445 and a scan line 454 are added. It is to be noted that the structure of FIG. 17F also allows a duty ratio to be improved by providing the TFT 445.

As described above, according to the present invention, a pattern of a wiring or the like can be stably formed with good control without a break. Therefore, a TFT can be provided with high electric characteristics and reliability, and the present invention can satisfactorily be used for an applied technique for improving display capacity of a pixel in accordance with the intended use.

EMBODIMENT MODE 8

Figure 24:
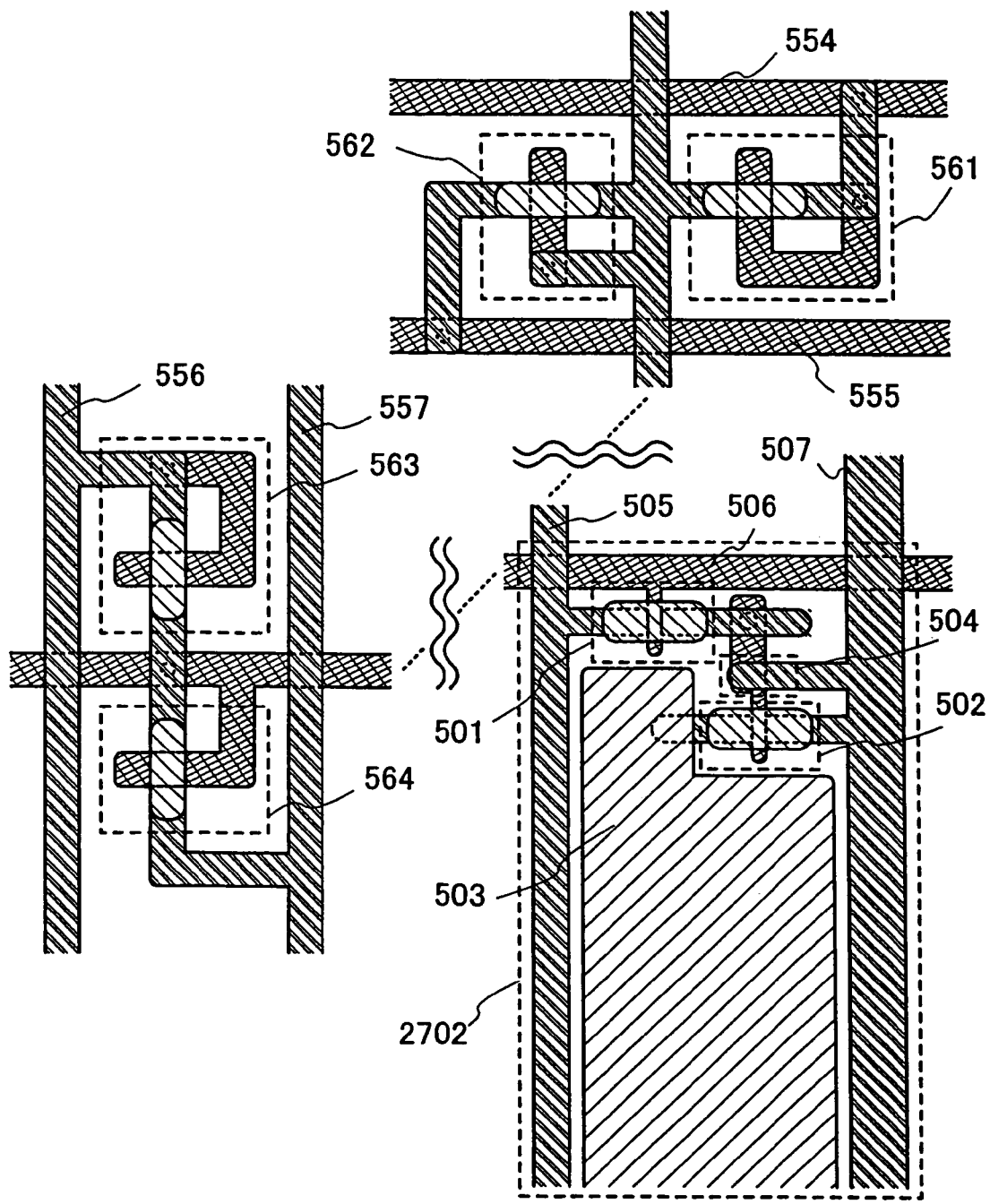
FIG. 24 is a top view describing an EL display module according to the present invention.

One mode in which protective diodes are provided for a scan line input terminal portion and a signal line input terminal portion is explained with reference to FIG. 24. TFTs 501 and 502, a capacitor 504, a light emitting element 503, a gate line 506, and a power supply line 507 are provided for a pixel 2702 in FIG. 24. This TFT has the same structure as that in Embodiment Mode 2.

Figure 23:
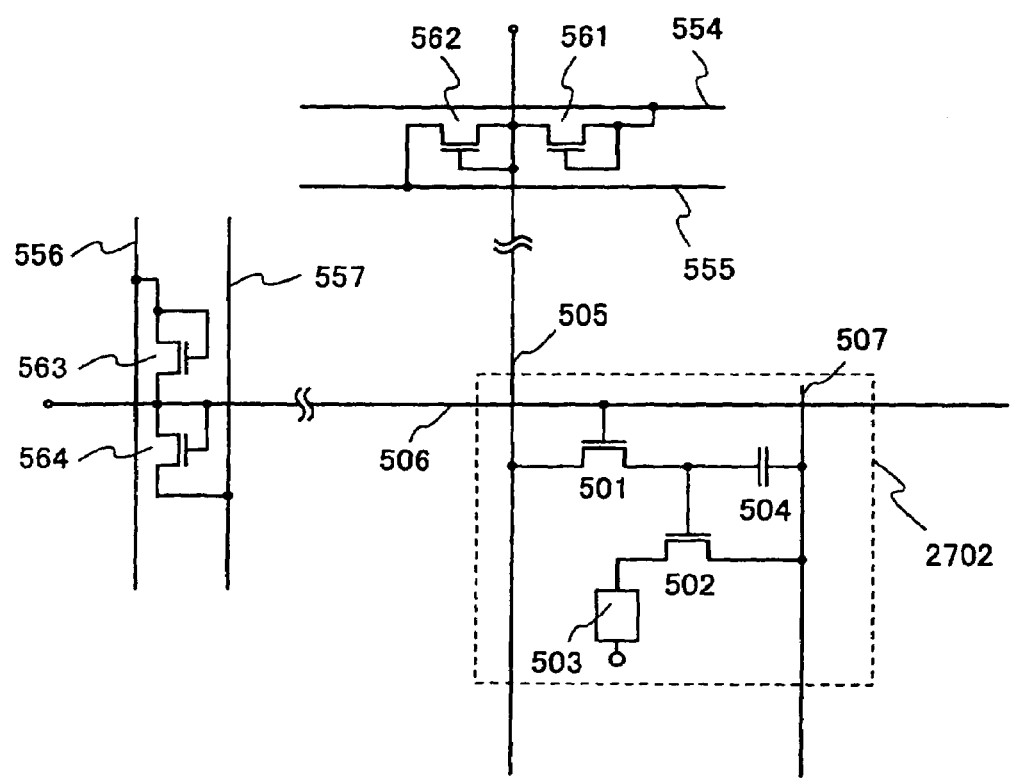
FIG. 23 is an equivalent circuit diagram of an EL display panel according to the present invention.

Protective diodes 261 and 262 are provided for the signal line input terminal portion. These protective diodes are manufactured in the same step as that of the TFT 260 and being operated as a diode by being each connected to a gate and one of a drain or a source. FIG. 23 shows an equivalent circuit diagram such as a top view shown in FIG. 24.

The protective diode 561 includes a gate electrode layer, a semiconductor layer, a wiring layer. The protective diode 562 has the same structure. Common potential lines 554 and 555 connecting to this protective diode are formed in the same layer as that of the gate electrode layer. Therefore, it is necessary to form a contact hole in the gate insulating layer to electrically connect to the wiring layer.

A mask layer may be formed and etching-processed to form a contact hole in the gate insulating layer. In this case, when etching-process at atmospheric pressure discharge is applied, electric discharging process can be locally performed, and a mask layer is not necessarily formed over the entire surface.

A signal wiring layer is formed in the same layer as that of a source/drain wiring layer 505 in the TFT 501 and has a structure in which the signal wiring layer connected thereto is connected to the source or drain side.

The input terminal portion of the scanning signal line side also has the same structure. A protective diode 563 includes a gate electrode layer, a semiconductor layer, and a wiring layer. A protective diode 564 also has the same structure. Common potential lines 556 and 557 connected to the protective diode are formed in the same layer as that of the source/drain wiring layer. According to the present invention, the protective diodes provided in an input stage can be formed at the same time. Note that the position of depositing a protective diode is not limited to this embodiment mode and can also be provided between a driver circuit and a pixel.

As described above, according to the present invention, a pattern of a wiring or the like can be stably formed without generating a formation defect with good control. Therefore, even when a wiring or the like is complex and formed densely by forming a protective circuit, a short or the like due to the defect of installation at the time of formation is not generated. Additionally, the present invention can correspond to a miniaturized or thinned device sufficiently since it is not necessary to take wide margin into consideration. As a result, a display device having preferable electric characteristics and high reliability can be manufactured.

EMBODIMENT MODE 9

Figure 22:
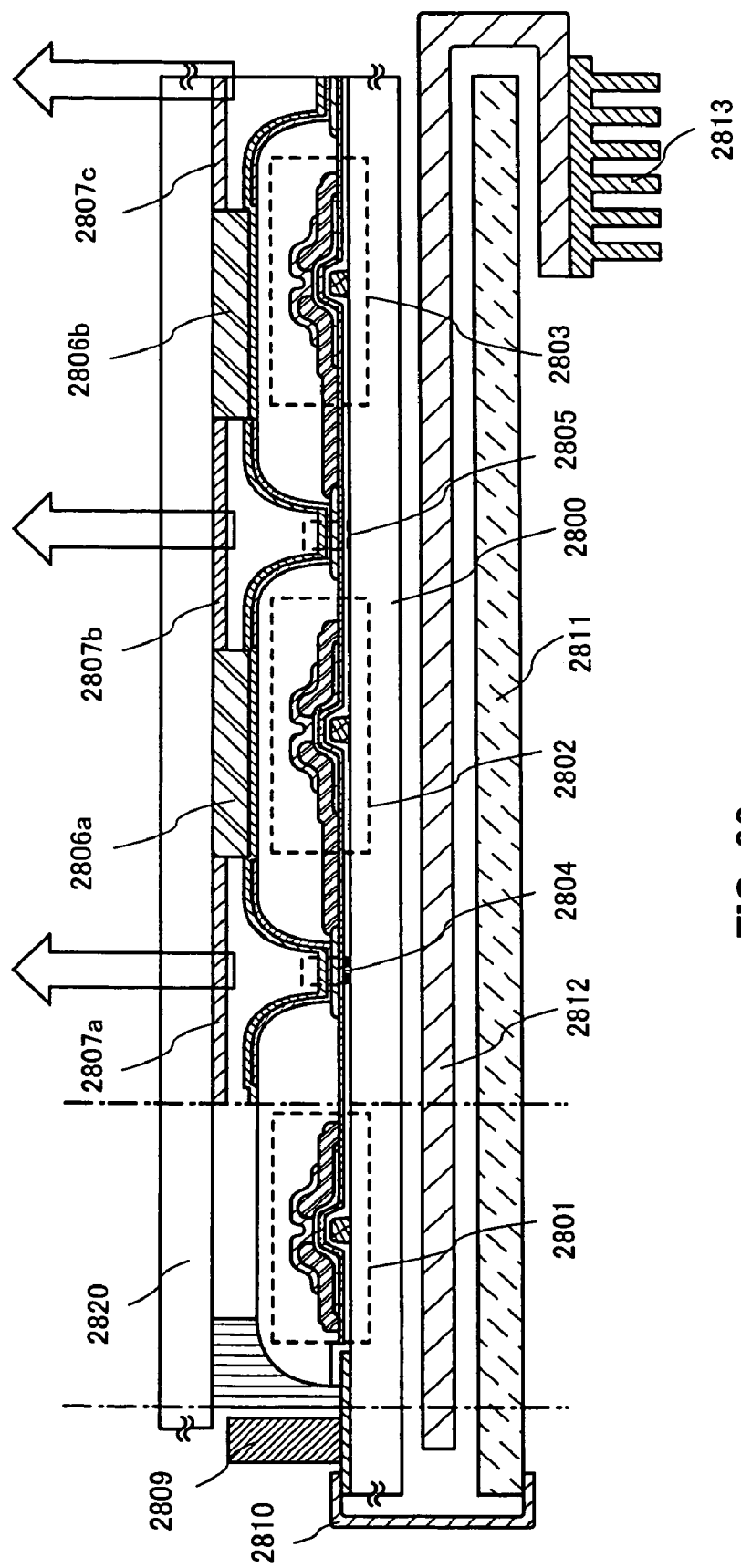
FIG. 22 is a cross-sectional view describing a structure example of an EL display module according to the present invention.

FIG. 22 shows an example constituting an EL display module having a TFT substrate 2800 manufactured according to the present invention. A pixel portion including pixels is formed over the TFT substrate 2800.

In FIG. 22, a TFT which is the same as that formed in a pixel or a protective circuit portion 2801 operated in the same manner as a diode by being connected to a gate and one of a source or a drain of the TFT is provided between a driver circuit and the pixel which is outside of the pixel portion. A driver IC formed of a single crystal semiconductor, a stick driver IC formed of a polycrystalline semiconductor film over a glass substrate, or a driver circuit formed of a SAS is applied to a driver circuit 2809.

The TFT substrate 2800 is bonded to a sealing substrate 2820 by interposing spacers 2806a and 2806b therebetween. The spacer is preferably provided to keep the space between two substrates constantly even when a substrate is thin and an area of a pixel portion is enlarged. A space between the TFT substrate 2800 and the sealing substrate 2820 over light emitting elements 2804 and 2805 connected to TFTs 2802 and 2803, respectively may be filled with a light-transmitting resin material and solidified, or may be filled with anhydrous nitrogen or an inert gas.

FIG. 22 shows the case in which the light emitting elements 2804 and 2805 have a structure of a top emission type and has a structure in which light is emitted in the direction of the arrow shown in the figure. Multicolor display can be carried out in each pixel by having different luminescent colors of red, green, and blue. In addition, at this time, color purity of the luminescence emitted outside can be enhanced by forming coloring layers 2807a, 2807b and 2807c corresponding to each color on the sealing substrate 2820 side. Moreover, the coloring layers 2807a, 2807b and 2807c may be combined by using the pixel as a white light emitting element.

The driver circuit 2809 which is an external circuit is connected to a scan line or signal line connection terminal provided over one end of an external circuit substrate 2811 through a wiring substrate 2810. In addition, a heat pipe 2813 and a heat sink 2812 may be provided to be in contact with or close to the TFT substrate 2800 to have a structure improving a heat effect.

FIG. 22 shows the top emission type EL module, however, it may be a bottom emission structure by changing the structure of the light emitting element or the disposition of the external circuit substrate. Naturally, a dual emission structure in which light is emitted to both sides of the top and bottom surfaces may be used. In the case of the top emission structure, the insulating layer which is to be a partition wall may be colored to be used as a black matrix. This partition wall can be formed by a droplet discharge method or the like and it may be formed by mixing a black resin of a pigment material, carbon black, or the like into a resin material such as polyimide, or a lamination thereof may be also used.

Additionally, in the TFT substrate 2800, a sealing structure may be formed by attaching a resin film to the side where the pixel portion is formed with the use of a sealant or an adhesive resin. In this embodiment mode, glass sealing using a glass substrate is shown, however, various sealing methods such as resin sealing using a resin, plastic sealing using plastic, and film sealing using a film can be used. A gas barrier film which prevents moisture from penetrating is preferably provided on the surface of a resin film. By applying a film sealing structure, further thinner and lighter can be realized.

EMBODIMENT MODE 10

A television device can be completed by a display device formed according to the present invention. A display panel can be formed in any manners as follows: as the structure shown in FIG. 14A, in the case where only a pixel portion is formed, and then a scan line driver circuit and a signal line driver circuit are mounted by a TAB method as shown in FIG. 15B; as the structure shown in FIG. 14A, in the case where only a pixel portion is formed, and then a scan line driver circuit and a signal line driver circuit are mounted by a COG method as shown in FIG. 15A; a TFT is formed of a SAS, a pixel portion and a scan line driver circuit are integrally formed over a substrate, and a signal line driver circuit is separately mounted as a driver IC as shown in FIG. 14B; and a pixel portion, a signal line driver circuit, and a scan line driver circuit are integrally formed over the substrate as shown in FIG. 14C; or the like.

Another structure of an external circuit includes a video signal amplifier circuit which amplifies a video signal received by a tuner; a video signal processing circuit which converts the video signal output therefrom into a chrominance signal corresponding to each color of red, green, and blue; a control circuit which converts the video signal into an input specification of a driver IC; and the like on inputting side of the video signal. The control circuit outputs the signal into the scan line side and the signal line side, respectively. In the case of digital driving, a signal division circuit may be provided on the signal line side so as to have a structure in which an input digital signal is provided by dividing into m-pieces.

Among a signal received from the tuner, an audio signal is transmitted to an audio signal amplifier circuit, and the output thereof is provided for a speaker through an audio signal processing circuit. A control circuit receives control information on a receiving station (a receiving frequency) or sound volume from an input portion and transmits the signal to the tuner or the audio signal processing circuit.

Figure 13:
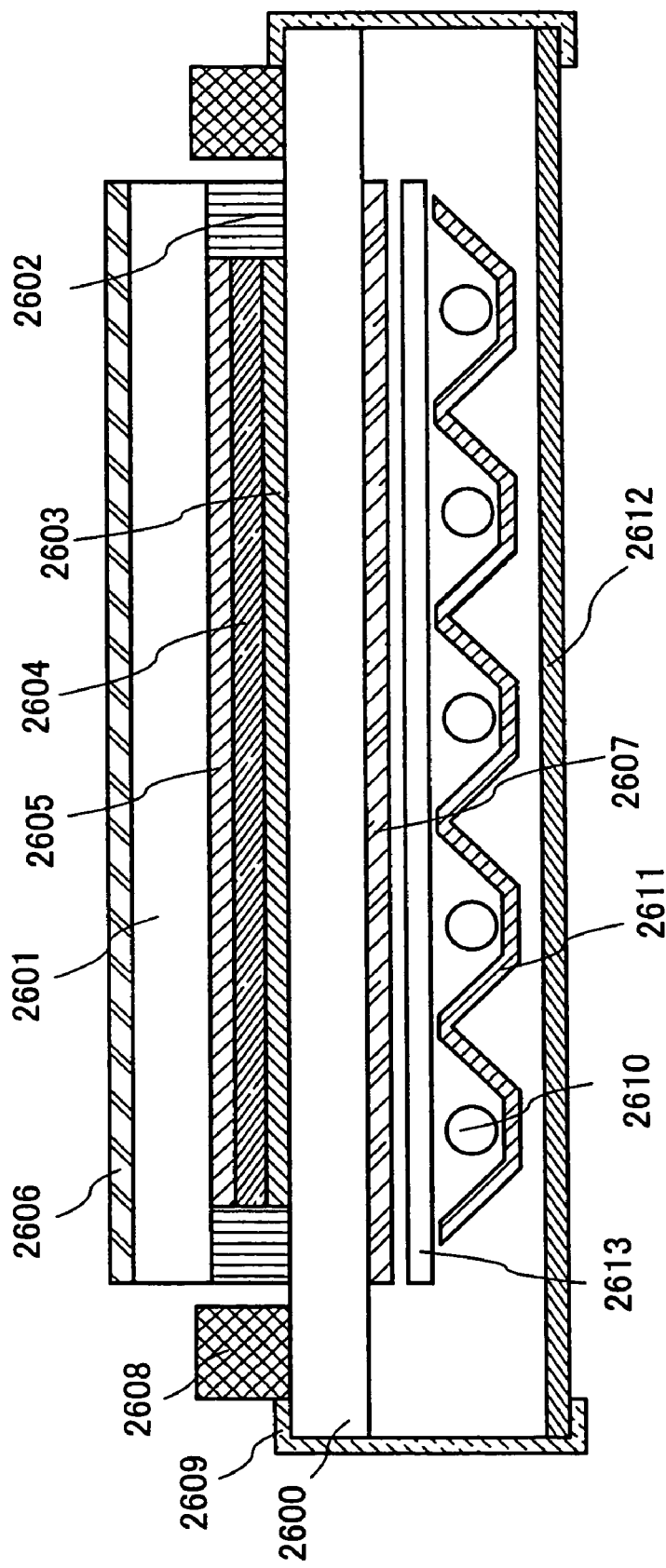
FIG. 13 is a cross-sectional view describing a structural example of a liquid crystal display module according to the present invention.

FIG. 13 shows an example of a liquid crystal display module, and a TFT 2600 and a counter substrate 2601 are fixed with a sealant 2602, with a pixel portion 2603 and a liquid crystal layer 2604 interposed therebetween to form a display region. Coloring layer 2605 is required in the case of performing a color display. In the case of an RGB method, coloring layers corresponding to red, green, and blue are provided for each pixel. Polarizing plates 2606 and 2607, an optical film 2613 are provided outside the TFT substrate 2600 and the counter substrate 2601. A light source includes a cold cathode tube 2610 and reflection plate 2611, and a circuit substrate 2612 is connected to the TFT substrate 2600 through a driver circuit 2608 and a flexible wiring substrate 2609 and an external circuit such as a control circuit or a power supply circuit is incorporated.

Figure 20A:
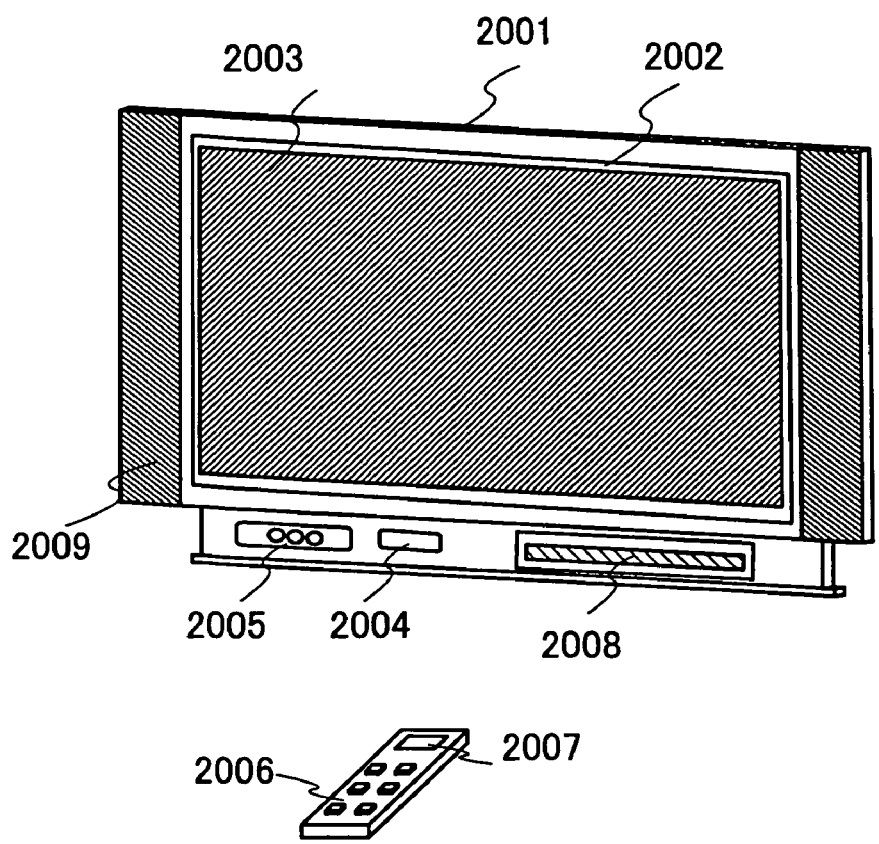
FIGS. 20A and 20B are figures showing electronic devices to which the present invention is applied.
Figure 20B:
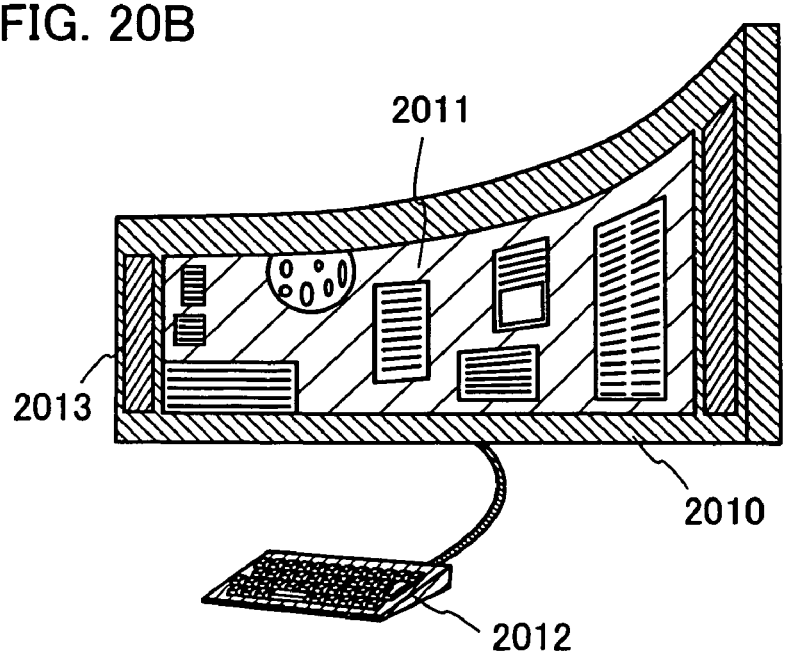

As shown in FIGS. 20A and 20B, a television device can be completed by incorporating a display module into a chassis 2001. An EL television device can be completed when an EL display module as in FIG. 22 is used, and a liquid crystal television device can be completed when a liquid crystal module as in FIG. 13 is used. A main screen 2003 is formed by using the display module, and a speaker portion 2009, operation switches, and the like are provided as other attached equipments. In such a manner, the television device can be completed according to the present invention.

Figure 19:
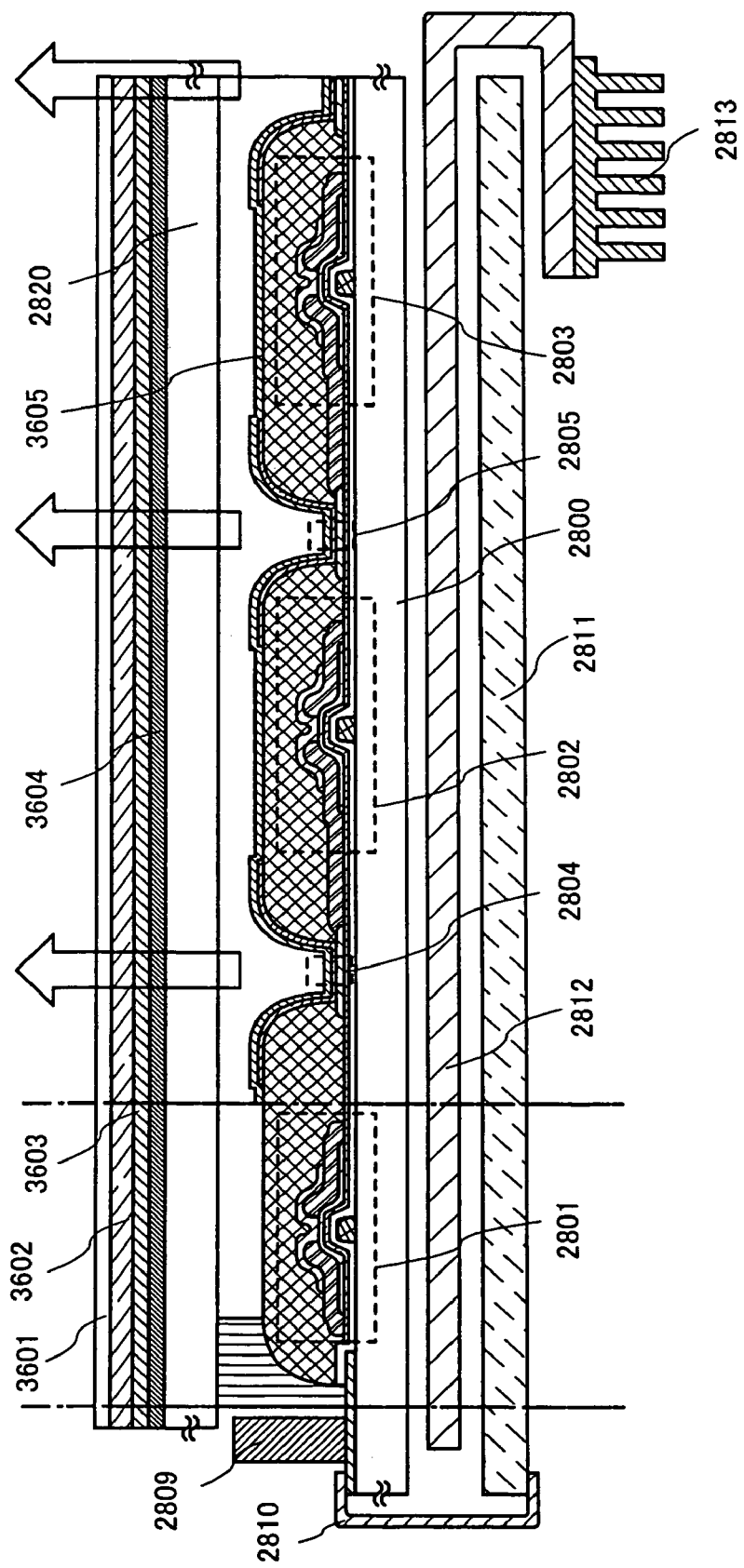
FIG. 19 is a cross-sectional view describing a structure example of an EL display module according to the present invention.

In addition, reflected light of light entered from exterior may be shielded by using a retardation film and a polarizing plate. FIG. 19 is a structure of a top emission type and an insulating layer 3605 which is to be a partition wall is colored to use as a black matrix. The partition wall can be formed by a droplet discharge method, and carbon black or the like may be mixed into a resin material such as polyimide, and a lamination thereof may be also used. Depending on a droplet discharge method, different materials may be discharged on the same region plural times to form the partition wall. In this embodiment mode, a black resin of a pigment is used. A λ/4 plate and a λ/2 plate may be used as retardation films 3603 and 3604 and may be designed to be able to control light. As the structure, a TFT element substrate 2800, a light emitting element 2804, a sealing substrate (sealant) 2820, a retardation films (λ/4 and λ/2) 3603 and 3604, a polarizing plate 3602 are sequentially laminated, in which light emitted from the light emitting element is emitted outside of the polarizing plate side to transmit them. The retardation film or polarizing plate may be provided on a side where light is emitted or may be provided on the both sides in the case of a dual emission type display device in which light is emitted from the both faces. In addition, an anti-reflective film 3601 may be provided on the outer side of the polarizing plate. Accordingly, a higher definition and more accurate image can be displayed.

As shown in FIG. 20A, a display panel 2002 using a display element is incorporated into a chassis 2001. By using a receiver 2005, in addition to receiving general TV broadcast, information communication can also be carried out in one direction (from a transmitter to a receiver) or in the both directions (between a transmitter and a receiver or between receivers) by connecting to a communications network by a fixed line or a wireless through a modem 2004. The operation of the television device can be carried out by switches incorporated into the chassis or by a remote control device 2006, which is separated from the main body. A display portion 2007 that displays information to be output may be also provided for this remote control device.

In addition, in the television device, a structure displaying a channel, sound volume, or the like may be additionally provided by forming a sub-screen 2008 of a second display panel in addition to the main screen 2003. In this structure, the main screen 2003 is formed of an EL display panel superior in a viewing angle, and the sub-screen may be formed of a liquid crystal display panel capable of displaying the sub-screen with low power consumption. In order to prioritize low power consumption, a structure in which the main screen 2003 is formed of a liquid crystal display panel, the sub-screen is formed of an EL display panel, and the sub-screen is able to flash on and off may be also applied. According to the present invention, a display device with high reliability can be manufactured even by using many TFTs and electronic parts by using such a large-sized substrate.

FIG. 20B shows a television device having a large-sized display portion of, for example, 20 inches to 80 inches, which includes a chassis 2010, a keyboard portion 2012 which is an operation portion, a display portion 2011, a speaker portion 2013, and the like. The present invention is applied to manufacturing the display portion 2011. FIG. 20B shows a television device having a curved display portion since a substance which is capable of curving is used for the display portion. Thus, a television device having a desired shape can be manufactured since the shape of the display portion can be freely designed.

Using the present invention enables to simplify the process. Accordingly, a display panel can be easily manufactured even when a glass substrate which is in and after the fifth generation having 1000 mm or more on a side is used.

According to the present invention, a desired pattern can be formed with good control, and the material loss and the cost can be reduced. Hence, a television device even with a large screen display portion can be formed with low cost by applying the present invention, and a defect is not generated even when the television device is thinned and a wiring or the like becomes precise. Accordingly, a high-performance and highly reliable television device can be manufactured with a preferable yield.

Naturally, the present invention is not limited to the television device and it can be applied to various usages especially as the display mediums having a large area such as an information display board at a station, an airport, or the like, or an advertisement display board on the street as well as a monitor of a personal computer.

EMBODIMENT MODE 11

Various display devices can be manufactured by applying the present invention. In other words, the present invention can be applied to various electronic devices in which these display devices are incorporated into display portions.

The electronic devices include a camera such as a video camera or a digital camera, a projector, a head mounted display (a goggle type display), a car navigation system, a car stereo, a personal computer, a game machine, a portable information terminal (a mobile computer, a cellular phone, an electronic book, or the like), an image reproducing device provided with a recording medium (specifically a device that is capable of playing a recording medium such as a Digital Versatile Disc (DVD) and that has a display device that can display the image) or the like. FIGS. 21A to 21D show the examples thereof.

Figure 21A:
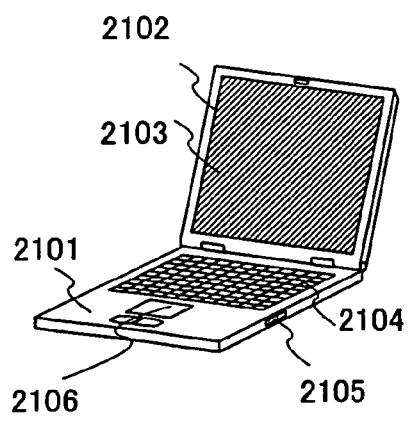
FIGS. 21A to 21D are figures showing electronic devices to which the present invention is applied.

FIG. 21A shows a computer, which includes a main body 2101, a chassis 2102, a display portion 2103, a keyboard 2104, an external connection port 2105, a pointing mouse 2106 and the like. According to the present invention, a computer in which an image with high reliability and high resolution can be displayed can be completed even the computer is miniaturized and a wiring or the like becomes precise.

Figure 21B:
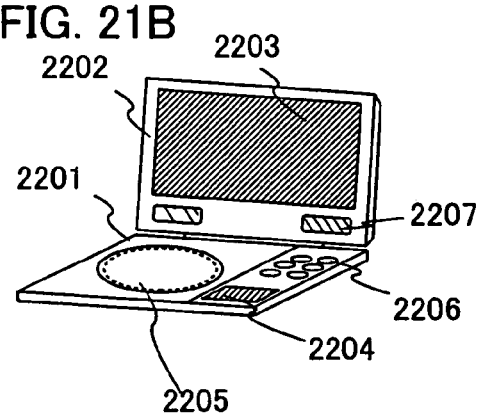

FIG. 21B shows an image reproducing device provided with a recording medium (specifically a DVD reproducing device), which includes a main body 2201, a chassis 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information. According to the present invention, an image producing device in which an image with high reliability and high resolution can be displayed can be completed even when the image reproducing device is miniaturized and a wiring or the like becomes precise.

Figure 21C:
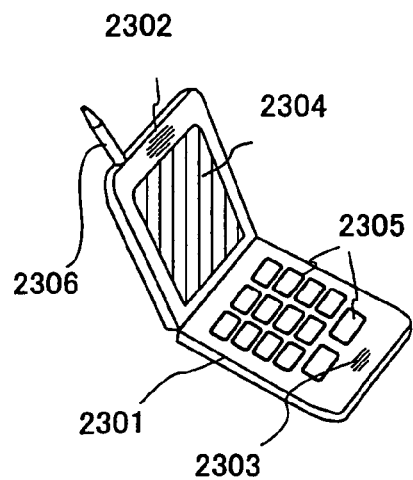
Figure 21D:
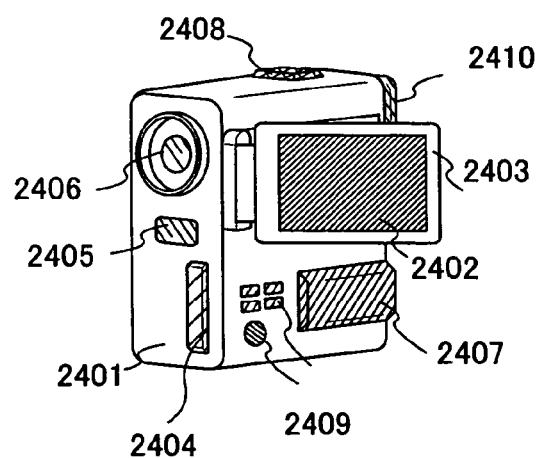

FIG. 21C shows a cellular phone, which includes a main body 2301, an audio output portion 2302, an audio input portion 2303, a display portion 2304, operation switches 2305, an antenna 2306, and the like. According to the present invention, a cellular phone in which an image with high reliability and high resolution can be displayed can be completed even when the cellular phone is miniaturized and a wiring or the like becomes precise.

FIG. 11D shows a video camera, which includes a main body 2401, a display portion 2402, a chassis 2403, an external connection port 2404, a remote control receiving portion 2405, an image receiving portion 2406, a battery 2407, an audio input portion 2408, operation switches 2409, eyepiece portion 2410, and the like. According to the present invention, a video camera in which an image with high reliability and high resolution can be displayed can be completed even when the video camera is miniaturized and a wiring or the like becomes precise. This embodiment mode can be freely combined with the above-mentioned embodiment modes.

EMBODIMENT 1

In this embodiment, an effect of the present invention will be explained based on experimental results.

A glass substrate as a substrate, titanium oxide as a photocatalyst, and FAS as a low wettability substance are used. A $TiCl_3$ solution is applied to the glass substrate and baked to form a titanium oxide layer, and thereafter FAS is formed thereover. The $TiCl_3$ solution is a solution in which $TiCl_3$ is dissolved in a dilute hydrochloric acid solution in a concentration of 2% by weight. The baking is carried out in an oxygen atmosphere at 450° C. for 30 minutes. In addition, isopropyl alcohol is used for the solvent of FAS.

A sample in which only FAS is formed over the a glass substrate without a titanium oxide layer for comparative examples and the above-mentioned sample according to the present invention are irradiated with light. The light irradiation is carried out through the glass substrate from the glass substrate side using a metal halide lamp as the light source; light with a wavelength of 300 nm to 400 nm is applied. The relation between the contact angle of water in the irradiated area and light irradiation time is shown in FIG. 31.

Figure 31:
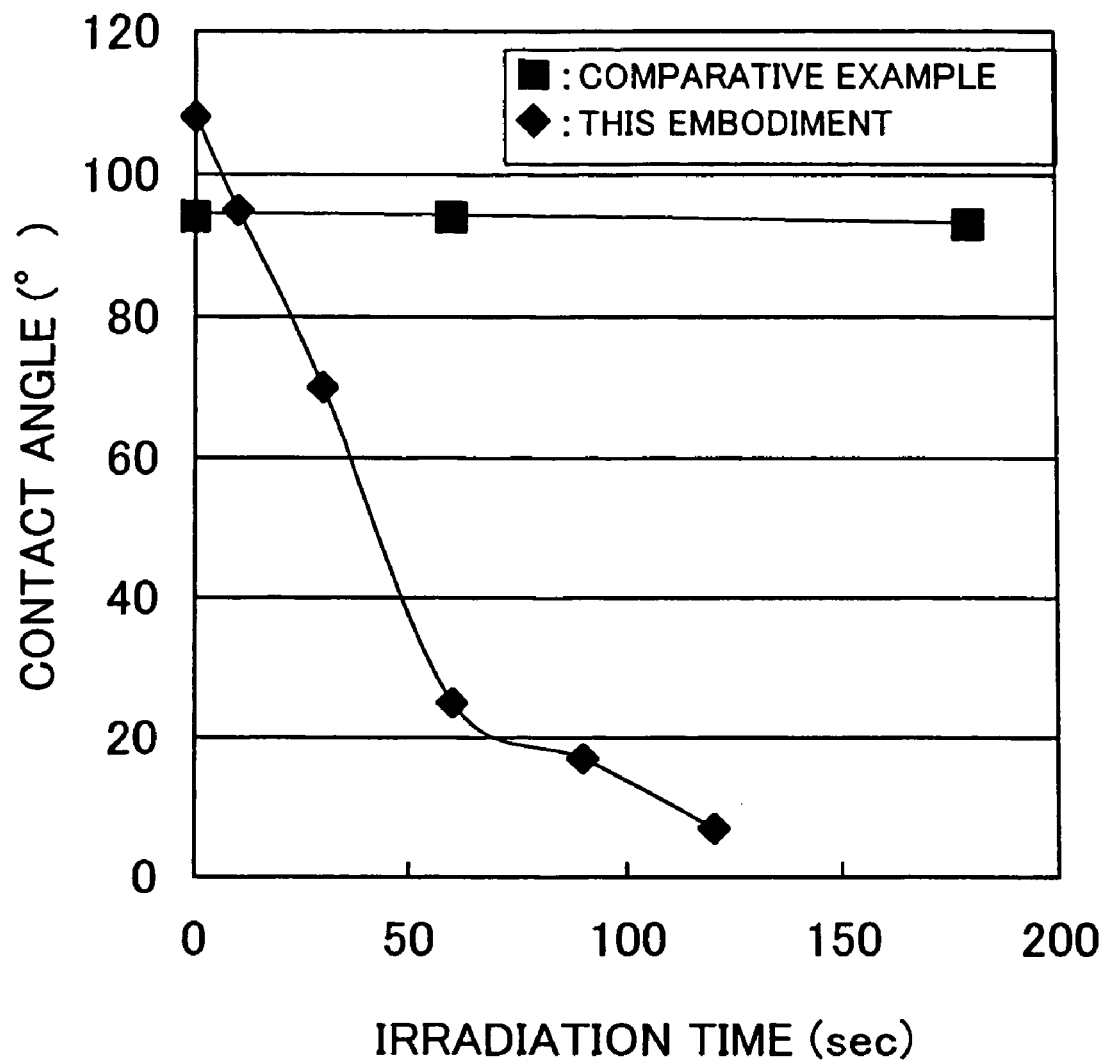
FIG. 31 is a graph showing relation between light irradiation time and contact angle of water with a surface of an irradiated substance.

In FIG. 31, the black squares correspond to the comparative example which does not use the present invention, and the black rhombuses correspond to the sample of this embodiment applying the present invention. The contact angle of water with the surface of the sample of the comparative example hardly changes from 94° before the irradiation and even after the light irradiation for 60 seconds, to 93° through the light irradiation for 180 seconds; thus, the contact angle value hardly changes. The energy of light with a wavelength of 200 nm or less is required to decompose the FAS that is a low wettability substance, however, the glass substrate absorbs the wavelength of 300 nm or less. Accordingly, FAS is irradiated with only light with a wavelength of 300 nm or more; therefore, FAS is not decomposed. As can be seen from the value of the contact angle, the wettability of the surface of the sample of the comparative example is not changed, and the surface is not modified.

The contact angle of water with a surface of the sample provided with a titanium oxide layer as a photocatalyst under FAS is reduced from 108° before the irradiation, to 95° through light irradiation for 10 seconds, 70° in 30 seconds, 25° in 60 seconds, and 7° in 90 seconds. FAS is normally decomposed only with light having a wavelength of 200 nm or less; however, it is understood that FAS is decomposed with light having a wavelength of around 300 nm to 400 nm due to the photocatalytic effect of titanium oxide according to the present invention. Thus, it is found that the wettability of the surface of the sample of this embodiment according to the present invention is improved by light irradiation, and the surface is modified.

Since the modification capacity of a photocatalyst is improved by applying the present invention, the range of options for light is increased. Accordingly, the wavelength that is hardly absorbed by a substance to be provided with an object can be applied, and light irradiation for controllable surface modification treatment can be carried out. Further, the efficiency of light irradiation can be improved, so that the treatment can be completed even though the light itself has low energy. As a result, the apparatuses and steps are simplified, thus, costs and time are reduced, and the production efficiency can be improved.

What is claimed is:

1. A method for forming a pattern, comprising the steps of:
    forming a mask over a light-transmitting substrate;
    forming a first region including a photocatalyst over the light-transmitting substrate and the mask;
    forming a material containing a fluorocarbon chain over the photocatalyst;
    irradiating the photocatalyst and the material containing the fluorocarbon chain with light through the light-transmitting substrate to modify a part of a surface of the material containing the fluorocarbon chain which is to be a second region; and
    discharging a conductive composition containing a pattern forming material to the second region to form a pattern, wherein the mask does not transmit the light.

2. A method according to claim 1, wherein titanium oxide is used as the photocatalyst to form the first region.

3. A method according to claim 1, wherein a surface of the material containing the fluorocarbon chain is modified so that the second region has higher wettability with the composition than the first region.

4. A method for manufacturing a thin film transistor, comprising the steps of:
    forming a first conductive layer over a light-transmitting substrate;
    forming an insulating layer over the light-transmitting substrate and the first conductive layer;
    forming a first region including a photocatalyst over the insulating layer;
    forming a material containing a fluorocarbon chain over the photocatalyst;

irradiating the photocatalyst and the material containing the fluorocarbon chain with light through the light-transmitting substrate to modify a part of a surface of the material containing the fluorocarbon chain which is to be a second region; and discharging a composition containing a conductive material to the second region to form a second conductive layer, wherein the first conductive layer does not transmit light.

5. A method according to claim 4, wherein titanium oxide is used as the photocatalyst to form the first region.

6. A method according to claim 4, wherein a surface of the material containing the fluorocarbon chain is modified so that the second region has higher wettability with the composition than the first region.

7. A method according to claim 4, wherein the first conductive layer is formed as a gate electrode layer and the second conductive layer is formed as a source electrode layer and a drain electrode layer.

8. A method for forming a pattern, comprising the steps of:
    forming a mask over a light-transmitting substrate;
    forming a first region including a photocatalyst over the light-transmitting substrate and the mask;
    forming a material containing a fluorocarbon chain over the photocatalyst;
    irradiating the photocatalyst and the material containing the fluorocarbon chain with light through the light-transmitting substrate to modify a part of a surface of the material containing the fluorocarbon chain which is to be a second region;
    discharging a conductive composition containing a pattern forming material to the second region to form a pattern; and
    removing a part of the first region including the photocatalyst and a part of the material containing the fluorocarbon chain,
    wherein the mask does not transmit the light.

9. A method according to claim 8, wherein titanium oxide is used as the photocatalyst to form the first region.

10. A method according to claim 8, wherein a surface of the material containing the fluorocarbon chain is modified so that the second region has higher wettability with the composition than the first region.

11. A method for manufacturing a thin film transistor, comprising the steps of:
    forming a first conductive layer over a light-transmitting substrate;
    forming an insulating layer over the light-transmitting substrate and the first conductive layer;
    forming a first region including a photocatalyst over the insulating layer;
    forming a material containing a fluorocarbon chain over the photocatalyst;
    irradiating the photocatalyst and the material containing the fluorocarbon chain with light through the light-transmitting substrate to modify a part of a surface of the material containing the fluorocarbon chain which is to be a second region;
    discharging a composition containing a conductive material to the second region to form a second conductive layer; and
    removing a part of the first region including the photocatalyst and a part of the material containing the fluorocarbon chain,
    wherein the first conductive layer does not transmit light.

12. A method according to claim 11, wherein titanium oxide is used as the photocatalyst to form the first region.

13. A method according to claim 11, wherein a surface of the material containing the fluorocarbon chain is modified so that the second region has higher wettability with the composition than the first region.

14. A method according to claim 11, wherein the first conductive layer is formed as a gate electrode layer and the second conductive layer is formed as a source electrode layer and a drain electrode layer.

* * * * *

UNITED STATES PATENT AND TRADEMARK OFFICE
CERTIFICATE OF CORRECTION

PATENT NO.       : 7,642,038 B2
APPLICATION NO.  : 11/085274
DATED            : January 5, 2010
INVENTOR(S)      : Gen Fujii It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1238 days.

Signed and Sealed this

Twenty-first Day of December, 2010

David J. Kappos
*Director of the United States Patent and Trademark Office*